United States Patent
Lu et al.

(10) Patent No.: US 8,598,448 B2
(45) Date of Patent: Dec. 3, 2013

(54) PYRROLO[3,2-B]PYRROLE SEMICONDUCTING COMPOUNDS AND DEVICES INCORPORATING SAME

(75) Inventors: Shaofeng Lu, Skokie, IL (US); Antonio Facchetti, Chicago, IL (US); Yan Yao, Skokie, IL (US); Martin Drees, Glenview, IL (US); He Yan, Skokie, IL (US)

(73) Assignee: Polyera Corporation, Skokie, IL (US)

( * ) Notice: Subject to any disclaimer, the term of this patent is extended or adjusted under 35 U.S.C. 154(b) by 187 days.

(21) Appl. No.: 13/052,055

(22) Filed: Mar. 19, 2011

(65) Prior Publication Data

US 2011/0226338 A1    Sep. 22, 2011

Related U.S. Application Data

(60) Provisional application No. 61/315,911, filed on Mar. 20, 2010.

(51) Int. Cl.
    *H01L 31/00*      (2006.01)

(52) U.S. Cl.
     USPC ...... 136/263; 526/256; 257/40; 257/E51.005; 257/E51.018

(58) Field of Classification Search
     USPC ............ 136/263; 526/256; 257/40, E51.005, 257/E51.018
See application file for complete search history.

(56) References Cited

U.S. PATENT DOCUMENTS

| | | | |
|---|---|---|---|
| 7,939,818 B2 | 5/2011 | Heim | |
| 2009/0065766 A1 | 3/2009 | Li | 257/40 |
| 2009/0302311 A1 | 12/2009 | Turbiez et al. | |
| 2010/0307594 A1 | 12/2010 | Zhu et al. | 136/263 |
| 2011/0004004 A1 | 1/2011 | Hao et al. | 548/453 |
| 2012/0059140 A1 | 3/2012 | Hayoz et al. | 528/8 |
| 2012/0186652 A1 | 7/2012 | Pan et al. | 136/263 |
| 2012/0187385 A1 | 7/2012 | Pan et al. | |

FOREIGN PATENT DOCUMENTS

| | | |
|---|---|---|
| DE | 3525109 | 1/1987 |
| EP | 0163609 | 5/1985 |
| WO | 2007/003520 | 1/2007 |
| WO | 2010/135723 | 11/2010 |
| WO | 2012/123060 | 9/2012 |

OTHER PUBLICATIONS

Helmholz et al., "Synthesis of Unsymmetrical Pyrrolo[3,2-b]pyrrole-2,5-diones and Bis(quinazolin-4-on-2-yls) by Double-Anion-Capture Reactions of Unsymmetrical Oxaldi(arylimidoyl) Dichlorides," *Synthesis*, 15:2507-2514 (2006).

Langer et al., "New and Efficient Synthesis of Pyrrolo[3,2-b]pyrrole-2,5-diones by Double-Anion-Capture Reactions of Ester Carbanions with Bis(imidoyl)chlorides of Oxalic Acid," *J. Org. Chem.*, 65:729-734 (2000).

Welterlich et al., "Deeply Colored Polymers Containing 1,3,4,6-Tetraarylpyrrolo[3,2-b]pyrrole-2,5-dione (isoDPP) Units in the Main Chain," *Macromolecules*, 45: 4511-4519 (2012).

Song et al., "Synthesis of the pyrrolo[3,2-b]pyrrole-based copolymer with enhanced open circuit voltage," *Synthetic Metals*, 162: 2288-2293 (2012).

Hou et al., "Bandgap and Molecular Energy Level Control of the Low-Bandgap Polymers Based on 3,6-Dithiophen-2-yl-2,5-dihydropyrrolo[3,4-c]pyrrole-1,4-dione toward Highly Efficient Polymer Solar Cells," *Macromolecules*, 42(17): 6564-6571 (2009).

Li et al., "A High Mobility P-Type DPP-Thieno[3,2-b]thiophene Copolymer for Organic Thin-Film Transistors," *Adv. Mater.*, 22:4862-4866 (2010).

Lu et al., "3,6-Dithiophen-2-yl-diketopyrrolo[3,2-*b*]pyrrole (isoDPPT) as an Acceptor Building Block for Organic Opto-Electronics," *Macromolecules*, 46: 3895-3906 (2013).

*Primary Examiner* — Shane Fang
(74) *Attorney, Agent, or Firm* — Karen K. Chan

(57) ABSTRACT

Disclosed are semiconducting compounds having one or more pyrrolo[3,2-b]pyrrole-2,5(1H,4H)-dione 3,6-diyl units. Such compounds can be monomeric, oligomeric, or polymeric, and can exhibit desirable electronic properties and possess processing advantages including solution-processability and/or good stability.

17 Claims, 6 Drawing Sheets

PYRROLO[3,2-B]PYRROLE SEMICONDUCTING COMPOUNDS AND DEVICES INCORPORATING SAME

CROSS REFERENCE TO RELATED APPLICATIONS

This application claims priority to and the benefit of U.S. Provisional Patent Application No. 61/315,911, filed on Mar. 20, 2010, the disclosure of which is incorporated by reference herein in its entirety.

BACKGROUND

A new generation of optoelectronic devices such as organic photovoltaic (OPV) devices, organic light emitting transistors (OLETs), organic light emitting diodes (OLEDs), organic thin film transistors (OTFTs), printable circuits, electrochemical capacitors, and sensors are built upon organic semiconductors as their active components. To enable high device efficiencies such as large charge carrier mobilities ($\mu$) needed for transistor/circuit operations, or efficient exciton formation/splitting that is necessary for OLED/OPV operations, it is desirable that both p-type and n-type organic semiconductor materials are available. Furthermore, these organic semiconductor-based devices should exhibit satisfactory stability in ambient conditions and should be processable in a cost-effective manner. For example, a benchmark polymer, regioregular poly(3-hexylthiophene) (rr-P3HT), can provide hole mobilities in the order of about 0.1 $cm^2/Vs$ and current modulation in the order of about $10^5$ or greater, which is close to amorphous silicon. For OPV devices based on rr-P3HT, power conversion efficiencies (PCEs) as high as about 4% have been reported. However, such impressive performances are achieved only under strict device processing conditions.

Accordingly, the art desires new organic semiconductor materials, particularly those that can have good charge transport characteristics, tunable energy level, processing properties, and stability in ambient conditions.

SUMMARY

In light of the foregoing, the present teachings provide organic semiconductor materials that are prepared from monomeric, oligomeric, and polymeric compounds having one or more pyrrolo[3,2-b]pyrrole-2,5(1H,4H)-dione-3,6-diyl moieties. Also provided are associated devices and related methods for the preparation and use of these compounds. The present compounds can exhibit properties such as excellent charge transport characteristics in ambient conditions, chemical stability, low-temperature processability, large solubility in common solvents, and processing versatility (e.g., via various solution processes). As a result, organic photovoltaic devices based on these materials can exhibit excellent properties, such as large PCEs, large open circuit voltage ($V_{oc}$), large short circuit current ($J_{sc}$), and chemical stability. Furthermore, field effect devices such as thin film transistors that incorporate one or more of the present compounds as the semiconductor layer can exhibit high performance in ambient conditions, for example, demonstrating one or more of large charge carrier mobilities, low threshold voltages, and high current on-off ratios. Similarly, other organic semiconductor-based devices such as OLETs, and OLEDs can be fabricated efficiently using the organic semiconductor materials described herein.

The present teachings also provide methods of preparing such compounds and semiconductor materials, as well as various compositions, composites, and devices that incorporate the compounds and semiconductor materials disclosed herein.

The foregoing as well as other features and advantages of the present teachings will be more fully understood from the following figures, description, examples, and claims.

BRIEF DESCRIPTION OF DRAWINGS

It should be understood that the drawings described below are for illustration purpose only. The drawings are not necessarily to scale, with emphasis generally being placed upon illustrating the principles of the present teachings. The drawings are not intended to limit the scope of the present teachings in any way.

DETAILED DESCRIPTION

Figure 1:
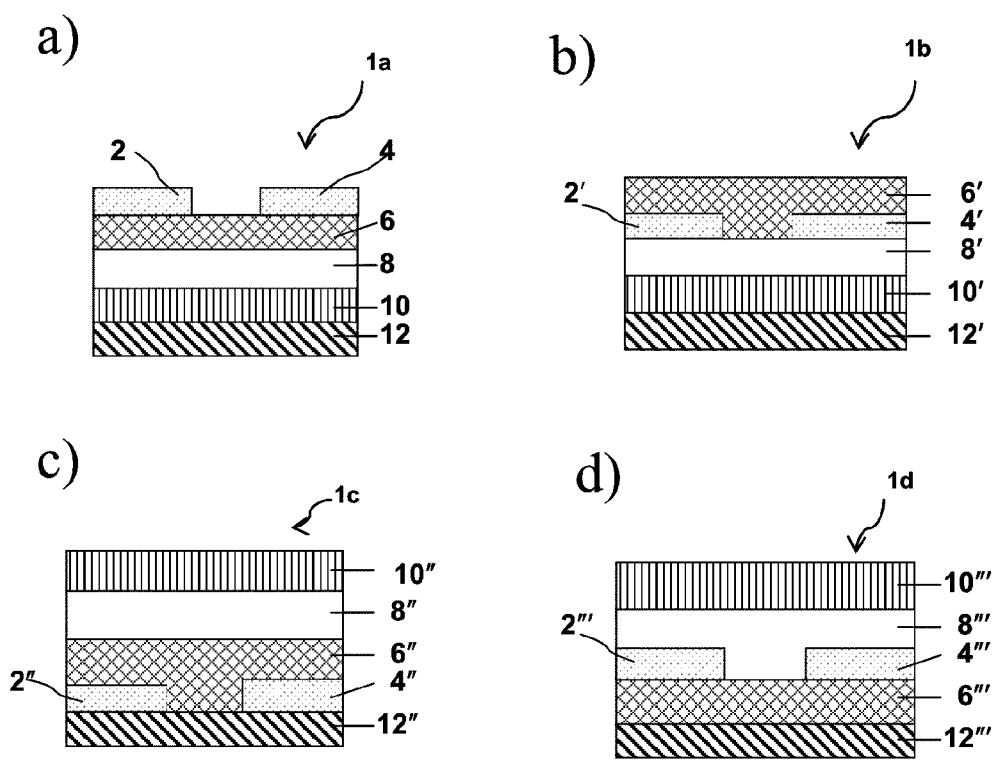
FIG. 1 illustrates four different configurations of thin film transistors: bottom-gate top contact (a), bottom-gate bottom-contact (b), top-gate bottom-contact (c), and top-gate top-contact (d); each of which can be used to incorporate compounds of the present teachings.

The present teachings provide organic semiconductor materials that are prepared from monomeric, oligomeric, and polymeric compounds having one or more pyrrolo[3,2-b]pyrrole-2,5(1H,4H)-dione-3,6-diyl moieties. Compounds of the present teachings can exhibit semiconductor behavior such as high carrier mobility and/or good current modulation characteristics in a field-effect device, light absorption/charge separation in a photovoltaic device, and/or charge transport/recombination/light emission in a light-emitting device. In addition, the present compounds can possess certain processing advantages such as solution-processability and/or good stability (for example, air stability) in ambient conditions. The compounds of the present teachings can be used to prepare either p-type or n-type semiconductor materials, which in turn can be used to fabricate various organic electronic articles, structures and devices, including field-effect transistors, unipolar circuitries, complementary circuitries, photovoltaic devices, and light emitting devices.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, an "oligomeric compound" (or "oligomer") or a "polymeric compound" (or "polymer") refers to a molecule including a plurality of one or more repeating units connected by covalent chemical bonds. As used herein, a repeating unit in an oligomeric or polymeric compound must repeat itself at least twice in the oligomeric or polymeric compound. An oligomeric or polymeric compound can be represented by the general formula:

wherein M is the repeating unit or monomer. The degree of polymerization can range from 2 to greater than 10,000. For example, for oligomeric compounds, the degree of polymerization can range from 2 to 9; and for polymeric compounds, the degree of polymerization can range from 10 to about 10,000. The oligomeric or polymeric compound can have only one type of repeating unit as well as two or more types of different repeating units. When a polymeric compound has only one type of repeating unit, it can be referred to as a homopolymer. When a polymeric compound has two or more types of different repeating units, the term "copolymer" or "copolymeric compound" can be used instead. The oligomeric or polymeric compound can be linear or branched. Branched polymers can include dendritic polymers, such as dendronized polymers, hyperbranched polymers, brush polymers (also called bottle-brushes), and the like. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer. For example, the general formula:

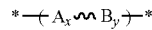

can be used to represent a copolymer of A and B having x mole fraction of A and y mole fraction of B in the copolymer, where the manner in which comonomers A and B is repeated can be alternating, random, regiorandom, regioregular, or in blocks.

As used herein, a "cyclic moiety" can include one or more (e.g., 1-6) carbocyclic or heterocyclic rings. The cyclic moiety can be a cycloalkyl group, a heterocycloalkyl group, an aryl group, or a heteroaryl group (i.e., can include only saturated bonds, or can include one or more unsaturated bonds regardless of aromaticity), each including, for example, 3-24 ring atoms and can be optionally substituted as described herein. In embodiments where the cyclic moiety is a "monocyclic moiety," the "monocyclic moiety" can include a 3-14 membered aromatic or non-aromatic, carbocyclic or heterocyclic ring. A monocyclic moiety can include, for example, a phenyl group or a 5- or 6-membered heteroaryl group, each of which can be optionally substituted as described herein. In embodiments where the cyclic moiety is a "polycyclic moiety," the "polycyclic moiety" can include two or more rings fused to each other (i.e., sharing a common bond) and/or connected to each other via a spiro atom, or one or more bridged atoms. A polycyclic moiety can include an 8-24 membered aromatic or non-aromatic, carbocyclic or heterocyclic ring, such as a $C_{8-24}$ aryl group or an 8-24 membered heteroaryl group, each of which can be optionally substituted as described herein.

As used herein, a "fused ring" or a "fused ring moiety" refers to a polycyclic ring system having at least two rings where at least one of the rings is aromatic and such aromatic ring (carbocyclic or heterocyclic) has a bond in common with at least one other ring that can be aromatic or non-aromatic, and carbocyclic or heterocyclic. These polycyclic ring systems can be highly π-conjugated and can include polycyclic aromatic hydrocarbons such as rylenes (or analogs thereof containing one or more heteroatoms) having the formula:

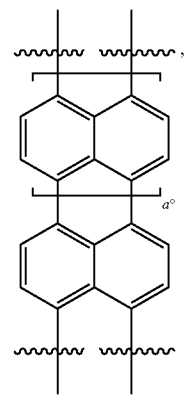

where $a°$ can be an integer in the range of 0-3; coronenes (or analogs thereof containing one or more heteroatoms) having the formula:

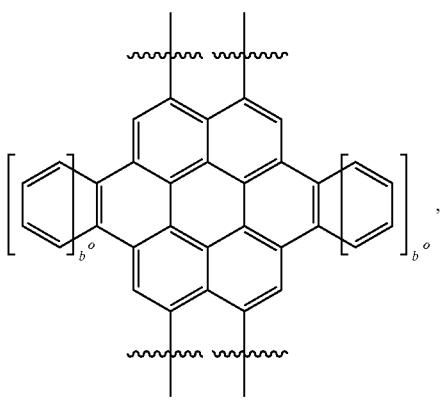

where $b^o$ can be an integer in the range of 0-3; and linear acenes (or analogs thereof containing one or more heteroatoms) having the formula:

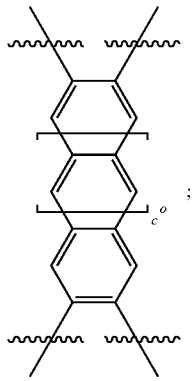

where $c^o$ can be an integer in the range of 0-4. The fused ring moiety can be optionally substituted as described herein.

As used herein, "halo" or "halogen" refers to fluoro, chloro, bromo, and iodo.

As used herein, "oxo" refers to a double-bonded oxygen (i.e., =O).

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neopentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group." Examples of lower alkyl groups include methyl, ethyl, propyl (e.g., n-propyl and iso-propyl), and butyl groups (e.g., n-butyl, iso-butyl, sec-butyl, tert-butyl). In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., $C_{1-40}$ haloalkyl group), for example, 1 to 20 carbon atoms (i.e., $C_{1-20}$ haloalkyl group). Examples of haloalkyl groups include $CF_3$, $C_2F_2$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula $—C_sH_{2s+1-t}X^0{}_t$, where $X^0$, at each occurrence, is F, Cl, Br or I, s is an integer in the range of 1 to 40, and t is an integer in the range of 1 to 81, provided that t is less than or equal to 2s+1. Haloalkyl groups that are not perhaloalkyl groups can be substituted as described herein.

As used herein, "alkoxy" refers to —O-alkyl group. Examples of alkoxy groups include, but are not limited to, methoxy, ethoxy, propoxy (e.g., n-propoxy and isopropoxy), t-butoxy, pentoxy, hexoxy groups, and the like. The alkyl group in the —O-alkyl group can be substituted as described herein.

As used herein, "alkylthio" refers to an —S-alkyl group (which, in some cases, can be expressed as $—S(O)_w$-alkyl, wherein w is 0). Examples of alkylthio groups include, but are not limited to, methylthio, ethylthio, propylthio (e.g., n-propylthio and isopropylthio), t-butylthio, pentylthio, hexylthio groups, and the like. The alkyl group in the —S-alkyl group can be substituted as described herein.

As used herein, "arylalkyl" refers to an -alkyl-aryl group, where the arylalkyl group is covalently linked to the defined chemical structure via the alkyl group. An arylalkyl group is within the definition of a $—Y—C_{6-14}$ aryl group, where Y is defined as a divalent alkyl group that can be optionally substituted as described herein. An example of an arylalkyl group is a benzyl group ($—CH_2—C_6H_5$). An arylalkyl group can be optionally substituted, i.e., the aryl group and/or the alkyl group, can be substituted as disclosed herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group). In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkynyl group), for example, 2 to 20 carbon atoms (i.e., $C_{2-20}$ alkynyl group). In some embodiments, alkynyl groups can be substituted as described herein. An alkynyl group is generally not substituted with another alkynyl group, an alkyl group, or an alkenyl group.

As used herein, "cycloalkyl" refers to a non-aromatic carbocyclic group including cyclized alkyl, alkenyl, and alkynyl groups. In various embodiments, a cycloalkyl group can have 3 to 24 carbon atoms, for example, 3 to 20 carbon atoms (e.g., $C_{3-14}$ cycloalkyl group). A cycloalkyl group can be monocyclic (e.g., cyclohexyl) or polycyclic (e.g., containing fused, bridged, and/or spiro ring systems), where the carbon atoms are located inside or outside of the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 24 ring atoms, for example, 3 to 20 ring atoms (e.g., 3-14 membered cycloheteroalkyl group). One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 24 carbon atoms in its ring system (e.g., $C_{6-20}$ aryl group), which can include multiple fused rings. In some embodiments, a polycyclic aryl group can have 8 to 24 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), pentacenyl (pentacyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., $-C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include those having two or more heteroaryl rings fused together, as well as those having at least one monocyclic heteroaryl ring fused to one or more aromatic carbocyclic rings, non-aromatic carbocyclic rings, and/or non-aromatic cycloheteroalkyl rings. A heteroaryl group, as a whole, can have, for example, 5 to 24 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

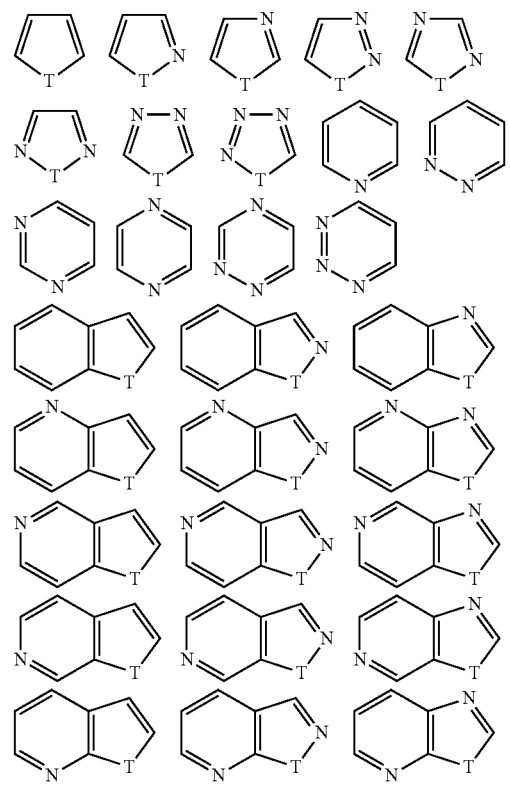

where T is O, S, NH, N-alkyl, N-aryl, N-(arylalkyl) (e.g., N-benzyl), $SiH_2$, SiH(alkyl), Si(alkyl)$_2$, SiH(arylalkyl), Si(arylalkyl)$_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuryl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

Compounds of the present teachings can include a "divalent group" defined herein as a linking group capable of forming a covalent bond with two other moieties. For example, compounds of the present teachings can include a divalent $C_{1-20}$ alkyl group (e.g., a methylene group), a divalent $C_{2-20}$ alkenyl group (e.g., a vinylyl group), a divalent $C_{2-20}$ alkynyl group (e.g., an ethynylyl group). a divalent $C_{6-14}$ aryl group (e.g., a phenylyl group); a divalent 3-14 membered cycloheteroalkyl group (e.g., a pyrrolidylyl), and/or a divalent 5-14 membered heteroaryl group (e.g., a thienylyl group). Generally, a chemical group (e.g., —Ar—) is understood to be divalent by the inclusion of the two bonds before and after the group.

The electron-donating or electron-withdrawing properties of several hundred of the most common substituents, reflecting all common classes of substituents have been determined, quantified, and published. The most common quantification of electron-donating and electron-withdrawing properties is in terms of Hammett σ values. Hydrogen has a Hammett σ value of zero, while other substituents have Hammett σ values that increase positively or negatively in direct relation to their electron-withdrawing or electron-donating characteristics. Substituents with negative Hammett σ values are considered electron-donating, while those with positive Hammett σ values are considered electron-withdrawing. See Lange's Handbook of Chemistry, 12th ed., McGraw Hill, 1979, Table 3-12, pp. 3-134 to 3-138, which lists Hammett σ values for a large number of commonly encountered substituents and is incorporated by reference herein.

It should be understood that the term "electron-accepting group" can be used synonymously herein with "electron acceptor" and "electron-withdrawing group". In particular, an "electron-withdrawing group" ("EWG") or an "electron-accepting group" or an "electron-acceptor" refers to a functional group that draws electrons to itself more than a hydrogen atom would if it occupied the same position in a molecule. Examples of electron-withdrawing groups include, but are not limited to, halogen or halo (e.g., F, Cl, Br, I), —$NO_2$, —CN, —NC, —$S(R^O)_2^+$, —$N(R^O)_3^+$, —$SO_3H$, —$SO_2R^O$, —$SO_3R^O$, —$SO_2NHR^O$, —$SO_2N(R^O)_2$, —COOH, —$COR^O$, —$COOR^O$, —$CONHR^O$, —$CON(R^O)_2$, $C_{1-40}$ haloalkyl groups, $C_{6-14}$ aryl groups, and 5-14 membered electron-poor heteroaryl groups; where $R^O$ is a $C_{1-20}$ alkyl group, a $C_{2-20}$ alkenyl group, a $C_{2-20}$ alkynyl group, a $C_{1-20}$ haloalkyl group, a $C_{1-20}$ alkoxy group, a $C_{6-14}$ aryl group, a $C_{3-14}$ cycloalkyl group, a 3-14 membered cycloheteroalkyl group, and a 5-14 membered heteroaryl group, each of which can be optionally substituted as described herein. For example, each of the $C_{1-20}$ alkyl group, the $C_{2-20}$ alkenyl group, the $C_{2-20}$ alkynyl group, the $C_{1-20}$ haloalkyl group, the $C_{1-20}$ alkoxy group, the $C_{6-14}$ aryl group, the $C_{3-14}$ cycloalkyl group, the 3-14 membered cycloheteroalkyl group, and the 5-14 membered heteroaryl group can be optionally substituted with 1-5 small electron-withdrawing groups such as F, Cl, Br, —$NO_2$, —CN, —NC, —$S(R^O)_2^+$, —$N(R^O)_3^+$, —$SO_3H$, —$SO_2R^O$, —$SO_3R^O$, —$SO_2NHR^O$, —$SO_2N(R^O)_2$, —COOH, —$COR^O$, —$COOR^O$, —$CONHR^O$, and —$CON(R^O)_2$.

It should be understood that the term "electron-donating group" can be used synonymously herein with "electron donor". In particular, an "electron-donating group" or an "electron-donor" refers to a functional group that donates electrons to a neighboring atom more than a hydrogen atom would if it occupied the same position in a molecule. Examples of electron-donating groups include —OH, —$OR^O$, —$NH_2$, —$NHR^O$, —$N(R^O)_2$, and 5-14 membered electron-rich heteroaryl groups, where $R^O$ is a $C_{1-20}$ alkyl group, a $C_{2-20}$ alkenyl group, a $C_{2-20}$ alkynyl group, a $C_{6-14}$ aryl group, or a $C_{3-14}$ cycloalkyl group.

Various unsubstituted heteroaryl groups can be described as electron-rich (or π-excessive) or electron-poor (or π-deficient). Such classification is based on the average electron density on each ring atom as compared to that of a carbon atom in benzene. Examples of electron-rich systems include 5-membered heteroaryl groups having one heteroatom such as furan, pyrrole, and thiophene; and their benzofused counterparts such as benzofuran, benzopyrrole, and benzothiophene. Examples of electron-poor systems include 6-membered heteroaryl groups having one or more heteroatoms such as pyridine, pyrazine, pyridazine, and pyrimidine; as well as their benzofused counterparts such as quinoline, isoquinoline, quinoxaline, cinnoline, phthalazine, naphthyridine, quinazoline, phenanthridine, acridine, and purine. Mixed heteroaromatic rings can belong to either class depending on the type, number, and position of the one or more heteroatom(s) in the ring. See Katritzky, A. R and Lagowski, J. M., *Heterocyclic Chemistry* (John Wiley & Sons, New York, 1960).

At various places in the present specification, substituents are disclosed in groups or in ranges. It is specifically intended that the description include each and every individual subcombination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

Compounds described herein can contain an asymmetric atom (also referred as a chiral center) and some of the compounds can contain two or more asymmetric atoms or centers, which can thus give rise to optical isomers (enantiomers) and diastereomers (geometric isomers). The present teachings include such optical isomers and diastereomers, including their respective resolved enantiomerically or diastereomerically pure isomers (e.g., (+) or (−) stereoisomer) and their racemic mixtures, as well as other mixtures of the enantiomers and diastereomers. In some embodiments, optical isomers can be obtained in enantiomerically enriched or pure form by standard procedures known to those skilled in the art, which include, for example, chiral separation, diastereomeric salt formation, kinetic resolution, and asymmetric synthesis. The present teachings also encompass cis- and trans-isomers of compounds containing alkenyl moieties (e.g., alkenes, azo, and imines). It also should be understood that the compounds of the present teachings encompass all possible regioisomers in pure form and mixtures thereof. In some embodiments, the preparation of the present compounds can include separating such isomers using standard separation procedures known to those skilled in the art, for example, by using one or more of column chromatography, thin-layer chromatography, simulated moving-bed chromatography, and high-performance liquid chromatography. However, mixtures of regioisomers can be used similarly to the uses of each individual regioisomer of the present teachings as described herein and/or known by a skilled artisan.

It is specifically contemplated that the depiction of one regioisomer includes any other regioisomers and any regioisomeric mixtures unless specifically stated otherwise.

As used herein, a "leaving group" ("LG") refers to a charged or uncharged atom (or group of atoms) that can be displaced as a stable species as a result of, for example, a substitution or elimination reaction. Examples of leaving groups include, but are not limited to, halogen (e.g., Cl, Br, I), azide ($N_3$), thiocyanate (SCN), nitro ($NO_2$), cyanate (CN), water ($H_2O$), ammonia ($NH_3$), and sulfonate groups (e.g., $OSO_2$—R, wherein R can be a $C_{1-10}$ alkyl group or a $C_{6-14}$ aryl group each optionally substituted with 1-4 groups independently selected from a $C_{1-10}$ alkyl group and an electron-withdrawing group) such as tosylate (toluenesulfonate, OTs), mesylate (methanesulfonate, OMs), brosylate (p-bromobenzenesulfonate, OBs), nosylate (4-nitrobenzenesulfonate, ONs), and triflate (trifluoromethanesulfonate, OTf).

As used herein, a "p-type semiconductor material" or a "p-type semiconductor" refers to a semiconductor material having holes as the majority current or charge carriers. In some embodiments, when a p-type semiconductor material is deposited on a substrate, it can provide a hole mobility in excess of about $10^{-5}$ $cm^2/Vs$. In the case of field-effect devices, a p-type semiconductor can also exhibit a current on/off ratio of greater than about 10.

As used herein, an "n-type semiconductor material" or an "n-type semiconductor" refers to a semiconductor material having electrons as the majority current or charge carriers. In some embodiments, when an n-type semiconductor material is deposited on a substrate, it can provide an electron mobility in excess of about $10^{-5}$ $cm^2/Vs$. In the case of field-effect devices, an n-type semiconductor can also exhibit a current on/off ratio of greater than about 10.

As used herein, "mobility" refers to a measure of the velocity with which charge carriers, for example, holes (or units of positive charge) in the case of a p-type semiconductor material and electrons in the case of an n-type semiconductor material, move through the material under the influence of an electric field. This parameter, which depends on the device architecture, can be measured using a field-effect device or space-charge limited current measurements.

As used herein, fill factor (FF) is the ratio (given as a percentage) of the actual maximum obtainable power, ($P_m$ or $V_{mp}*J_{mp}$), to the theoretical (not actually obtainable) power, ($J_{sc} \times V_{oc}$). Accordingly, FF can be determined using the equation:

$$FF=(V_{mp}*J_{mp})/(J_{sc}*V_{oc})$$

where $J_{mp}$ and $V_{mp}$ represent the current density and voltage at the maximum power point ($P_m$), respectively, this point being obtained by varying the resistance in the circuit until J*V is at its greatest value; and $J_{sc}$ and $V_{oc}$ represent the short circuit current and the open circuit voltage, respectively. Fill factor is a key parameter in evaluating the performance of solar cells. Commercial solar cells typically have a fill factor of about 0.60% or greater.

As used herein, the open-circuit voltage ($V_{oc}$) is the difference in the electrical potentials between the anode and the cathode of a device when there is no external load connected.

As used herein, the power conversion efficiency (PCE) of a solar cell is the percentage of power converted from absorbed light to electrical energy. The PCE of a solar cell can be calculated by dividing the maximum power point ($P_m$) by the input light irradiance (E, in $W/m^2$) under standard test conditions (STC) and the surface area of the solar cell ($A_c$ in $m^2$). STC typically refers to a temperature of 25° C. and an irradiance of 1000 $W/m^2$ with an air mass 1.5 (AM 1.5) spectrum.

As used herein, a component (such as a thin film layer) can be considered "photoactive" if it contains one or more compounds that can absorb photons to produce excitons for the generation of a photocurrent.

Throughout the specification, structures may or may not be presented with chemical names. Where any question arises as to nomenclature, the structure prevails.

In one aspect, the present teachings relate to monomeric, oligomeric, and polymeric semiconducting compounds, as well as the use of these compounds in electronic, optoelectronic, or optical devices. More specifically, these compounds can include one or more optionally substituted pyrrolo[3,2-b]pyrrole-2,5(1H,4H)-dione-3,6-diyl moieties that can be identical or different, and independently can have the formula:

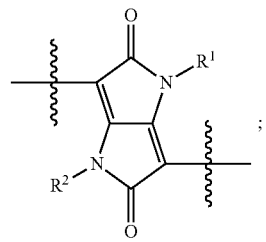

where $R^1$ and $R^2$ independently can be H or a substitution group which can impart improved desirable properties to the compound as a whole. For example, certain substitution groups including one or more electron-withdrawing or electron-donating moieties can modulate the electronic properties of the compound, while substitution groups that include one or more aliphatic chains can improve the solubility of the compound in organic solvents.

Accordingly, in certain embodiments, $R^1$ and $R^2$ independently can be a linear or branched $C_{3-40}$ alkyl group, examples of which include an n-hexyl group, an n-octyl group, an n-dodecyl group, a 1-methylpropyl group, a 1-methylbutyl group, a 1-methylpentyl group, a 1-methylhexyl group, a 1-ethylpropyl group, a 1-ethylbutyl group, a 1,3-dimethylbutyl group, a 2-ethylhexyl group, a 2-hexyloctyl group, a 2-octyldodecyl group, and a 2-decyltetradecyl group. In certain embodiments, $R^1$ and $R^2$ independently can be a linear or branched $C_{3-40}$ alkenyl group (such as the linear or branched $C_{3-40}$ alkyl groups specified above but with one or more saturated bonds replaced by unsaturated bonds). In particular embodiments, $R^1$ and $R^2$ independently can be a branched $C_{3-20}$ alkyl group or a branched $C_{3-20}$ alkenyl group. In certain embodiments, $R^1$ and $R^2$ independently can be a linear or branched $C_{3-40}$ haloalkyl group (such as the linear or branched $C_{3-40}$ alkyl groups specified above but with one or more hydrogen atoms replaced by a halide such as F or Cl).

In certain embodiments, $R^1$ and $R^2$ independently can be a linear or branched $C_{6-40}$ alkyl, alkenyl, or haloalkyl group, an arylalkyl group (e.g., a benzyl group) substituted with a linear or branched $C_{6-40}$ alkyl, alkenyl, or haloalkyl group, an aryl group (e.g., a phenyl group) substituted with a linear or branched $C_{6-40}$ alkyl, alkenyl, or haloalkyl group, or a biaryl group (e.g., a biphenyl group) substituted with a linear or branched $C_{6-40}$ alkyl, alkenyl, or haloalkyl group, wherein each of the aryl groups optionally can be substituted with 1-5 halo groups (e.g., F). In some embodiments, $R^1$ and $R^2$ can be a biaryl group wherein the two aryl groups are covalently linked via a linker. For example, the linker can be a divalent $C_{1-40}$ alkyl group wherein one or more non-adjacent $CH_2$ groups can be optionally replaced by —O—, —S—, or —Se—, provided that O, S, and/or Se atoms are not linked directly to one another. The linker can include other heteroatoms and/or functional groups as described herein.

In certain embodiments, $R^1$ and $R^2$ independently can be selected from —$(CH_2CH_2O)_tR^e$, —$(CF_2CF_2O)_tR^e$, —$(CH_2CF_2O)_tR^e$, and —$(CF_2CH_2O)_tR^e$; where $R^e$ can be selected from H, a $C_{1-40}$ alkyl group, and a $C_{1-40}$ haloalkyl group; and t can be 1, 2, 3, 4, 5, 6, 7, 8, 9 or 10.

In certain embodiments, $R^1$ and $R^2$ independently can be a $C_{6-14}$ aryl group or a 5-14 membered heteroaryl group, each of which optionally can be substituted with 1-2 groups independently selected from a halogen, CN, oxo, =$C(CN)_2$, a $C_{1-40}$ alkyl group, a $C_{1-40}$ haloalkyl group, a $C_{1-40}$ alkoxy group, and a $C_{1-40}$ alkylthio group. For example, $R^1$ and $R^2$ independently can be a thienyl group or an 8-14 membered thienyl-fused heteroaryl group, each of which can be optionally substituted as described herein.

More generally, $R^1$ and $R^2$ independently can be selected from H, a $C_{1-40}$ alkyl group, a $C_{2-40}$ alkenyl group, a $C_{2-40}$ alkynyl group, a $C_{1-40}$ haloalkyl group, and 1-4 cyclic moieties, wherein:

each of the $C_{1-40}$ alkyl group, the $C_{2-40}$ alkenyl group, the $C_{2-40}$ alkynyl group, and the $C_{1-40}$ haloalkyl group optionally can be substituted with 1-10 substituents independently selected from a halogen, —CN, $NO_2$, OH, —$NH_2$, —$NH(C_{1-20}$ alkyl), —$N(C_{1-20}$ alkyl$)_2$, —$S(O)_2OH$, —CHO, —C(O)—$C_{1-20}$ alkyl, —C(O)OH, —C(O)—$OC_{1-20}$ alkyl, —$C(O)NH_2$, —C(O)NH—$C_{1-20}$ alkyl, —$C(O)N(C_{1-20}$ alkyl$)_2$, —$OC_{1-20}$ alkyl, —$(OCR'_2CR''_2)_t$—, —$SiH_3$, —$SiH(C_{1-20}$ alkyl$)_2$, —$SiH_2(C_{1-20}$ alkyl), and —$Si(C_{1-20}$ alkyl$)_3$, where R' and R'', at each occurrence, independently are H or F, and t is an integer in the range of 1 to 20;

each of the $C_{1-40}$ alkyl group, the $C_{2-40}$ alkenyl group, the $C_{2-40}$ alkynyl group, and the $C_{1-40}$ haloalkyl group can be covalently bonded to the imide nitrogen atom via an optional linker; and each of the 1-4 cyclic moieties can be the same or different, can be covalently bonded to each other or the imide nitrogen via an optional linker, and optionally can be substituted with 1-5 substituents independently selected from a halogen, —CN, oxo, $NO_2$, OH, =$C(CN)_2$, —$NH_2$, —$NH(C_{1-20}$ alkyl), —$N(C_{1-20}$ alkyl$)_2$, —$S(O)_2OH$, —CHO, —C(O)OH, —C(O)—$C_{1-20}$ alkyl, —C(O)—$OC_{1-20}$ alkyl, —$C(O)NH_2$, —C(O)NH—$C_{1-20}$ alkyl, —$C(O)N(C_{1-20}$ alkyl$)_2$, —$SiH_3$, —$SiH(C_{1-20}$ alkyl$)_2$, —$SiH_2(C_{1-20}$ alkyl), —$Si(C_{1-20}$ alkyl$)_3$, —O—$C_{1-20}$ alkyl, —$(OCR'_2CR''_2)_t$—, a $C_{1-20}$ alkyl group, a $C_{2-20}$ alkenyl group, a $C_{2-20}$ alkynyl group, and a $C_{1-20}$ haloalkyl group; wherein each of the $C_{1-20}$ alkyl group, the $C_{2-20}$ alkenyl group, the $C_{2-20}$ alkynyl group, and the $C_{1-20}$ haloalkyl group optionally can be substituted with 1-5 substituents independently selected from a halogen, —CN, $NO_2$, OH, —$NH_2$, —$NH(C_{1-6}$ alkyl), —$N(C_{1-6}$ alkyl$)_2$, —$S(O)_2OH$, —CHO, —C(O)—$C_{1-6}$ alkyl, —C(O)OH, —C(O)—$OC_{1-6}$ alkyl, —$C(O)NH_2$, —C(O)NH—$C_{1-6}$ alkyl, —$C(O)N(C_{1-6}$ alkyl$)_2$, —$OC_{1-6}$ alkyl, —$SiH_3$, —$SiH(C_{1-6}$ alkyl$)_2$, —$SiH_2(C_{1-6}$ alkyl), and —$Si(C_{1-6}$ alkyl$)_3$, where R', R'', and t are as defined herein.

To further illustrate, in certain embodiments, $R^1$ and $R^2$ independently can be selected from H or -L-$R^a$, where $R^a$ is selected from a $C_{1-40}$ alkyl group, a $C_{2-40}$ alkenyl group, a $C_{2-40}$ alkynyl group, and a $C_{1-40}$ haloalkyl group, each of which can be optionally substituted with 1-10 substituents independently selected from a halogen, —CN, $NO_2$, OH, —$NH_2$, —$NH(C_{1-20}$ alkyl), —$N(C_{1-20}$ alkyl$)_2$, —$S(O)_2OH$, —CHO, —C(O)—$C_{1-20}$ alkyl, —C(O)OH, —C(O)—$OC_{1-20}$ alkyl, —$C(O)NH_2$, —C(O)NH—$C_{1-20}$ alkyl, —$C(O)N(C_{1-20}$ alkyl$)_2$, —$OC_{1-20}$ alkyl, —$(OCR'_2CR''_2)_t$—, —$SiH_3$, —$SiH(C_{1-20}$ alkyl$)_2$, —$SiH_2(C_{1-20}$ alkyl), and —$Si(C_{1-20}$ alkyl$)_3$, where R', R'', and t are as defined herein; and L is a covalent bond or a linker comprising one or more heteroatoms. For example, L can be a linker selected from —Y—$[O—Y]_t$— (e.g, —Y—$(OCR'_2CR''_2)_t$—), —$[Y—O]_t$—Y— (e.g, —$(CR'_2CR''_2O)_t$—Y—), —Y—$[S(O)_w]$-Y—, —Y—C(O)—Y—, —Y—$[NR^cC(O)]$—Y—, —Y—$[C(O)NR^c]$—, —Y—$NR^c$—Y—, —Y—$[SiR^c_2]$-Y—, where Y, at each occurrence, independently is selected from a divalent $C_{1-20}$ alkyl group, a divalent $C_{2-20}$ alkenyl group, a divalent $C_{2-20}$ haloalkyl group, and a covalent bond; $R^c$ is selected from H, a $C_{1-6}$ alkyl group, a $C_{6-14}$ aryl group, and a —$C_{1-6}$ alkyl-$C_{6-14}$ aryl group; w is 0, 1, or 2, and R', R'', and t are as defined herein. In some embodiments, $R^1$ and $R^2$ independently can be selected from H, a $C_{3-40}$ alkyl group, a $C_{4-40}$ alkenyl group, a $C_{4-40}$ alkynyl group, and a $C_{3-40}$ haloalkyl group, where each of these groups can be linear or branched, and can be optionally substituted as described herein.

In other embodiments, $R^1$ and $R^2$ independently can include one or more cyclic moieties. For example, $R^1$ and $R^2$ independently can be selected from -L'-$Cy^1$, -L'-$Cy^1$-L'-$Cy^2$, -L'-$Cy^1$-L'-$Cy^2$-$Cy^2$, -L'-$Cy^1$-$Cy^1$, -L'-$Cy^1$-$Cy^1$-L'-$Cy^2$, -L'-$Cy^1$-$Cy^1$-L'-$Cy^2$-$Cy^2$, -L'-$Cy^1$-L-$R^a$, -L'-$Cy^1$-L'-$Cy^2$-L-$R^a$, -L'-$Cy^1$-L'-$Cy^2$-$Cy^2$-L-$R^a$, -L'-$Cy^1$-$Cy^1$-L-$R^a$, and -L'-$Cy^1$-$Cy^1$-L'-$Cy^2$-L-$R^a$; wherein:

$Cy^1$ and $Cy^2$, at each occurrence, independently are selected from a $C_{6-14}$ aryl group, a 5-14 membered heteroaryl group, a $C_{3-14}$ cycloalkyl group, and a 3-14 membered cycloheteroalkyl group, each of which can be optionally substituted with 1-5 substituents independently selected from a halogen, —CN, oxo, =$C(CN)_2$, a $C_{1-6}$ alkyl group, a $C_{1-6}$ alkoxy group, and a $C_{1-6}$ haloalkyl group;

L', at each occurrence, independently is a covalent bond or a linker selected from —Y—$[O—Y]_t$— (e.g, —Y—$(OCR'_2CR''_2)_t$—), —$[Y—O]_t$—Y— (e.g, —$(CR'_2CR''_2O)_t$—Y—), —Y—$[S(O)_w]$-Y—, —Y—C(O)—Y—, —Y—$[NR^cC(O)]$-Y—, —Y—$[C(O)NR^c]$—, —Y—$NR^c$—Y—, —Y—$[SiR^c_2]$-Y—, a divalent $C_{1-20}$ alkyl group, a divalent $C_{2-20}$ alkenyl group, and a divalent $C_{2-20}$ haloalkyl group, where Y, R', R'', $R^c$, t and w are as defined above;

$R^a$ is selected from a $C_{1-40}$ alkyl group, a $C_{2-40}$ alkenyl group, a $C_{2-40}$ alkynyl group, and a $C_{1-40}$ haloalkyl group, each of which can be optionally substituted with 1-10 substituents independently selected from a halogen, —CN, $NO_2$, OH, —$NH_2$, —$NH(C_{1-20}$ alkyl), —$N(C_{1-20}$ alkyl$)_2$, —$S(O)_2OH$, —CHO, —C(O)—$C_{1-20}$ alkyl, —C(O)OH, —C(O)—$OC_{1-20}$ alkyl, —$C(O)NH_2$, —C(O)NH—$C_{1-20}$ alkyl, —$C(O)N(C_{1-20}$ alkyl$)_2$, —$OC_{1-20}$ alkyl, —$(OCR'_2CR''_2)_t$—, —$SiH_3$, —$SiH(C_{1-20}$ alkyl$)_2$, —$SiH_2(C_{1-20}$ alkyl), and —$Si(C_{1-20}$ alkyl$)_3$, where R', R'', and t are as defined herein.

Further examples of $R^1$ and $R^2$ include:
1) linear or branched $C_{1-40}$ alkyl groups and $C_{2-40}$ alkenyl groups such as:
n-hexyl', n-dodecyl',
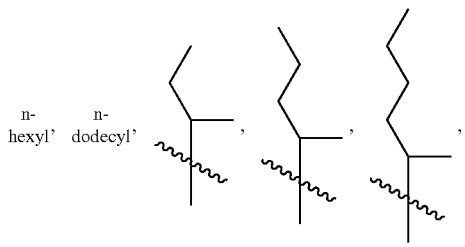
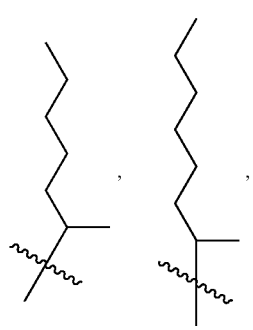
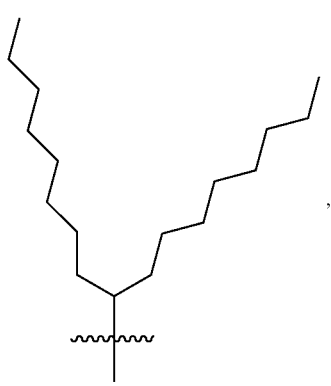
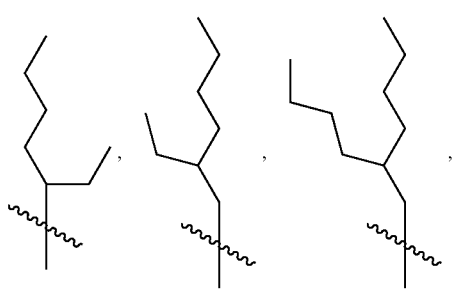
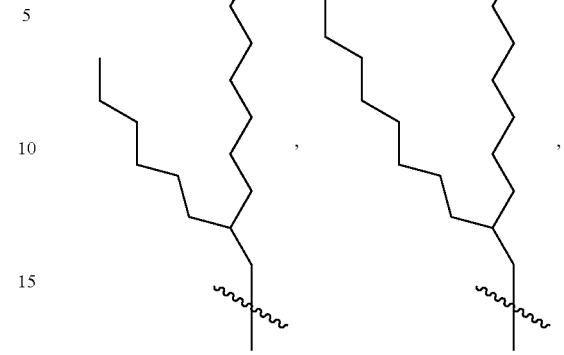
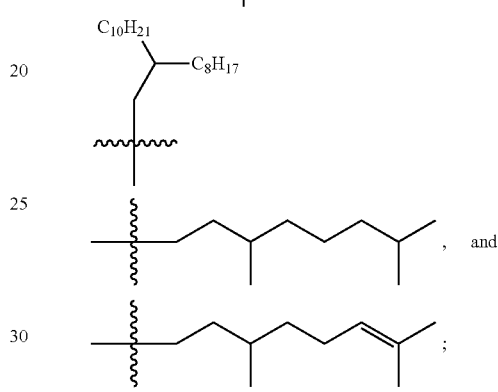
, and
;
2) optionally substituted cycloalkyl groups such as:
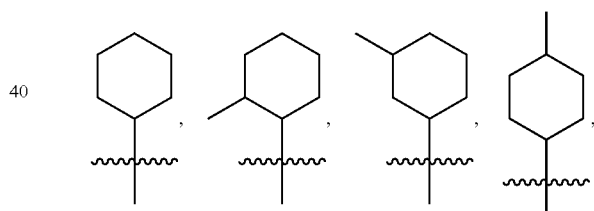
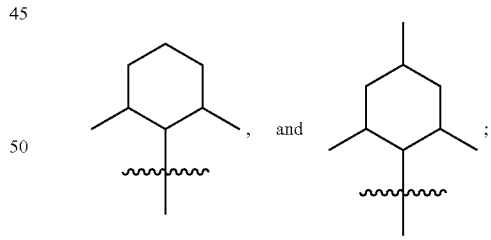
, and ;
3) optionally substituted aryl groups, arylalkyl groups, biaryl groups, biarylalkyl groups such as:
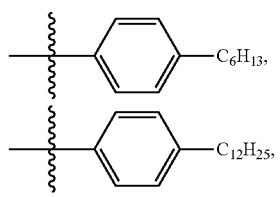

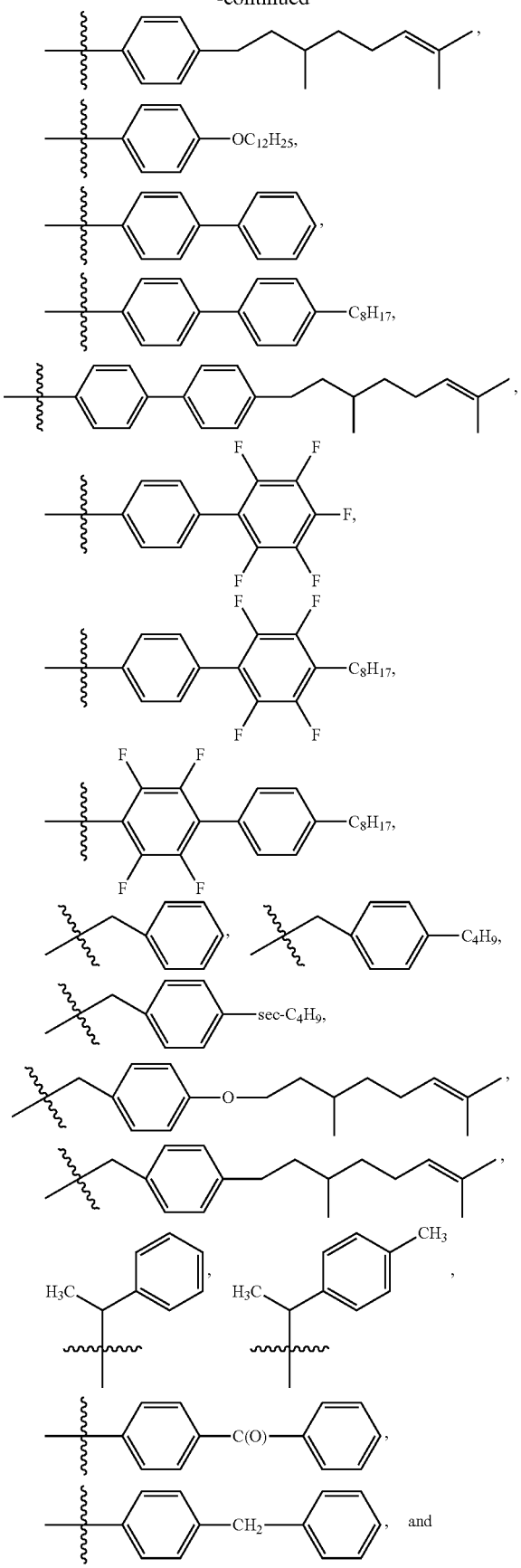

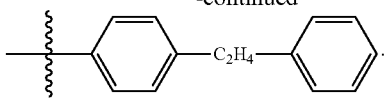

In various embodiments, $R^1$ and $R^2$ can be the same.

In some embodiments, the present compounds are monomeric compounds. For example, the monomeric compounds can have the formula:

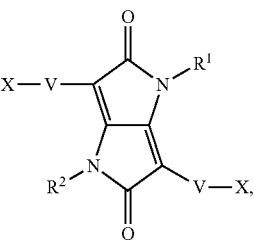

wherein:

V can be a covalent bond or a conjugated linker U as defined herein; and

X, at each occurrence, independently can be selected from H, a $C_{1-40}$ alkyl group, a $C_{2-40}$ alkenyl group, a $C_{2-40}$ alkynyl group, a $C_{1-40}$ haloalkyl group, and a reactive group or a polymerizable group as defined herein.

Typically, the conjugated linker U, at each occurrence, independently can include at least one conjugated cyclic moiety. For example, each U can include up to 10 conjugated cyclic moieties. To illustrate, U can be selected from:

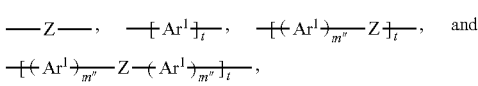

where $Ar^1$, at each occurrence, independently, can be a $C_{6-14}$ aryl group or a 5-14 membered heteroaryl group, each of which optionally can be substituted with 1-2 groups independently selected from a halogen, CN, oxo, $=C(CN)_2$, a $C_{1-40}$ alkyl group, a $C_{1-40}$ haloalkyl group, a $C_{1-40}$ alkoxy group, and a $C_{1-40}$ alkylthio group;

Z can be a linear conjugated linker;

m", at each occurrence, can be 1, 2, 3, or 4; and t is an integer in the range of 1 to 20.

In certain embodiments, $Ar^1$, at each occurrence, independently can be selected from an optionally substituted monocyclic (5- or 6-membered) (hetero)aryl group and an optionally substituted polycyclic (8 to 14-membered) (hetero)aryl group. For example, each $Ar^1$ can be selected from a phenyl group, a thienyl group, a furyl group, a pyrrolyl group, an isothiazolyl group, a thiazolyl group, a 1,2,4-thiadiazolyl group, a 1,3,4-thiadiazolyl group, a 1,2,5-thiadiazolyl group, and a 8 to 14-membered benzo-fused or thienyl-fused (hetero)aryl group, each of which optionally can be substituted with 1-2 groups independently selected from a halogen, CN, oxo, $=C(CN)_2$, a $C_{1-40}$ alkyl group, a $C_{1-40}$ haloalkyl group, a $C_{1-40}$ alkoxy group, and a $C_{1-40}$ alkylthio group. Examples of 8 to 14-membered benzo-fused or thienyl-fused (hetero)aryl group include a naphthyl group, an anthracenyl group, a thienothiophenyl group (e.g., a thieno[3,2-b]thiophen-2-yl group), a benzothienyl group, a benzothiazolyl group, a benzisothiazolyl group, a benzothiadiazolyl group, and a benzodithiophene-2,6-yl group.

By way of example, each $Ar^1$ independently can be selected from:

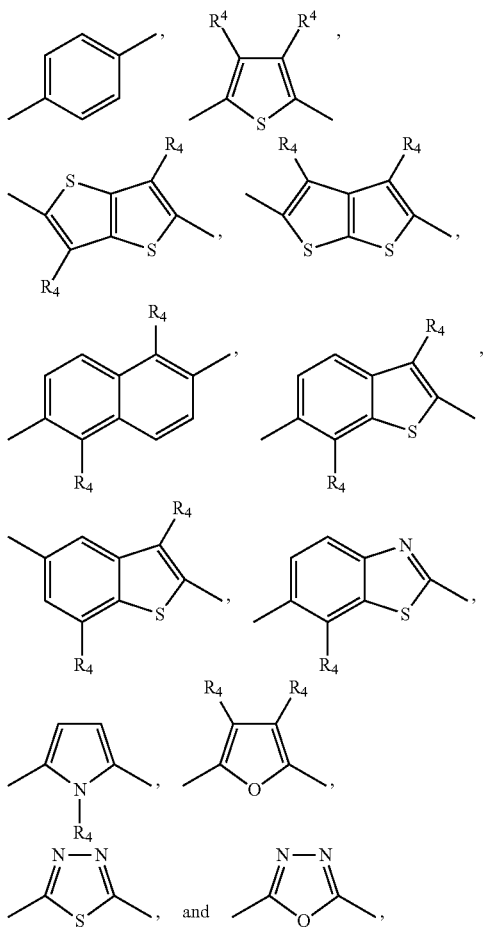

where $R^4$, at each occurrence, independently is H or $R^3$, and $R^3$ is selected from a halogen, CN, oxo, $=C(CN)_2$, a $C_{1-40}$ alkyl group, a $C_{1-40}$ haloalkyl group, a $C_{1-40}$ alkoxy group, and a $C_{1-40}$ alkylthio group.

To further illustrate,

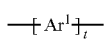

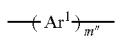

or each

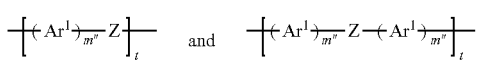

can include two or more $Ar^1$ groups that can be the same or different. In embodiments where U include two or more different $Ar^1$ groups, the $Ar^1$ groups can include different conjugated cyclic moieties and/or differently substituted conjugated cyclic moieties (for example, including substituted or unsubstituted moieties, and/or moieties having different substitution groups).

The linear conjugated linker Z can be a divalent ethenyl group (i.e., having one double bond), a divalent ethynyl group (i.e., having one tripe bond), a $C_{4-40}$ alkenyl or alkynyl group that includes two or more conjugated double or triple bonds, or some other non-cyclic conjugated systems that can include heteroatoms such as Si, N, P, and the like. For example, Z can be selected from:

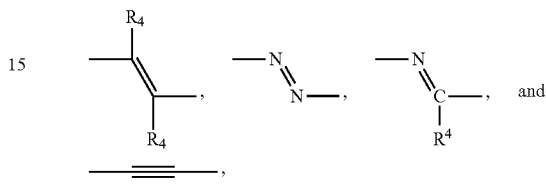

wherein $R^4$ is as defined herein. In certain embodiments, Z can be selected from:

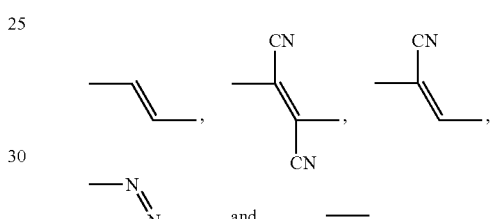

Accordingly, monomeric compounds according to the present teachings can have the formula:

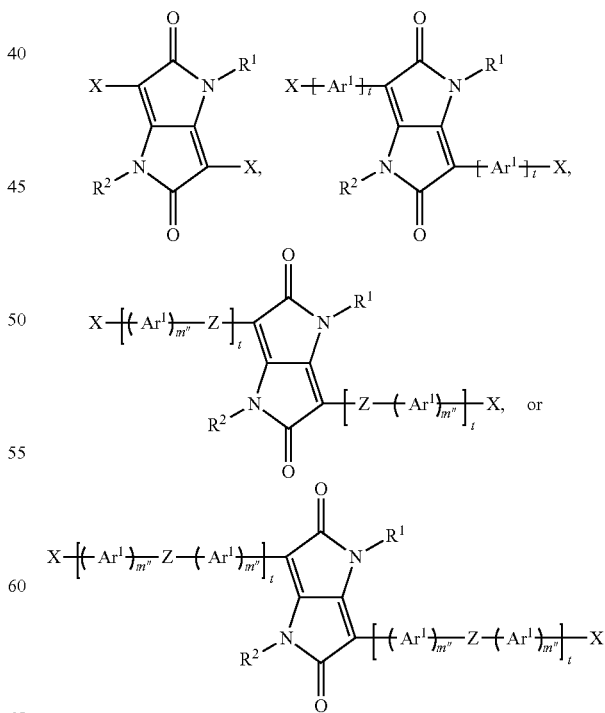

wherein $Ar^1$, $R^1$, $R^2$, X, Z, m'', and t are as defined herein.

For example, certain monomeric compounds according to the present teachings can have the formula:

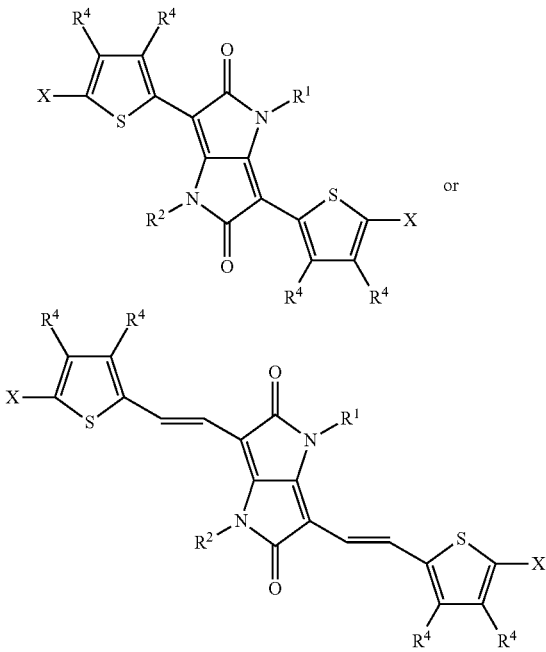

wherein $R^1$, $R^2$, $R^4$, and X are as defined herein.

The present monomeric compounds also can include one or more isomeric pyrrolo[3,4-c]pyrrole-1,4(2H,5H)-dione-3,6-diyl moieties. For example, using $M^a$ to represent an optionally substituted pyrrolo[3,2-b]pyrrole-2,5(1H,4H)-dione-3,6-diyl moiety and $M^b$ to represent an optionally substituted pyrrolo[3,4-c]pyrrole-1,4(2H,5H)-dione-3,6-diyl moiety, certain monomeric compounds according to the present teachings can be represented by the formula:

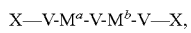

X—V-$M^a$-V-$M^b$-V—X, where V and X are as defined herein.

In various embodiments of the present monomeric compounds, X can be a polymerizable group that allows either self-polymerization of the present monomeric compounds into homopolymers or their co-polymerization with additional unit(s) into co-oligomers or co-polymers as described in more detailed hereinbelow. Such self-polymerization and co-polymerization can be effected via various polymerization schemes including metal-catalyzed coupling reactions known by those skilled in the art, such as Stille coupling, Suzuki coupling, Negishi coupling, Kumada coupling, and Yamamoto coupling. For example, X can be selected from a halogen (e.g., Cl, Br, I), a sulfonate group, an organotin moiety, and a boronic ester moiety.

Accordingly, in some embodiments, the present compounds can be oligomeric or polymeric compounds that include two or more optionally substituted pyrrolo[3,2-b]pyrrole-2,5(1H,4H)-dione-3,6-diyl moieties, where the pyrrolo[3,2-b]pyrrole moieties can form part of the backbone of the compounds or can be grafted to the backbone as pendant groups.

For example, in certain embodiments, the present oligomeric or polymeric compounds can include two or more (e.g., three or more, four or more, five or more, eight or more, or ten or more) optionally substituted pyrrolo[3,2-b]pyrrole-2,5 (1H,4H)-dione-3,6-diyl moieties as part of the backbone of the compounds. These oligomeric or polymeric compounds can have one or more repeating units of the formula:

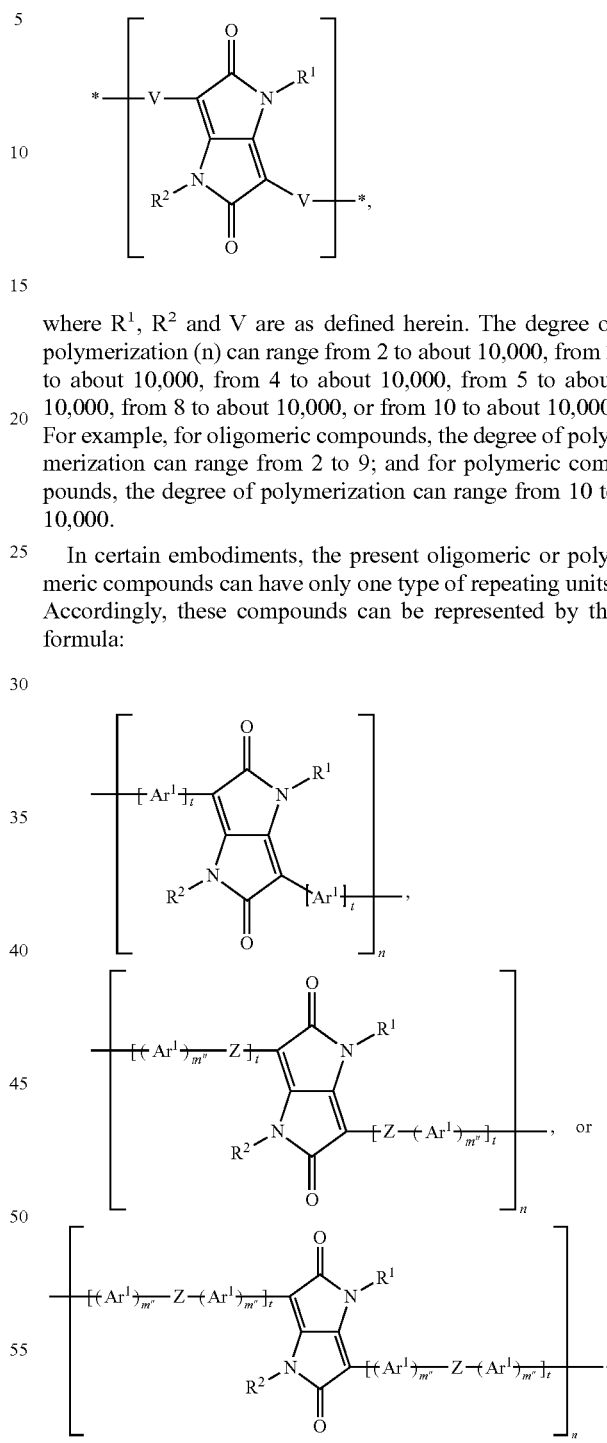

where $R^1$, $R^2$ and V are as defined herein. The degree of polymerization (n) can range from 2 to about 10,000, from 3 to about 10,000, from 4 to about 10,000, from 5 to about 10,000, from 8 to about 10,000, or from 10 to about 10,000. For example, for oligomeric compounds, the degree of polymerization can range from 2 to 9; and for polymeric compounds, the degree of polymerization can range from 10 to 10,000.

In certain embodiments, the present oligomeric or polymeric compounds can have only one type of repeating units. Accordingly, these compounds can be represented by the formula:

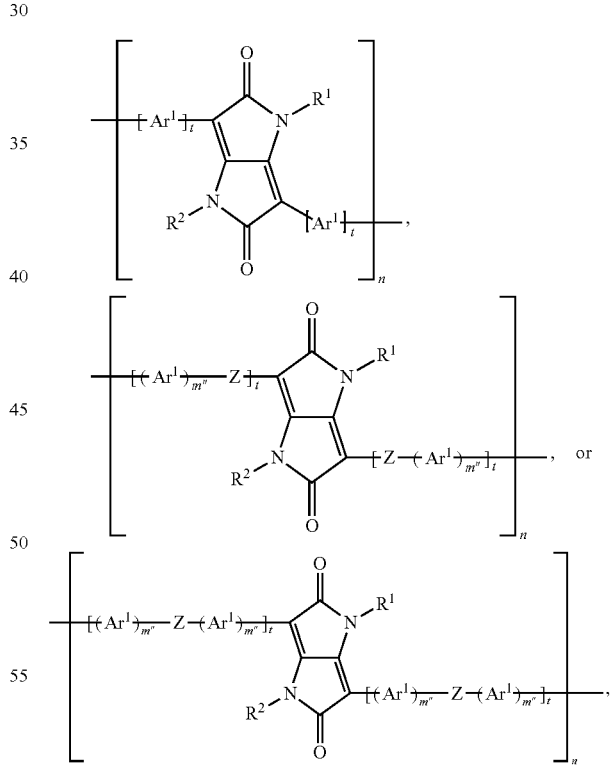

where n can be an integer in the range of 2 to 10,000, for example, in the range of 3 to 10,000, 4 to 10,000, 5 to 10,000, 6 to 10,000, 7 to 10,000, 8 to 10,000, 9 to 10,000, or 10 to 10,000; and $Ar^1$, $R^1$, $R^2$, Z, m" and t are as defined herein. By way of example, each $Ar^1$ independently can be selected from:

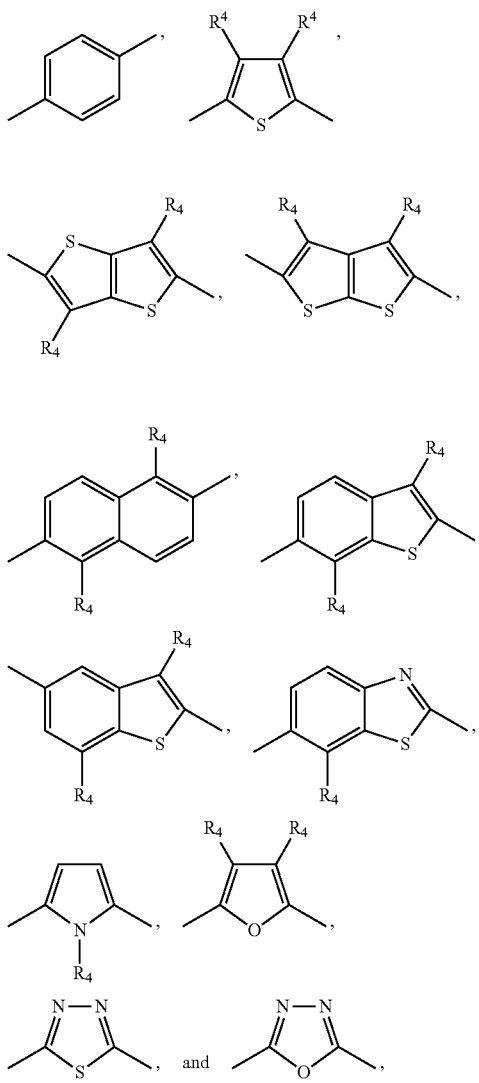

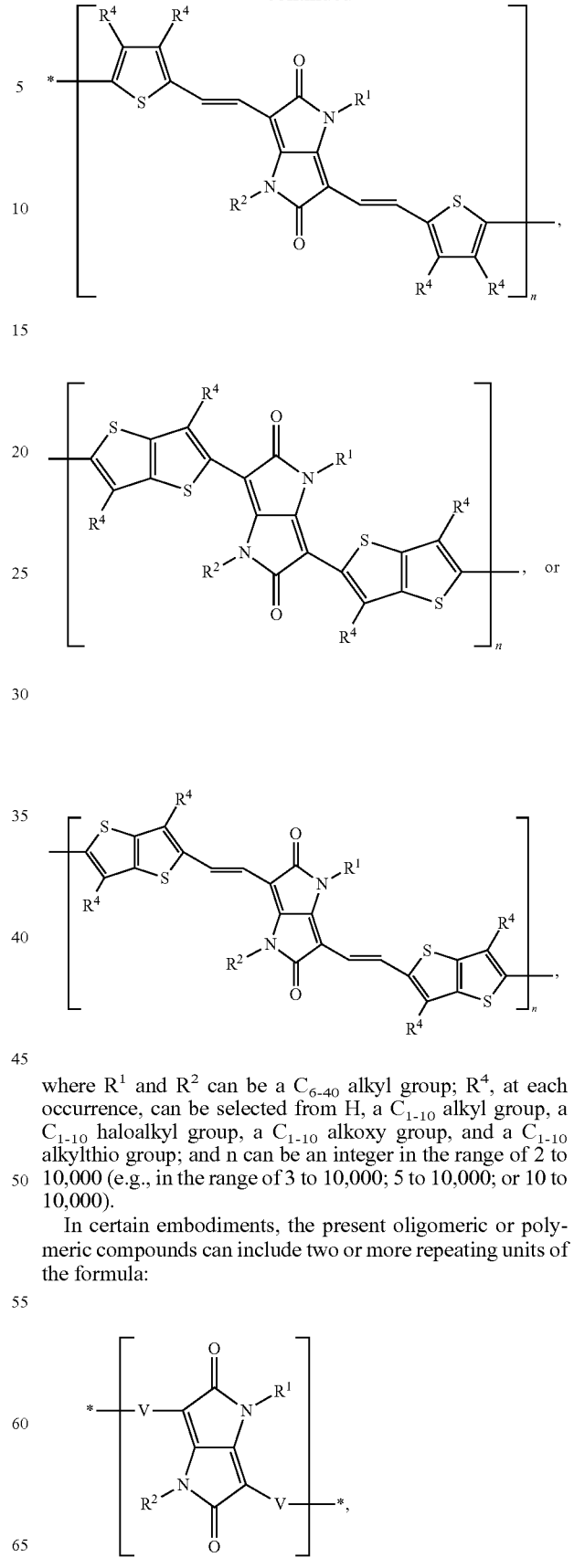

where $R^4$, at each occurrence, independently is H or $R^3$, and $R^3$ is selected from a halogen, CN, oxo, =$C(CN)_2$, a $C_{1-40}$ alkyl group, a $C_{1-40}$ haloalkyl group, a $C_{1-40}$ alkoxy group, and a $C_{1-40}$ alkylthio group; $R^1$ and $R^2$ can be a $C_{6-40}$ alkyl group; Z can be an ethenyl group, m″ and t independently can be 1, 2, 3, or 4.

In particular embodiments, the present oligomeric or polymeric compounds can be represented by the formula:

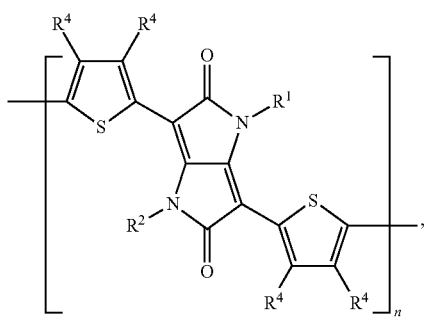

where $R^1$ and $R^2$ can be a $C_{6-40}$ alkyl group; $R^4$, at each occurrence, can be selected from H, a $C_{1-10}$ alkyl group, a $C_{1-10}$ haloalkyl group, a $C_{1-10}$ alkoxy group, and a $C_{1-10}$ alkylthio group; and n can be an integer in the range of 2 to 10,000 (e.g., in the range of 3 to 10,000; 5 to 10,000; or 10 to 10,000).

In certain embodiments, the present oligomeric or polymeric compounds can include two or more repeating units of the formula:

where the repeating units have different $R^1$ and $R^2$ groups and/or V groups, and $R^1$, $R^2$, and V are as defined herein. For example, the present oligomeric or polymeric compounds can have the formula:

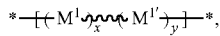

where $0 \leq x \leq 1$, $y=1-x$, and $M^1$ and $M^{1'}$, respectively, can have the formulae:

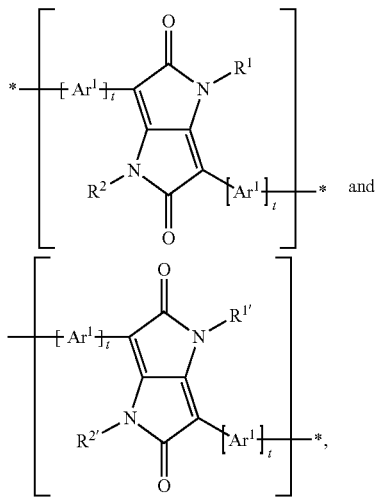

where $R^1$ and $R^2$ are a linear $C_{6-20}$ alkyl group and $R^{1'}$ and $R^{2'}$ are a branched linear $C_{6-20}$ alkyl group, and $Ar^1$ and t are as defined herein;

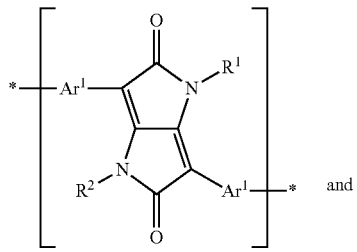

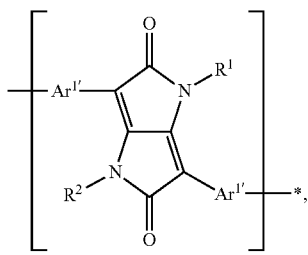

where each $Ar^1$ is an unsubstituted thienyl group and $Ar^{1'}$ is an alkyl-substituted thienyl group, and $R^1$ and $R^2$ are as defined herein; or

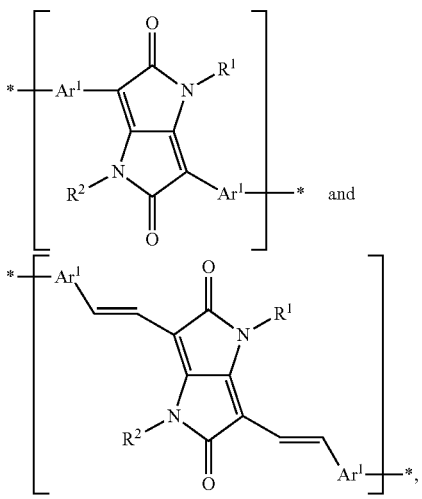

where $R^1$, $R^2$, and $Ar^1$ are as defined herein. The two repeating units can provide a random polymer, a regioregular polymer, a regiorandom polymer, or an alternating polymer.

In some embodiments, the present oligomeric or polymeric compounds can include one or more repeating units each of which does not include an optionally substituted pyrrolo[3,2-b]pyrrole-2,5(1H,4H)-dione-3,6-diyl moieties. In embodiments where the present compounds are cooligomers or copolymers of a pyrrolo[3,2-b]pyrrole-2,5(1H,4H)-dione-3,6-diyl-containing repeating unit and at least one other repeating unit, the pyrrolo[3,2-b]pyrrole-2,5(1H,4H)-dione-3,6-diyl units and the other units can be repeated in a regular (e.g., alternating) or random manner. If either unit includes substituted moieties, the copolymers can be regioregular or regiorandom in terms of the orientation of the various units relative to each other. Accordingly, the present polymeric compounds can be more generally represented by the formula:

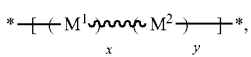

where $M^1$ is as defined above; x represents the mole fraction of $M^1$ in the polymeric compound; $M^2$, in this case, represents one or more additional units that are different from $M^1$; and y represents the mole fraction of each $M^2$ in the polymeric compound; wherein $0<x\leq1$, $0\leq y<1$, and the sum of x and y is about 1.

For example, using $M^1$ to represent

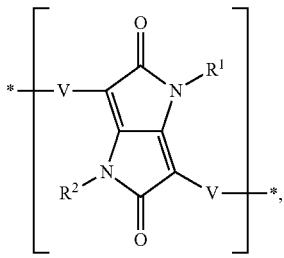

where $R^1$, $R^2$ and V are as defined herein, certain embodiments of the present oligomeric polymeric compounds can be represented by the formula:

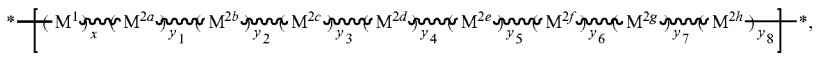

wherein:

$M^{2a}$, $M^{2b}$, $M^{2c}$, $M^{2d}$, $M^{2e}$, $m^{2f}$, $M^{2g}$, and $M^{2h}$ are different from each other, each of which does not include an optionally substituted pyrrolo[3,2-b]pyrrole-2,5(1H,4H)-dione-3,6-diyl moieties;

$y_1$, $y_2$, $y_3$, $y_4$, $y_5$, $y_6$, $y_7$, and $y_8$ independently are a real number representing the mole fraction of $M^{2a}$, $M^{2b}$, $M^{2c}$, $M^{2d}$, $M^{2e}$, $M^{2f}$, $M^{2g}$, and $M^{2h}$, respectively, wherein $0 \le y_1$, $y_2$, $y_3$, $y_4$, $y_5$, $y_6$, $y_7$, $y_8 < 1$, and $y_1+y_2+y_3+y_4+y_5+y_6+y_7+y_8=y$; and $0<x<1$, $y=1-x$.

To illustrate, oligomeric or polymeric compounds including two different repeating units can be represented by the formula:

where $0<x<1$, $y=1-x$, $M^1$ represents a repeating unit of the formula:

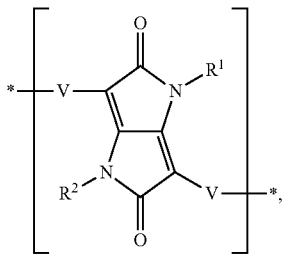

where $R^1$, $R^2$ and V are as defined herein, and M represents a repeating unit that does not include an optionally substituted pyrrolo[3,2-b]pyrrole-2,5(1H,4H)-dione-3,6-diyl moiety.

In certain embodiments, the present oligomeric or polymeric compounds can include a repeating unit $M^1$ having the formula:

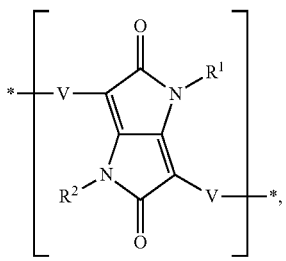

and a repeating unit $M^2$ having the formula:

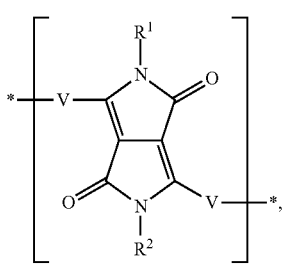

where $R^1$, $R^2$ and V are as defined herein. For example, $R^1$ and $R^2$ in $M^1$ and $M^2$ can be the same or different, and V in $M^1$ and $M^2$ can be the same or different. As examples, $R^1$ and $R^2$ in $M^1$ and $M^2$ independently can be selected from a linear $C_{6-20}$ alkyl group, a branched $C_{6-20}$ alkyl group, a linear $C_{6-20}$ haloalkyl group, and a branched $C_{6-20}$ alkyl group; and V in $M^1$ and $M^2$ independently can be selected from a covalent bond,

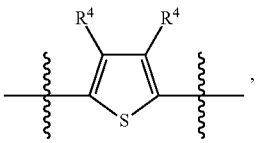

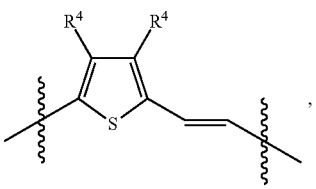

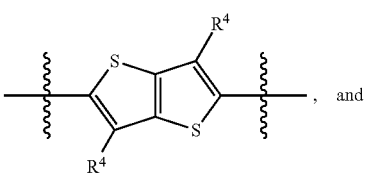, and

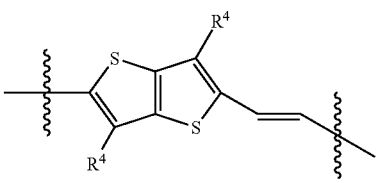

where $R^4$, at each occurrence, can be selected from H, a $C_{1-10}$ alkyl group, a $C_{1-10}$ haloalkyl group, a $C_{1-10}$ alkoxy group, and a $C_{1-10}$ alkylthio group.

In embodiments where the present compounds are cooligomers or copolymers, such compounds can include a first repeating unit ($M^1$) represented by the formula:

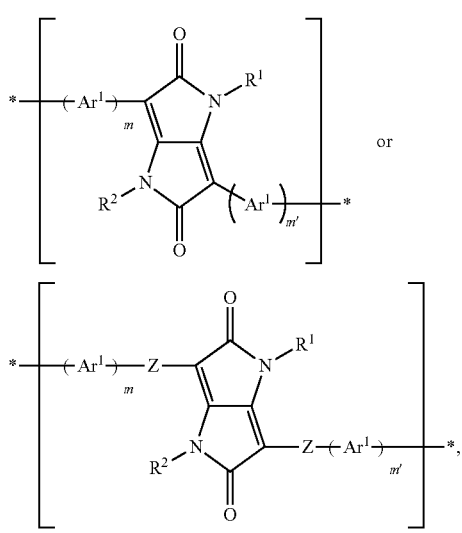

where m and m' independently are 0, 1, 2, 3, or 4; and $Ar^1$, Z, $R^1$ and $R^2$ are as defined herein.

To further illustrate, certain compounds of the present teachings can be represented by the formula:

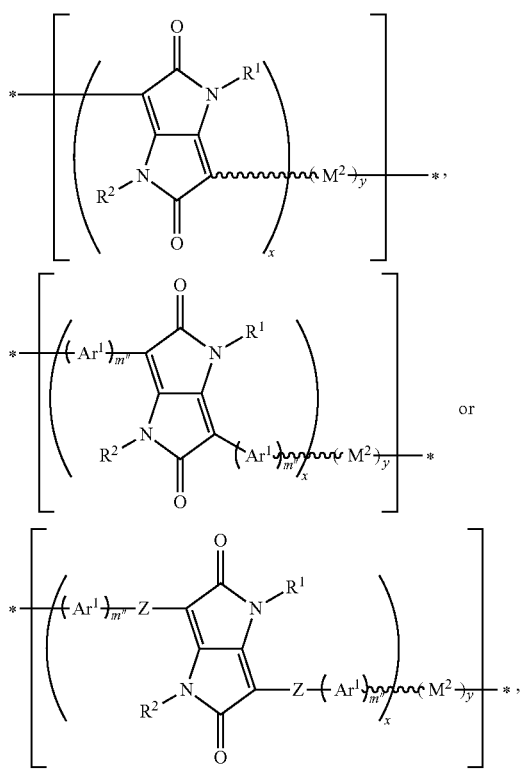

where $M^2$ is a repeating unit that does not include an optionally substituted pyrrolo[3,2-b]pyrrole-2,5(1H,4H)-dione-3,6-diyl unit, and $Ar^1$, $R^1$, $R^2$, Z, m", x and y are as defined herein. In certain embodiments, the present compounds can be random polymers. In other embodiments, the present compounds can be an alternating copolymer represented by the formula:

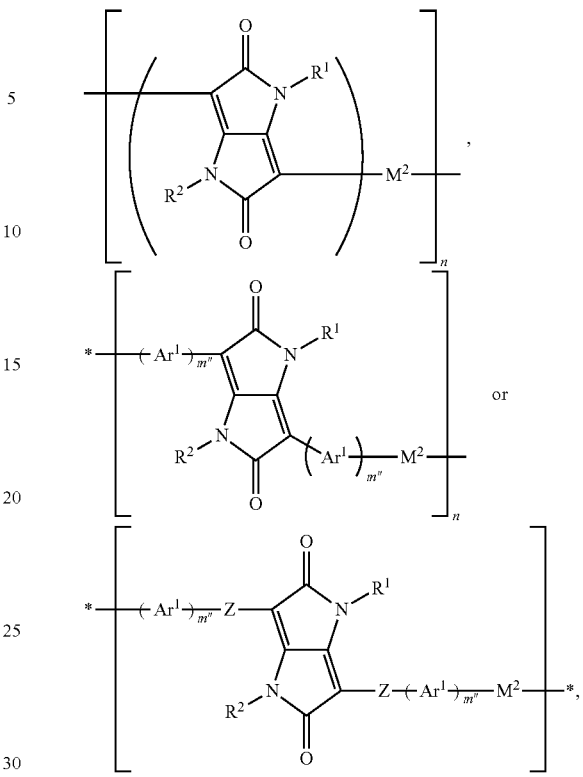

wherein n is an integer in the range of 2 to 10,000 (e.g., in the range of 3 to 10,000; 5 to 10,000; or 10 to 10,000); and $Ar^1$, $M^2$, $R^1$, $R^2$, and m" are as defined herein. For example, $Ar^1$ can be selected from an optionally substituted thienyl group, an optionally substituted phenyl group, and an optionally substituted thienothiophenyl group; $R^1$ and $R^2$ can be selected from a linear $C_{6-20}$ alkyl group, a branched $C_{6-20}$ alkyl group, a linear $C_{6-20}$ haloalkyl group, and a branched $C_{6-20}$ alkyl group; Z can be an ethenyl group; and m" can be 1.

In addition to repeating units including the isomeric moiety, i.e., pyrrolo[3,4-c]pyrrole-1,4(2H,5H)-dione-3,6-diyl moiety, described above, $M^2$ more generally can represent a repeating unit that includes at least one conjugated cyclic moiety, at least one conjugated linear linker (which includes one or more unsaturated bonds), or in some embodiments, at least one conjugated cyclic moiety and at least one conjugated linear linker. The conjugated cyclic moiety can be carbocyclic or heterocyclic, further optionally substituted or functionalized with one or more electron-withdrawing or electron-donating groups. The pairing of the pyrrolo[3,2-b]pyrrole-2,5 (1H,4H)-dione-3,6-diyl unit and such one or more co-monomers, the imide position functionalization of the pyrrolo[3,2-b]pyrrole-2,5(1H,4H)-dione-3,6-diyl unit, and any functionalization on the co-monomer(s) will be determined by the application of the polymeric compounds. For example, for electronic, optical, and optoelectronic devices, the composition of the polymeric compounds can be affected by one or more of the following considerations: 1) the electron-withdrawing capability for semiconductor processing in air and stable charge transport operation; 2) modulation of the majority carrier type depending on the electronic structure of the monomers; 3) regiochemistry of the polymerization possibly affording regioregular polymers; 4) the core planarity and linearity of the polymer chain; 5) the capability of additional functionalization of the π-conjugated core; 6) the potential for increased solubility of the polymer for solution processing; 7) the achievement of strong π-π interactions/intermolecular electronic coupling; and 8) bandgap modulation via electron donor-acceptor coupling of electron-poor (acceptor) and electron-rich (donor) A-B or B-A repeating units.

To illustrate, $M^2$, at each occurrence, independently can be selected from:

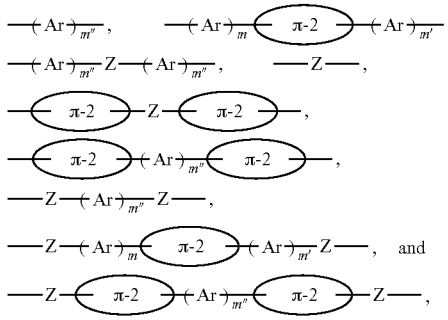

wherein:

π-2, at each occurrence, independently is a conjugated polycyclic moiety optionally substituted with 1-6 $R^d$ groups and not including an optionally substituted pyrrolo[3,2-b]pyrrole-2,5(1H,4H)-dione-3,6-diyl unit;

Ar, at each occurrence, independently can be a conjugated monocyclic moiety 5- or 6-membered aryl or heteroaryl group, wherein each of these groups optionally is substituted with 1-6 $R^d$ groups; wherein:

$R^d$, at each occurrence, independently is selected from a) halogen, b) —CN, c) —NO$_2$, d) —N($R^e$)$_2$, e) oxo, f) —OH, g) =C($R^f$)$_2$, h) —C(O)$R^e$, i) —C(O)O$R^e$, j) —C(O)N($R^e$)$_2$, k) —SH, l) —S(O)$_2$—$R^e$, m) —S(O)$_2$ O$R^e$, n) —(OCH$_2$CH$_2$)$_t$O$R^e$, o) —(OCF$_2$CF$_2$)$_t$O$R^e$, p) —(OCH$_2$CF$_2$)$_t$O$R^e$, q) —(OCF$_2$CH$_2$)$_t$O$R^e$, r) —(CH$_2$CH$_2$O)$_t$$R^e$, s) —(CF$_2$CF$_2$O)$_t$$R^e$, t) —(CH$_2$CF$_2$O)$_t$$R^e$, u) —(CF$_2$CH$_2$O)$_t$$R^e$, v) a C$_{1-40}$ alkyl group, w) a C$_{2-40}$ alkenyl group, x) a C$_{2-40}$ alkynyl group, y) a C$_{1-40}$ alkoxy group, z) a C$_{1-40}$ alkylthio group, aa) a C$_{1-40}$ haloalkyl group, ab) a —Y—C$_{3-10}$ cycloalkyl group, ac) a —Y—C$_{6-14}$ aryl group, ad) a —Y—C$_{6-14}$ haloaryl group, ae) a —Y-3-12 membered cycloheteroalkyl group, and af) a —Y-5-14 membered heteroaryl group, wherein each of the C$_{1-40}$ alkyl group, the C$_{2-40}$ alkenyl group, the C$_{2-40}$ alkynyl group, the C$_{1-40}$ alkoxy group, the C$_{1-40}$ alkylthio group, the C$_{1-40}$ haloalkyl group, the C$_{3-10}$ cycloalkyl group, the C$_{6-14}$ aryl group, the C$_{6-14}$ haloaryl group, the 3-12 membered cycloheteroalkyl group, and the 5-14 membered heteroaryl group is optionally substituted with 1-4 $R^f$ groups;

$R^e$, at each occurrence, independently is selected from H, a C$_{1-40}$ alkyl group, a C$_{1-40}$ haloalkyl group, and a —Y—C$_{6-14}$ aryl group;

$R^f$, at each occurrence, independently is selected from a) halogen, b) —CN, c) —NO$_2$, d) oxo, e) —OH, f) —NH$_2$, g) —NH(C$_{1-20}$ alkyl), h) —N(C$_{1-20}$ alkyl)$_2$, i) —N(C$_{1-20}$ alkyl)-C$_{6-14}$ aryl, j) —N(C$_{6-14}$ aryl)$_2$, k) —S(O)$_w$H, l) —S(O)$_w$—C$_{1-2}$ alkyl, m) —S(O)$_2$OH, n) —S(O)$_2$—OC$_{1-20}$ alkyl, o) —S(O)$_2$—OC$_{6-14}$ aryl, p) —CHO, q) —C(O)—C$_{1-20}$ alkyl, r) —C(O)—C$_{6-14}$ aryl, s) —C(O)OH, t) —C(O)—OC$_{1-20}$ alkyl, u) —C(O)—OC$_{6-14}$ aryl, v) —C(O)NH$_2$, w) —C(O)NH—C$_{1-20}$ alkyl, x) —C(O)N(C$_{1-20}$ alkyl)$_2$, y) —C(O)NH—C$_{6-14}$ aryl, z) —C(O)N(C$_{1-20}$ alkyl)-C$_{6-14}$ aryl, aa) —C(O)N(C$_{6-14}$ aryl)$_2$, ab) —C(S)NH$_2$, ac) —C(S)NH—C$_{1-20}$ alkyl, ad) —C(S)N(C$_{1-20}$ alkyl)$_2$, ae) —C(S)N(C$_{6-14}$ aryl)$_2$, af) —C(S)N(C$_{1-20}$ alkyl)-C$_{6-14}$ aryl, ag) —C(S)NH—C$_{6-14}$ aryl, ah) —S(O)$_w$ NH$_2$, ai) —S(O)$_w$NH(C$_{1-20}$ alkyl), aj) —S(O)$_w$N(C$_{1-20}$ alkyl)$_2$, ak) —S(O)$_w$NH(C$_{6-14}$ aryl), al) —S(O)$_w$ N(C$_{1-20}$ alkyl)-C$_{6-14}$ aryl, am) —S(O)$_w$N (C$_{6-14}$ aryl)$_2$, an) —SiH$_3$, ao) —SiH(C$_{1-20}$ alkyl)$_2$, ap) —SiH$_2$(C$_{1-20}$ alkyl), aq) —Si(C$_{1-20}$ alkyl)$_3$, ar) a C$_{1-2}$ alkyl group, as) a C$_{2-20}$ alkenyl group, at) a C$_{2-20}$ alkynyl group, au) a C$_{1-20}$ alkoxy group, av) a C$_{1-20}$ alkylthio group, aw) a C$_{1-20}$ haloalkyl group, ax) a C$_{3-10}$ cycloalkyl group, ay) a C$_{6-14}$ aryl group, az) a C$_{6-14}$ haloaryl group, ba) a 3-12 membered cycloheteroalkyl group, or bb) a 5-14 membered heteroaryl group;

Y, at each occurrence, independently is selected from a divalent C$_{1-10}$ alkyl group, a divalent C$_{1-10}$ haloalkyl group, and a covalent bond; and t is 1, 2, 3, 4, 5, 6, 7, 8, 9 or 10;

w, at each occurrence, independently is 0, 1, or 2;

Z is a conjugated linear linker;

m and m' independently are 0, 1, 2, 3, or 4; and m" is 1, 2, 3, or 4.

In some embodiments, π-2 can be a polycyclic C$_{8-24}$ aryl group or a polycyclic 8-24 membered heteroaryl group, wherein each of these groups can be optionally substituted with 1-6 $R^d$ groups, where $R^d$ is as defined herein. For example, π-2 can have a planar and highly conjugated cyclic core which can be optionally substituted as disclosed herein. Examples of suitable cyclic cores include naphthalene, anthracene, tetracene, pentacene, perylene, pyrene, coronene, fluorene, indacene, indenofluorene, and tetraphenylene, as well as their analogs in which one or more carbon atoms can be replaced with a heteroatom such as O, S, Si, Se, N, or P. In certain embodiments, π-2 can include at least one electron-withdrawing group. In certain embodiments, π-2 can include one or more solubilizing groups. For example, π-2 can include one or more solubilizing groups selected from a C$_{1-40}$ alkyl group, a C$_{1-40}$ alkoxy group, a C$_{1-40}$ alkylthio group, a C$_{1-40}$ haloalkyl group, —(OCH$_2$CH$_2$)$_t$O$R^e$, —(OCF$_2$CF$_2$)$_t$ O$R^e$, —(OCH$_2$CF$_2$)$_t$O$R^e$, —(OCF$_2$CH$_2$)$_t$O$R^e$, —(CH$_2$CH$_2$O)$_t$—$R^e$, —(CF$_2$CF$_2$O)$_t$$R^e$, —(CH$_2$CF$_2$O)$_t$$R^e$, or —(CF$_2$CH$_2$O)$_t$$R^e$; where t is 1, 2, 3, 4, 5, 6, 7, 8, 9 or 10; and $R^e$ is a C$_{1-20}$ alkyl group or a C$_{1-20}$ haloalkyl group.

In certain embodiments, π-2 can include two or more (e.g., 2-4) fused rings where each ring can be a five-, six-, or seven-membered ring optionally substituted with 1-6 $R^d$ groups, wherein $R^d$ is as defined herein. For example, in the various embodiments described herein, $R^d$ can be an electron-withdrawing group such as a halogen, —CN, oxo, =C($R^f$)$_2$, a C$_{1-20}$ alkoxy group, a C$_{1-20}$ alkylthio group, or a C$_{1-20}$ haloalkyl group. In certain embodiments, $R^d$ can be a halogen (e.g., F, Cl, Br, or I), —CN, a C$_{1-6}$ alkoxy group, —OCF$_3$, or —CF$_3$. In particular embodiments, $R^d$ can be =O, —CN, =C(CN)$_2$, F, Cl, Br, or I.

In some embodiments, π-2 can include a monocyclic ring (e.g., a 1,3-dioxolane group or a derivative thereof including optional substituents and/or ring heteroatoms) covalently bonded to a second monocyclic ring or a polycyclic system via a spiroatom (e.g., a spiro carbon atom).

In some embodiments, π-2 can be selected from:

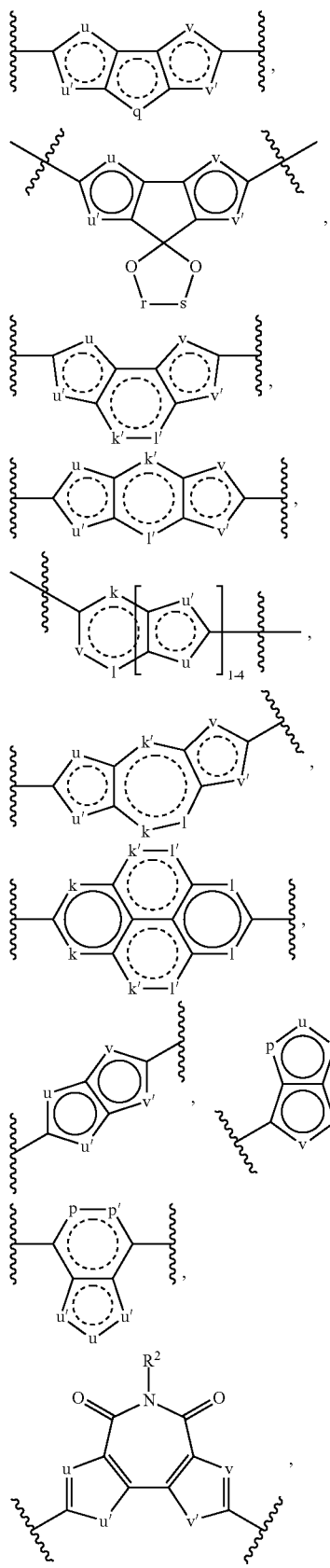

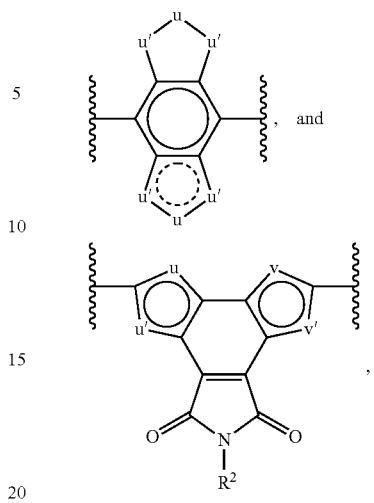, and

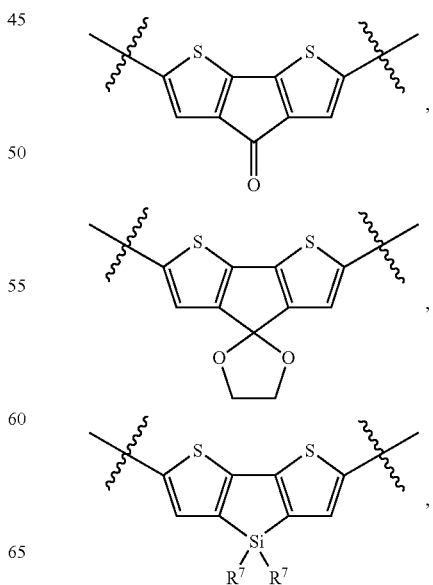

wherein:

k, k', l and l', at each occurrence, are independently selected from —CR²=, =CR²—, —C(O)—, and —C(C(CN)₂)—;

p, p', q and q', at each occurrence, are independently selected from —CR'=, =CR'—, —C(O)—, —C(C(CN)₂)—, —O—, —S—, —N=, =N—, —N(R')—, —SiR'=, =SiR'—, and —SiR'R'—;

r and s, at each occurrence, are independently selected from —CR'R'— or —C(C(CN)₂)—;

u, u', v and v', at each occurrence, are independently selected from —CR'=, =CR'—, —C(O)—, —C(C(CN)₂)—, —S—, —S(O)—, —S(O)₂—, —O—, —N=, =N—, —SiR'=, =SiR'—, —SiR'R'—, —CR'R'—CR'R'—, and —CR'=CR'—; and R', at each occurrence, independently is H or $R^d$, wherein $R^d$ is as defined herein.

In certain embodiments, π-2 can be selected from:

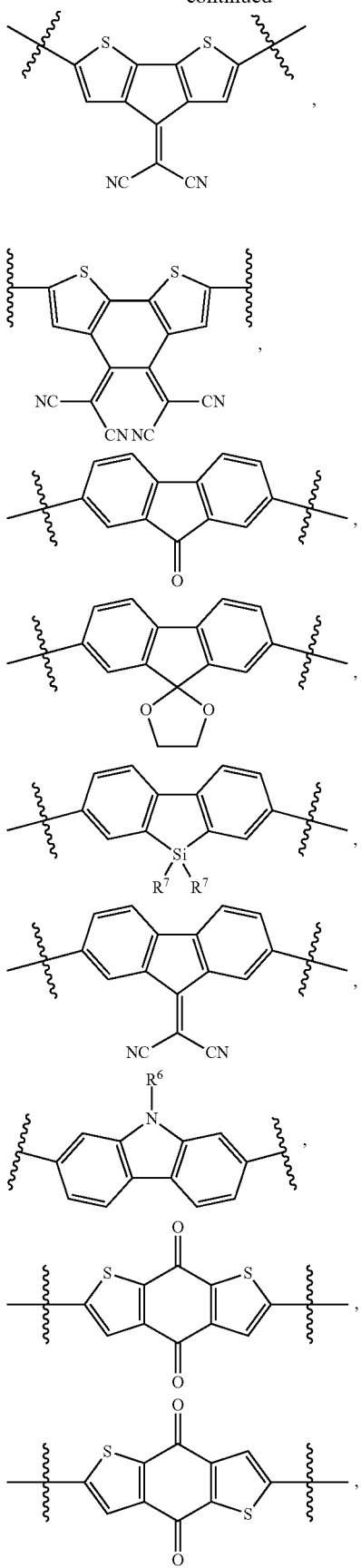
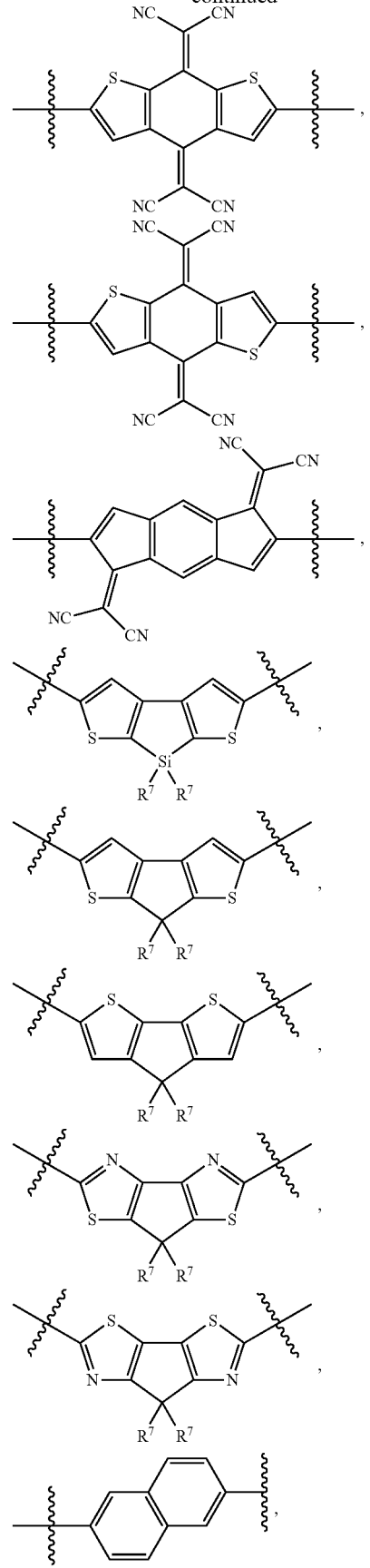

37
-continued
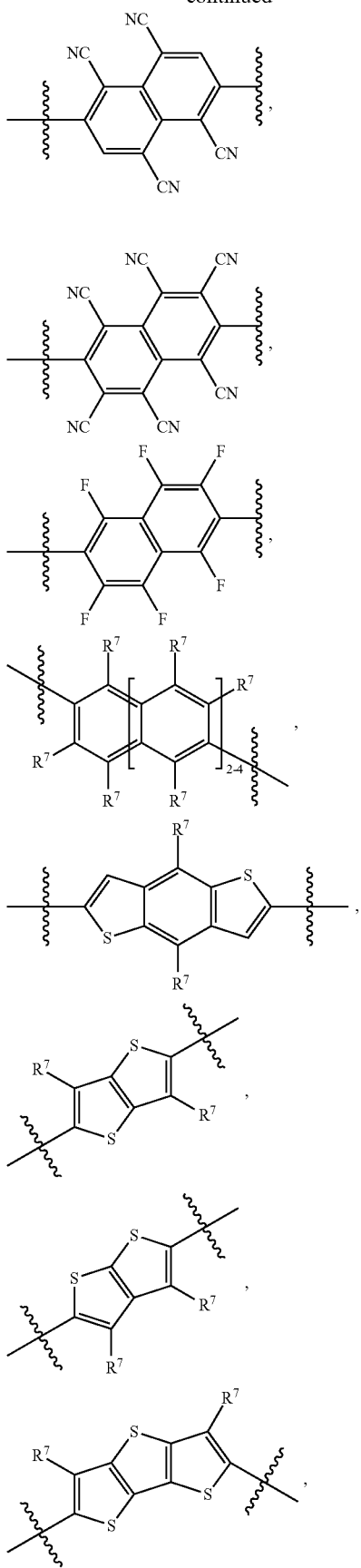
38
-continued
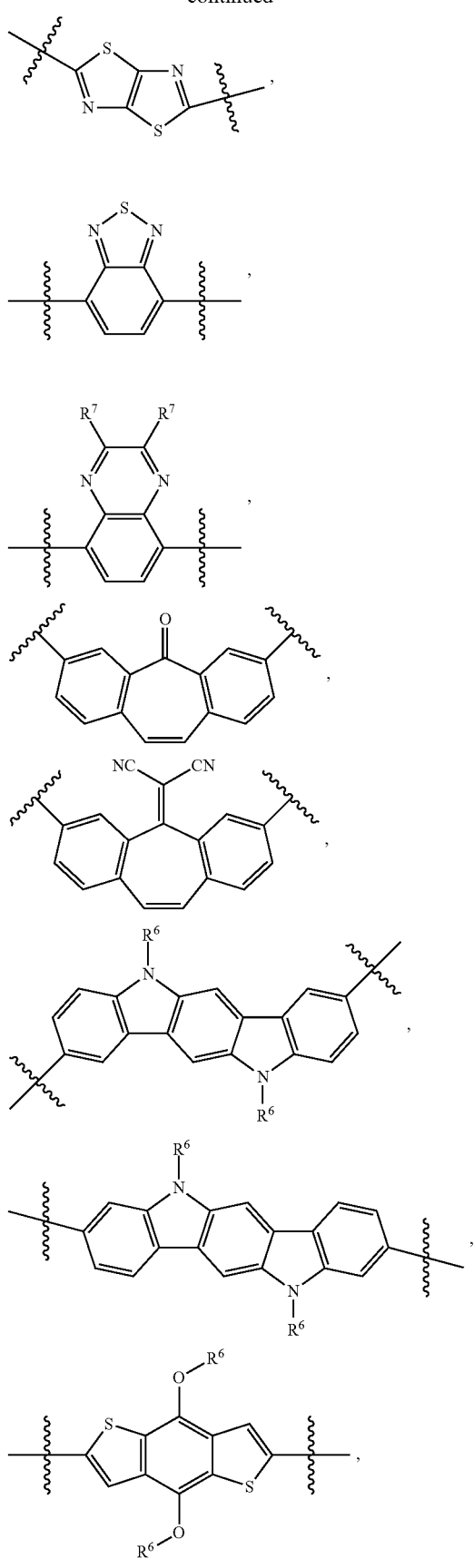

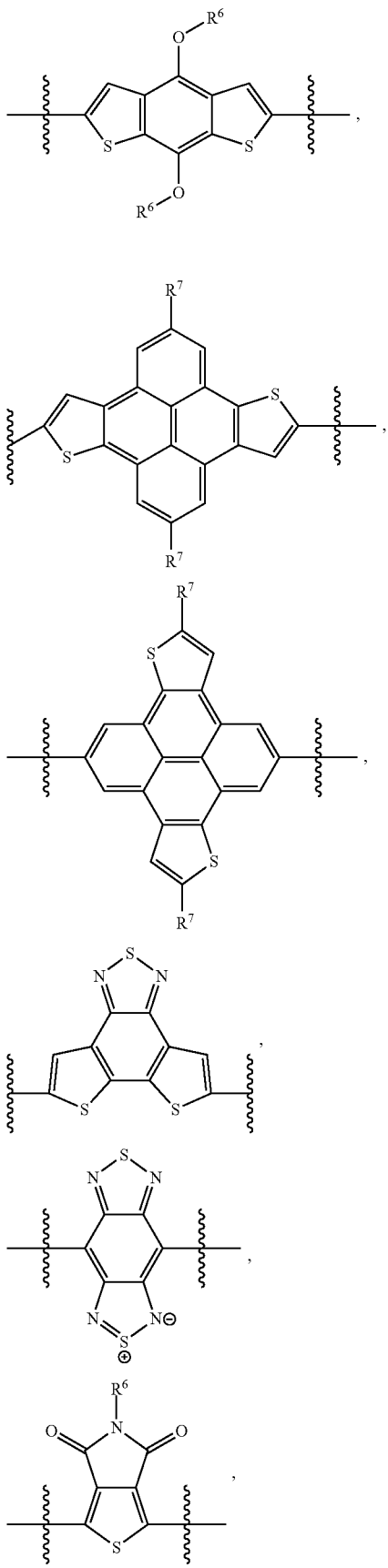
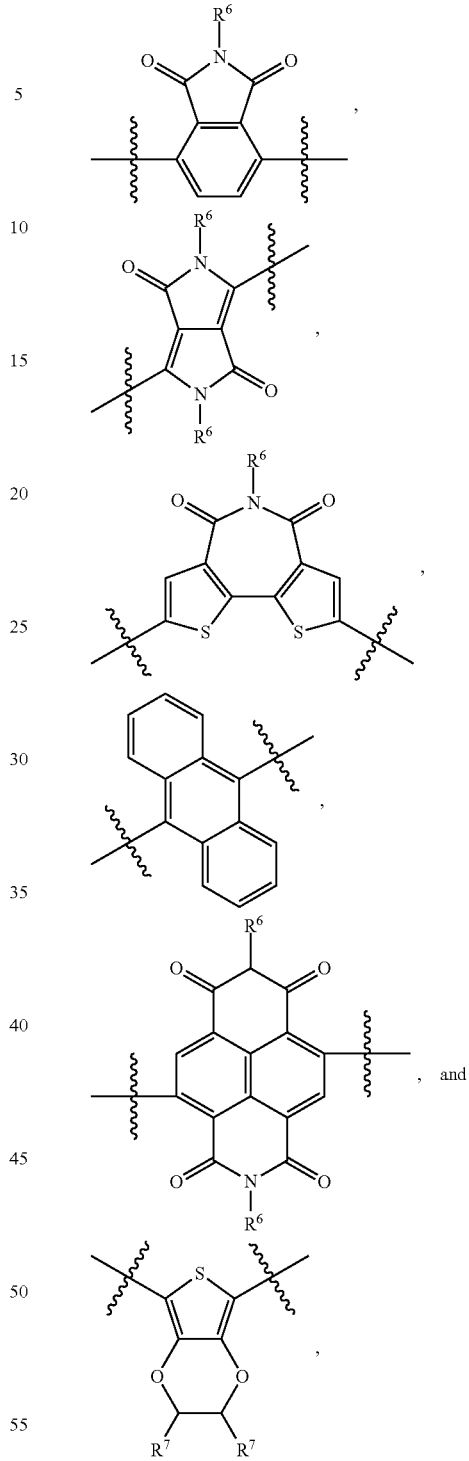

wherein $R^6$, at each occurrence, independently is H, a $C_{1-40}$ alkyl group, a $C_{1-40}$ haloalkyl group, $-(CH_2CH_2O)_t-R^e$, $-(CF_2CF_2O)_tR^e$, $-(CH_2CF_2O)_tR^e$, or $-(CF_2CH_2O)_tR^e$; and $R^7$, at each occurrence, independently is H, halogen, CN, a $C_{1-40}$ alkyl group, a $C_{1-40}$ alkoxy group, a $C_{1-40}$ alkylthio group, a $C_{1-40}$ haloalkyl group, $-(OCH_2CH_2)_tOR^e$, $-(OCF_2CF_2)_tOR^e$, $-(OCH_2CF_2)_tOR^e$, $-(OCF_2CH_2)_tOR^e$, $-(CH_2CH_2O)_t-R^e$, $-(CF_2CF_2O)_tR^e$, $-(CH_2CF_2O)_tR^e$, or $-(CF_2CH_2O)_tR^e$; wherein t is 1, 2, 3, 4, 5, 6, 7, 8, 9 or 10; and $R^e$ is a $C_{1-20}$ alkyl group or a $C_{1-20}$ haloalkyl group.

In embodiments where M² includes one or more (for example, one to four) Ar groups, Ar, at each occurrence, independently can be an optionally substituted monocyclic moiety selected from:

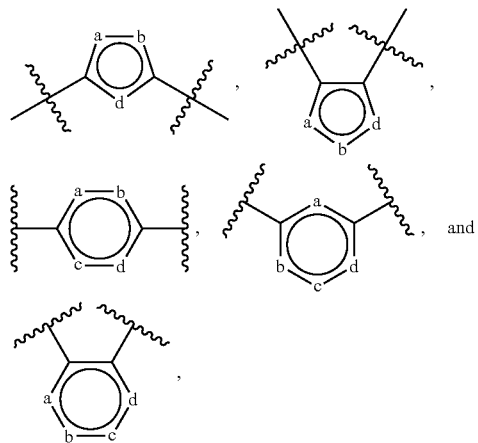

wherein:
a, b, c and d independently are selected from —O—, —S—, —Se—, —CH=, =CH—, —CR³=, =CR³—, —C(O)—, —C(C(CN)₂)—, —N=, =N—, —NH— and —NR³—;
R³, at each occurrence, independently is selected from a) halogen, b) —CN, c) —NO₂, d) —N(Rᵉ)₂, e) —OH, f) —SH, g) —(OCH₂CH₂)ₜORᵉ, h) —C(O)Rᵉ, i) —C(O)ORᵉ, j) —C(O)N(Rᵉ)₂, k) a $C_{1-40}$ alkyl group, l) a $C_{2-40}$ alkenyl group, m) a $C_{2-40}$ alkynyl group, n) a $C_{1-40}$ alkoxy group, o) a $C_{1-40}$ alkylthio group, p) a $C_{1-40}$ haloalkyl group, q) a —Y—$C_{3-14}$ cycloalkyl group, r) a —Y—$C_{6-14}$ aryl group, s) a —Y-3-14 membered cycloheteroalkyl group, and t) a —Y-5-14 membered heteroaryl group, wherein each of the $C_{1-40}$ alkyl group, the $C_{2-40}$ alkenyl group, the $C_{2-40}$ alkynyl group, the $C_{1-40}$ alkoxy group, the $C_{1-40}$ alkylthio group, the $C_{1-40}$ haloalkyl group, the $C_{3-14}$ cycloalkyl group, the $C_{6-14}$ aryl group, the 3-14 membered cycloheteroalkyl group, and the 5-14 membered heteroaryl group optionally is substituted with 1-5 $R^f$ groups;
wherein $R^e$, $R^f$, Y and t are as defined herein.

In certain embodiments, each Ar independently can be an optionally substituted 5- or 6-membered aryl or heteroaryl group. For example, each Ar can be selected from a phenyl group, a thienyl group, a furyl group, a pyrrolyl group, an isothiazolyl group, a thiazolyl group, a 1,2,4-thiadiazolyl group, a 1,3,4-thiadiazolyl group, and a 1,2,5-thiadiazolyl group, wherein each group can be divalent or monovalent, and optionally can be substituted with 1-4 substituents independently selected from a halogen, —CN, an oxo group, a $C_{1-6}$ alkyl group, a $C_{1-6}$ alkoxy group, a $C_{1-6}$ haloalkyl group, NH₂, NH($C_{1-6}$ alkyl) and N($C_{1-6}$ alkyl)₂. In particular embodiments, each Ar can be selected from a thienyl group, an isothiazolyl group, a thiazolyl group, a 1,2,4-thiadiazolyl group, a 1,3,4-thiadiazolyl group, a 1,2,5-thiadiazolyl group, a phenyl group, and a pyrrolyl group, wherein each group optionally can be substituted with 1-2 substituents independently selected from a halogen, —CN, an oxo group, a $C_{1-6}$ alkyl group, a $C_{1-6}$ alkoxy group, a $C_{1-6}$ haloalkyl group, NH₂, NH($C_{1-6}$ alkyl) and N($C_{1-6}$ alkyl)₂. In some embodiments, Ar can be unsubstituted. In some embodiments, Ar can be a thienyl group, an isothiazolyl group, a thiazolyl group, a 1,2,4-thiadiazolyl group, a 1,3,4-thiadiazolyl group, and a 1,2,5-thiadiazolyl group, wherein each optionally is substituted with 1-2 $C_{1-6}$ alkyl groups.

By way of example, (Ar)ₘ, (Ar)ₘ', and (Ar)ₘ" can be selected from:

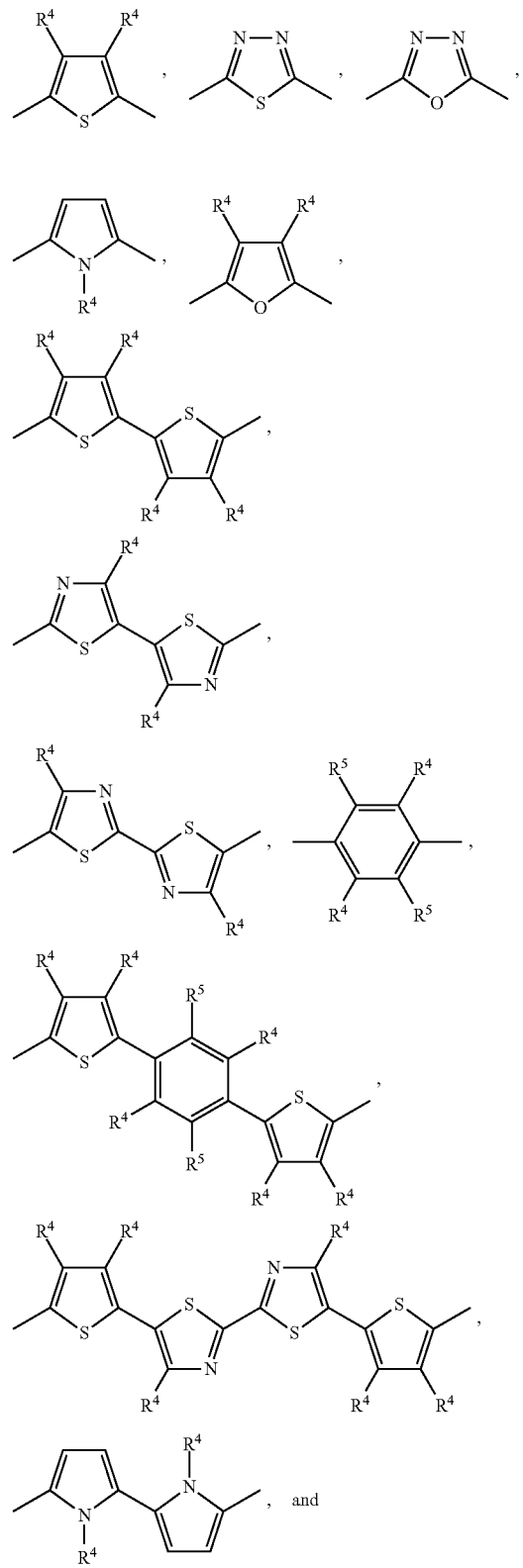

-continued

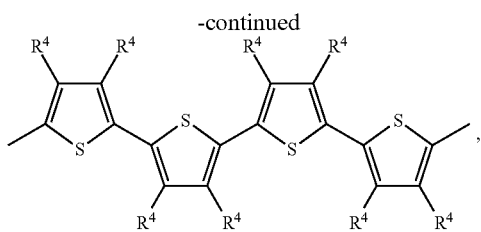

wherein $R^4$, at each occurrence, independently is H or $R^3$; and $R^5$, at each occurrence, independently is H, oxo, $=C(CN)_2$, or $R^3$, wherein $R^3$ is as defined herein. In particular embodiments,

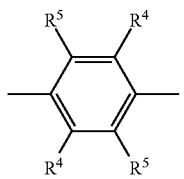

by itself or as part of

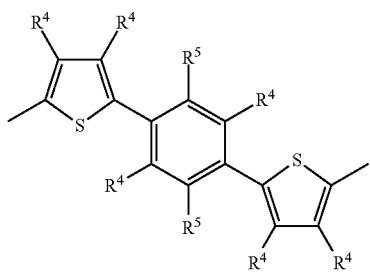

can be selected from:

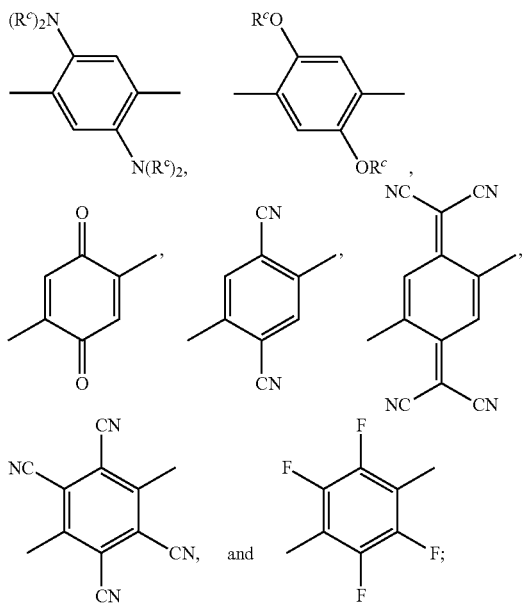

wherein $R^c$ is as defined herein.

In various embodiments, $M^2$ can include one or more conjugated linear linkers Z, where Z can be a conjugated system by itself (e.g., including two or more double or triple bonds) or can form a conjugated system with its neighboring components. For example, Z, at each occurrence, independently can be a divalent ethenyl group (i.e., having one double bond), a divalent ethynyl group (i.e., having one tripe bond), a $C_{4-40}$ alkenyl or alkynyl group that includes two or more conjugated double or triple bonds, or some other non-cyclic conjugated systems that can include heteroatoms such as Si, N, P, and the like. For example, Z, at each occurrence, independently can be selected from:

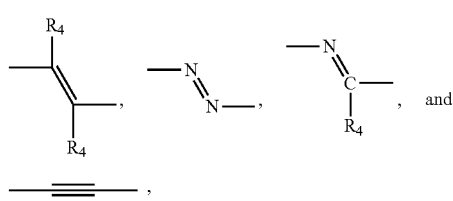

wherein $R^4$ is as defined herein. In certain embodiments, Z can be selected from:

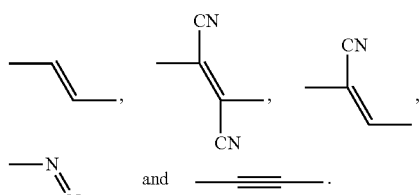

In some embodiments, $M^2$ can be $-(Ar)_{m''}-$, where m'' can be 1, 2, 3 or 4; and Ar, at each occurrence, independently can be a 5- or 6-membered aryl or heteroaryl group which optionally can be substituted with 1-2 $R^3$ groups, wherein $R^3$, at each occurrence, independently is selected from a halogen, —CN, —$(OCH_2CH_2)_tOCR^e$, a $C_{1-20}$ alkyl group, a $C_{1-20}$ alkoxy group, a $C_{1-20}$ alkylthio group, and a $C_{1-20}$ haloalkyl group, and $R^e$ and t are as defined herein. For example, $M^2$ can be selected from:

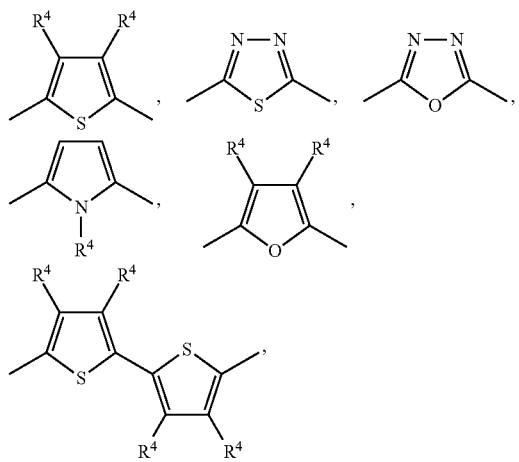

-continued
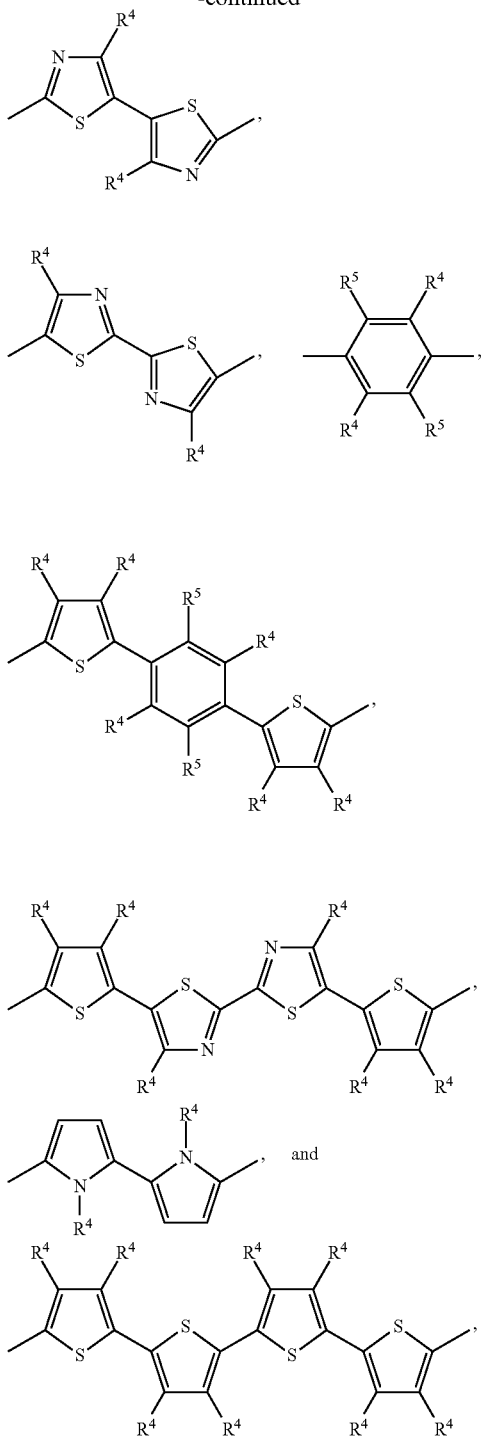
wherein R⁴ and R⁵ are as defined herein.
In some embodiments, M² can have the formula:
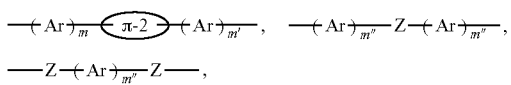
which can be selected from:
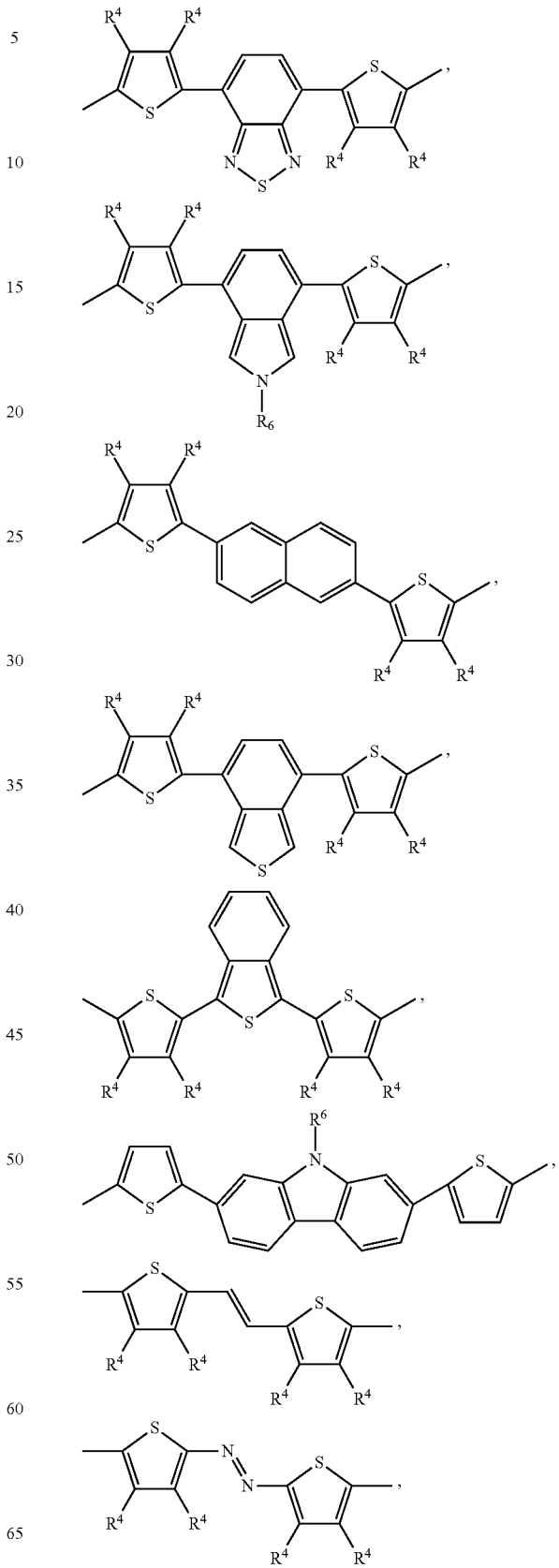

-continued

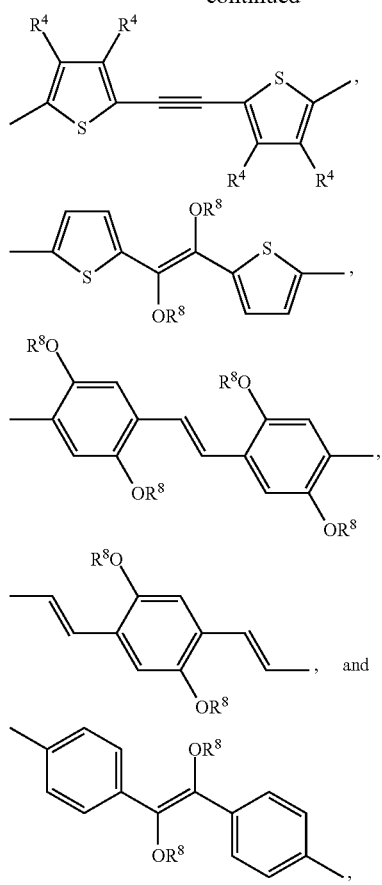

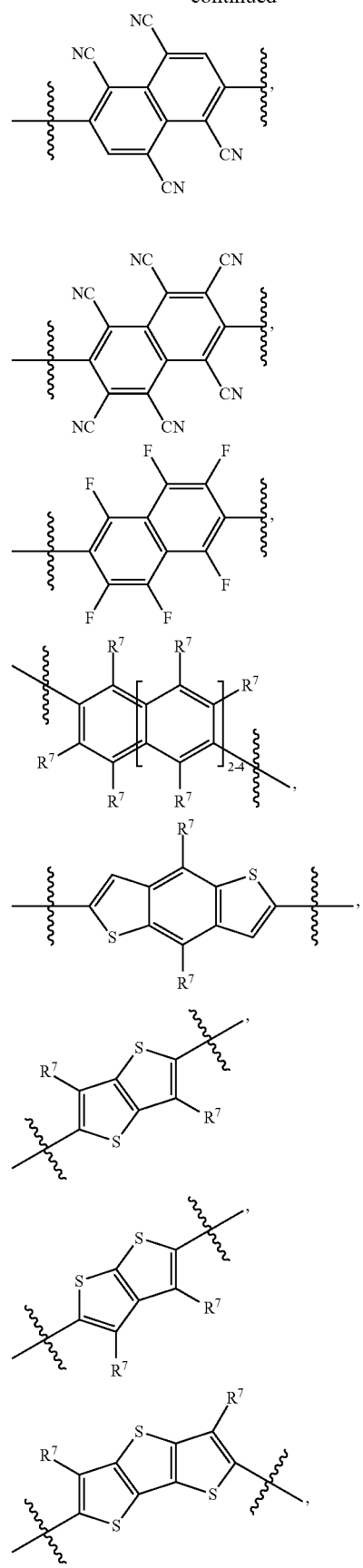

wherein:

R⁴, at each occurrence, independently can be selected from H, a halogen, —CN, a $C_{1-20}$ alkyl group, a $C_{1-20}$ alkoxy group, a $C_{1-20}$ alkylthio group, and a $C_{1-20}$ haloalkyl group;

R⁶, at each occurrence, independently can be selected from H, a $C_{1-20}$ alkyl group, and a $C_{1-20}$ haloalkyl group; and R⁸, at each occurrence, independently can be a $C_{1-20}$ alkyl group.

In some embodiments, $M^2$ can be selected from:

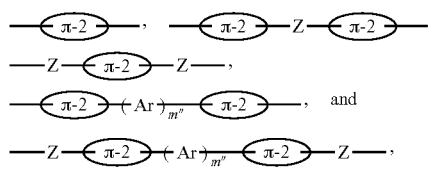

wherein π-2 is an optionally substituted $C_{8-24}$ aryl group or 8-24 membered heteroaryl group selected from:

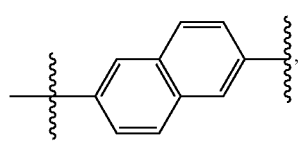

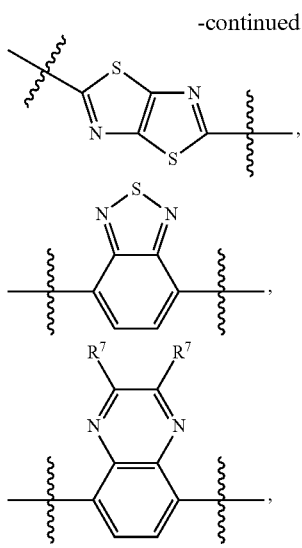

wherein R[7], at each occurrence, independently is H, halogen, CN, a $C_{1-40}$ alkyl group, a $C_{1-40}$ alkoxy group, a $C_{1-40}$ alkylthio group, or a $C_{1-40}$ haloalkyl group; and Ar, Z, and m" are as defined herein.

In particular embodiments, the present teachings relate to monomeric, oligomeric or polymeric compounds that include one or more optionally substituted pyrrolo[3,2-b]pyrrole-2,5 (1H,4H)-dione-3,6-diyl units and one or more optionally substituted 5-membered heteroaryl groups (e.g., a thienyl group). For example, the one or more 5-membered heteroaryl groups can be optionally substituted with 1-2 R[3] groups, where R[3], at each occurrence, independently is selected from a halogen, —CN, —(OCH$_2$CH$_2$)$_{1-10}$—O—C$_{1-6}$ alkyl, a $C_{1-20}$ alkyl group, a $C_{1-20}$ alkoxy group, a $C_{1-20}$ alkylthio group, and a $C_{1-20}$ haloalkyl group. In particular embodiments, the present teachings relate to monomeric, oligomeric or polymeric compounds that include one or more optionally substituted pyrrolo[3,2-b]pyrrole-2,5(1H,4H)-dione-3,6-diyl units and one or more aryl (e.g., a phenyl group) or heteroaryl (e.g., a thienyl group) groups substituted with at least one electron-donating group (e.g., an alkyl group, an alkoxy group, or an alkylthio group). In particular embodiments, the present teachings relate to monomeric, oligomeric or polymeric compounds that include one or more optionally substituted pyrrolo[3,2-b]pyrrole-2,5(1H,4H)-dione-3,6-diyl units and one or more optionally substituted polycyclic conjugated moieties (e.g., a polycyclic aryl group including a thienyl group fused with one or more cyclic groups).

In particular embodiments, the present teachings relate to monomeric, oligomeric or polymeric compounds that include one or more optionally substituted pyrrolo[3,2-b]pyrrole-2,5 (1H,4H)-dione-3,6-diyl units and one or more optionally substituted biheteroaryl units. In particular embodiments, the one or more biheteroaryl units each comprise two 3-substituted heteroaryl units that are head-to-head (H—H) in orientation to each other. While semiconducting compounds reported in the literature have typically avoided H—H linkages due to the general belief that steric interactions will cause significant backbone torsion thereby precluding backbone planarity and disrupting packing, it has been found surprisingly that certain compounds having H—H disubstituted biheteroaryl linkages can exhibit extended conjugation and close intermolecular π-stacking.

Accordingly, in particular embodiments, the present teachings relate to monomeric, oligomeric or polymeric compounds that include one or more optionally substituted pyrrolo[3,2-b]pyrrole-2,5(1H,4H)-dione-3,6-diyl units and one or more biheteroaryl units of the formula:

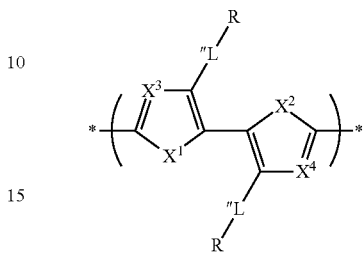

wherein:

L", at each occurrence, independently is selected from —CH$_2$—, —O—, —S—, and —Se—;

R, at each occurrence, independently is selected from a $C_{1-40}$ alkyl group, a $C_{2-40}$ alkenyl group, a $C_{2-40}$ alkynyl group, and a $C_{1-40}$ haloalkyl group, wherein one or more non-adjacent CH$_2$ groups independently are optionally replaced by —O—, —S—, or —Se—;

X[1] and X[2], at each occurrence, are independently selected from S, O, and Se; and X[3] and X[4], at each occurrence, are independently selected from N, CH and CF.

For example, each of X[1] and X[2] in the above formula can be S, while L", R, X[3] and X[4] are as defined above and hereinbelow. Accordingly, the present teachings include monomeric, oligomeric or polymeric compounds including one or more units of the formula:

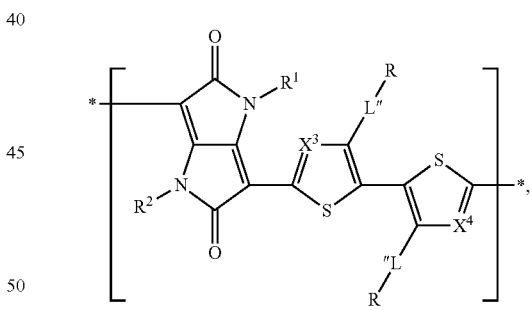

where L", R, R[1], R[2], X[3] and X[4] are as defined herein.

Hence, to further illustrate, the present monomeric, oligomeric or polymeric compounds can include one or more optionally substituted pyrrolo[3,2-b]pyrrole-2,5(1H,4H)-dione-3,6-diyl units and one or more units selected from:

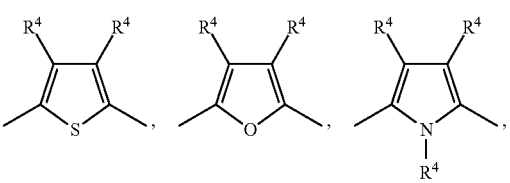

-continued
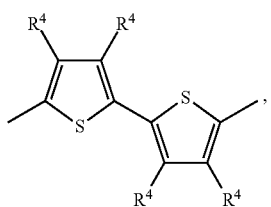
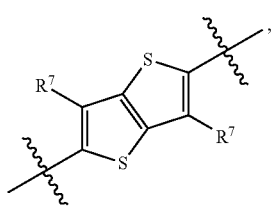
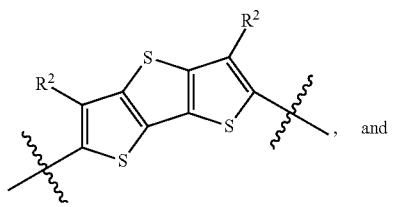
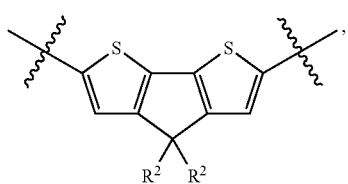
wherein R⁴, at each occurrence, independently is H, halogen, CN, a $C_{1-20}$ alkyl group, a $C_{1-20}$ alkoxy group, a $C_{1-20}$ alkylthio group, or a $C_{1-20}$ haloalkyl group; and R⁷, at each occurrence, independently is H, halogen, CN, a $C_{1-40}$ alkyl group, a $C_{1-40}$ alkoxy group, a $C_{1-40}$ alkylthio group, or a $C_{1-40}$ haloalkyl group. For example, the one or more co-units can be selected from:
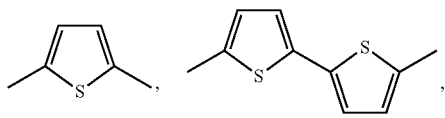
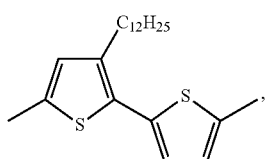
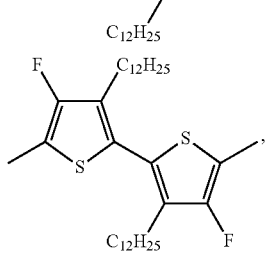
-continued
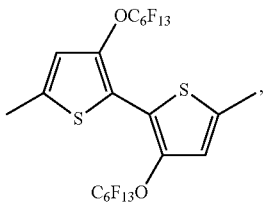
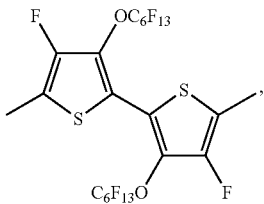
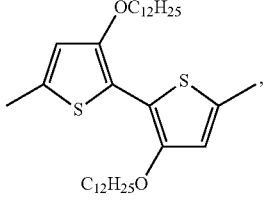
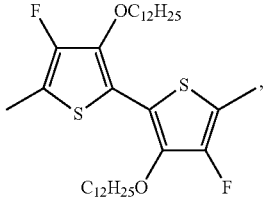
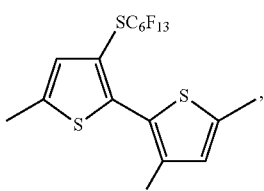
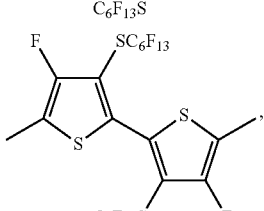
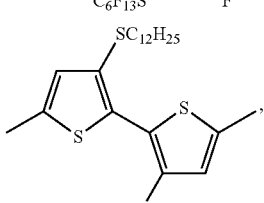
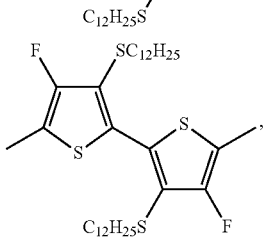

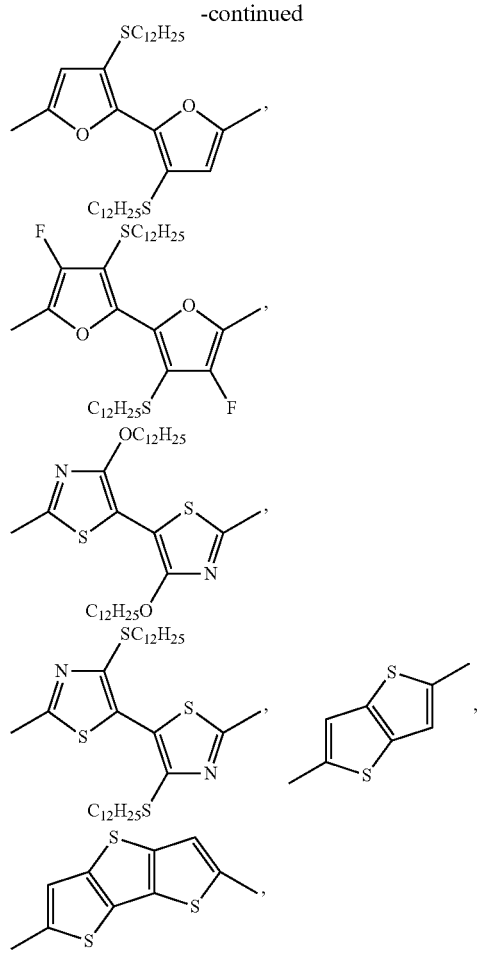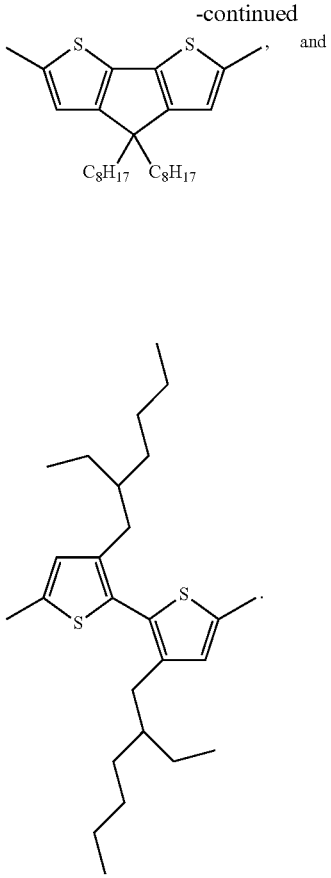
Exemplary compounds of the present teachings include those having one or more units selected from:
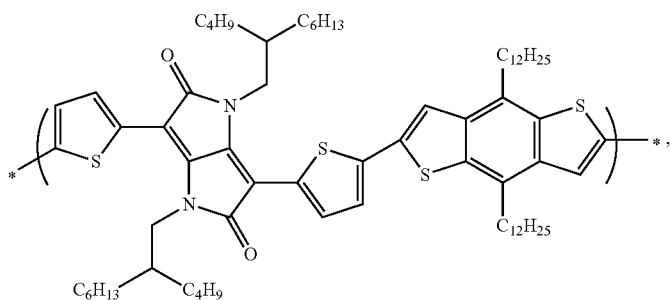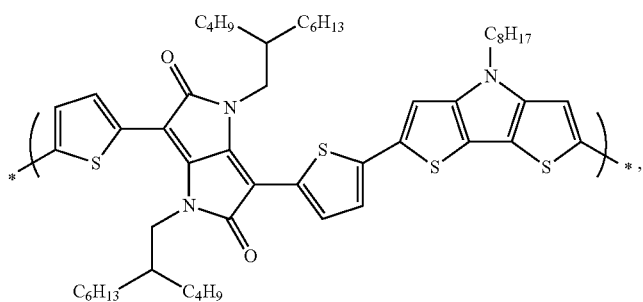

-continued
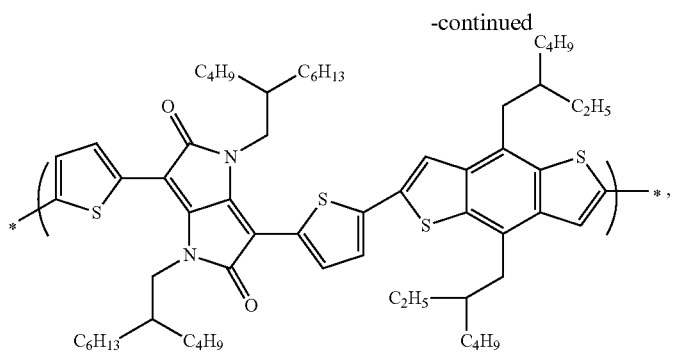
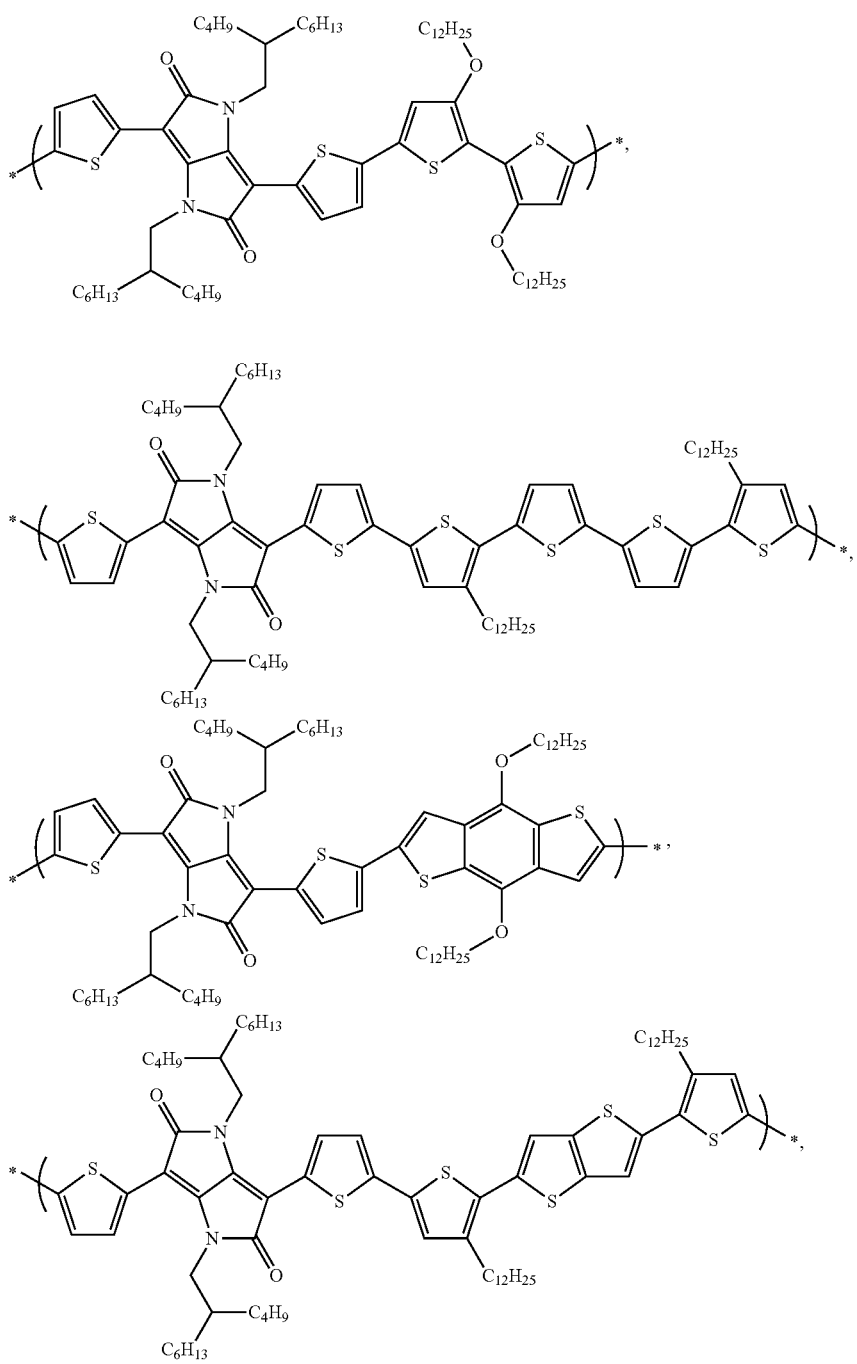

-continued
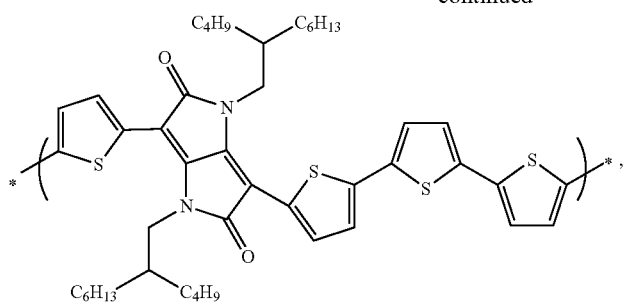
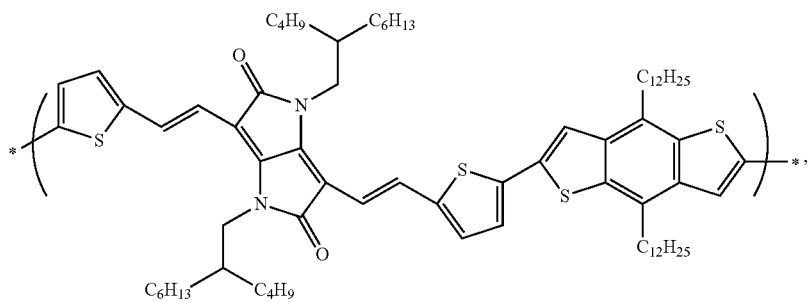
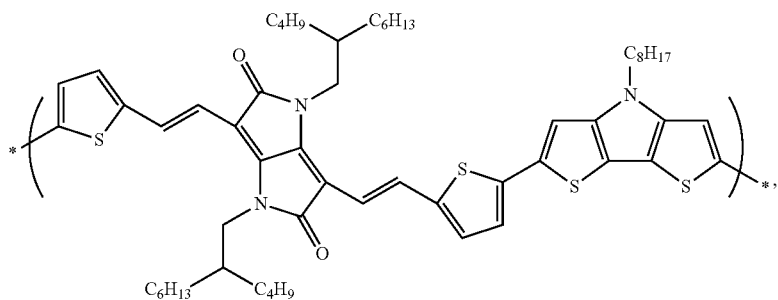
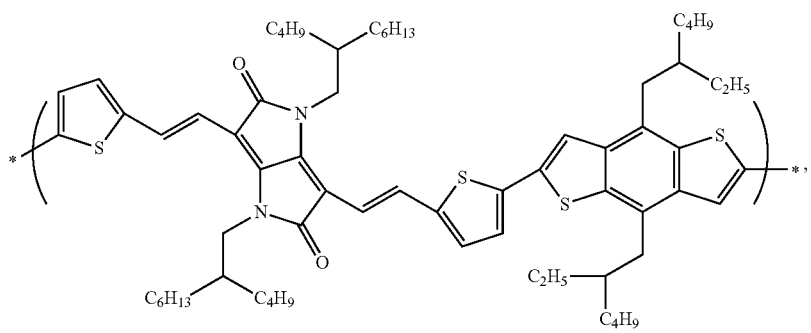
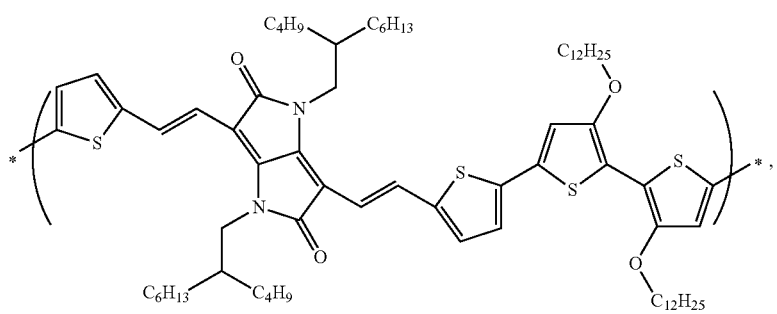

-continued

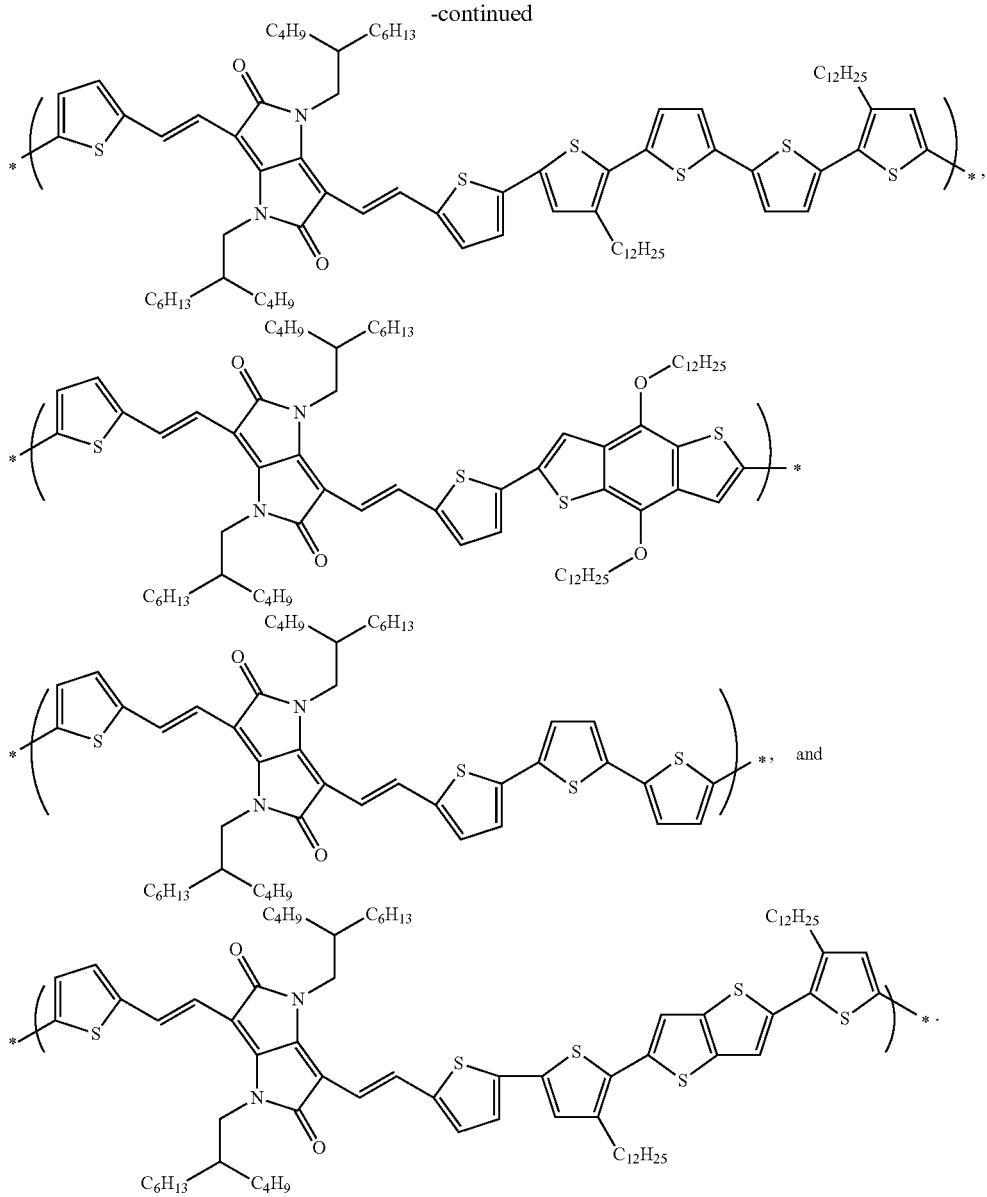

Compounds of the present teachings can be prepared according to procedures analogous to those described in the Examples. In particular, Stille coupling can be used to prepare co-polymeric compounds according to the present teachings with high molecular weight and in high yield (≥75%) and purity, as confirmed by $^1$H NMR spectra, elemental analysis, and GPC measurements.

Alternatively, the present compounds can be prepared from commercially available starting materials, compounds known in the literature, or via other readily prepared intermediates, by employing standard synthetic methods and procedures known to those skilled in the art. Standard synthetic methods and procedures for the preparation of organic molecules and functional group transformations and manipulations can be readily obtained from the relevant scientific literature or from standard textbooks in the field. It will be appreciated that where typical or preferred process conditions (i.e., reaction temperatures, times, mole ratios of reactants, solvents, pressures, etc.) are given, other process conditions can also be used unless otherwise stated. Optimum reaction conditions can vary with the particular reactants or solvent used, but such conditions can be determined by one skilled in the art by routine optimization procedures. Those skilled in the art of organic synthesis will recognize that the nature and order of the synthetic steps presented can be varied for the purpose of optimizing the formation of the compounds described herein.

The processes described herein can be monitored according to any suitable method known in the art. For example, product formation can be monitored by spectroscopic means, such as nuclear magnetic resonance spectroscopy (NMR, e.g., $^1$H or $^{13}$C), infrared spectroscopy (IR), spectrophotometry (e.g., UV-visible), mass spectrometry (MS), or by chromatography such as high pressure liquid chromatography (HPLC), gas chromatography (GC), gel-permeation chromatography (GPC), or thin layer chromatography (TLC).

The reactions or the processes described herein can be carried out in suitable solvents which can be readily selected by one skilled in the art of organic synthesis. Suitable solvents typically are substantially nonreactive with the reactants, intermediates, and/or products at the temperatures at which the reactions are carried out, i.e., temperatures that can range from the solvent's freezing temperature to the solvent's boiling temperature. A given reaction can be carried out in one solvent or a mixture of more than one solvent. Depending on the particular reaction step, suitable solvents for a particular reaction step can be selected.

Certain embodiments disclosed herein can be stable under ambient conditions ("ambient stable"), soluble in common solvents, and in turn solution-processable into various articles, structures, or devices. As used herein, a compound can be considered "ambient stable" or "stable at ambient conditions" when the carrier mobility or the reduction-potential of the compound is maintained at about its initial measurement when the compound is exposed to ambient conditions, for example, air, ambient temperature, and humidity, over a period of time. For example, a polymer according to the present teachings can be described as ambient stable if its carrier mobility or reduction potential does not vary more than 20% or more than 10% from its initial value after exposure to ambient conditions, including, air, humidity and temperature, over a 3 day, 5 day, or 10 day period. Without wishing to be bound by any particular theory, it is believed that the strong electron-depleted electronic structure of the thienocoronene moiety, and in the case of the polymers, the regioregular highly π-conjugated polymeric backbone, can make the present compounds ambient-stable n-channel semiconductor materials without requiring additional π-core functionalization (i.e., core substitution of the thienocoronene moiety) with strong electron-withdrawing functionalities.

As used herein, a compound can be considered soluble in a solvent when at least 0.1 mg of the compound can be dissolved in 1 mL of the solvent. Examples of common organic solvents include petroleum ethers; acetonitrile; aromatic hydrocarbons such as benzene, toluene, xylene, and mesitylene; ketones such as acetone, and methyl ethyl ketone; ethers such as tetrahydrofuran, dioxane, bis(2-methoxyethyl)ether, diethyl ether, di-isopropyl ether, and t-butyl methyl ether; alcohols such as methanol, ethanol, butanol, and isopropyl alcohol; aliphatic hydrocarbons such as hexanes; esters such as methyl acetate, ethyl acetate, methyl formate, ethyl formate, isopropyl acetate, and butyl acetate; amides such as dimethylformamide and dimethylacetamide; sulfoxides such as dimethylsulfoxide; halogenated aliphatic and aromatic hydrocarbons such as dichloromethane, chloroform, ethylene chloride, chlorobenzene, dichlorobenzene, and trichlorobenzene; and cyclic solvents such as cyclopentanone, cyclohexanone, and 2-methylpyrrolidone.

As used herein, "solution-processable" refers to compounds (e.g., thienocoronene-imide copolymers), materials, or compositions that can be used in various solution-phase processes including spin-coating, printing (e.g., inkjet printing, screen printing, pad printing, offset printing, gravure printing, flexographic printing, lithographic printing, mass-printing and the like), spray coating, electrospray coating, drop casting, dip coating, and blade coating.

The present teachings, therefore, further provide methods of preparing a semiconductor material. The methods can include preparing a composition that includes one or more compounds disclosed herein dissolved or dispersed in a liquid medium such as a solvent or a mixture of solvents, depositing the composition on a substrate to provide a semiconductor material precursor, and processing (e.g., heating) the semiconductor precursor to provide a semiconductor material (e.g., a thin film semiconductor) that includes a compound disclosed herein. In various embodiments, the liquid medium can be an organic solvent, an inorganic solvent such as water, or combinations thereof. In some embodiments, the composition can further include one or more additives independently selected from viscosity modulators, detergents, dispersants, binding agents, compatiblizing agents, curing agents, initiators, humectants, antifoaming agents, wetting agents, pH modifiers, biocides, and bactereriostats. For example, surfactants and/or polymers (e.g., polystyrene, polyethylene, poly-alpha-methylstyrene, polyisobutene, polypropylene, polymethylmethacrylate, and the like) can be included as a dispersant, a binding agent, a compatiblizing agent, and/or an antifoaming agent. In some embodiments, the depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin coating, drop-casting, zone casting, dip coating, blade coating, or spraying.

Compounds of the present teachings can be used to prepare semiconductor materials (e.g., compositions and composites), which in turn can be used to fabricate various articles of manufacture, structures, and devices. In some embodiments, semiconductor materials incorporating one or more compounds of the present teachings can exhibit p-type semiconductor activity, ambipolar activity, light absorption, and/or light emission.

The present teachings, therefore, further provide methods of preparing a semiconductor material. The methods can include preparing a composition that includes one or more compounds disclosed herein dissolved or dispersed in a liquid medium such as a solvent or a mixture of solvents, depositing the composition on a substrate to provide a semiconductor material precursor, and processing (e.g., heating) the semiconductor precursor to provide a semiconductor material (e.g., a thin film semiconductor) that includes a compound disclosed herein. In various embodiments, the liquid medium can be an organic solvent, an inorganic solvent such as water, or combinations thereof. In some embodiments, the composition can further include one or more additives independently selected from viscosity modulators, detergents, dispersants, binding agents, compatiblizing agents, curing agents, initiators, humectants, antifoaming agents, wetting agents, pH modifiers, biocides, and bactereriostats. For example, surfactants and/or polymers (e.g., polystyrene, polyethylene, poly-alpha-methylstyrene, polyisobutene, polypropylene, polymethylmethacrylate, and the like) can be included as a dispersant, a binding agent, a compatiblizing agent, and/or an antifoaming agent. In some embodiments, the depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin coating, drop-casting, zone casting, dip coating, blade coating, or spraying.

Various articles of manufacture including electronic devices, optical devices, and optoelectronic devices, such as thin film semiconductors, field effect transistors (e.g., thin film transistors), photovoltaics, photodetectors, organic light emitting devices such as organic light emitting diodes (OLEDs) and organic light emitting transistors (OLETs), complementary metal oxide semiconductors (CMOSs), complementary inverters, diodes, capacitors, sensors, D flip-flops, rectifiers, and ring oscillators, that make use of the compounds disclosed herein are within the scope of the present teachings as are methods of making the same. The present compounds can offer processing and operation advantages in the fabrication and/or the use of these devices.

For example, articles of manufacture such as the various devices described herein can be an electronic or optoelectronic device including a first electrode, a second electrode, and a semiconducting component in contact with the first electrode and the electrode, where the semiconducting component includes a compound of the present teachings. These devices can include a composite having a semiconducting component (or semiconductor material) of the present teachings and a substrate component and/or a dielectric component. The substrate component can be selected from doped silicon, an indium tin oxide (ITO), ITO-coated glass, ITO-coated polyimide or other plastics, aluminum or other metals alone or coated on a polymer or other substrate, a doped polythiophene, and the like. The dielectric component can be prepared from inorganic dielectric materials such as various oxides (e.g., $SiO_2$, $Al_2O_3$, $HfO_2$), organic dielectric materials such as various polymeric materials (e.g., polycarbonate, polyester, polystyrene, polyhaloethylene, polyacrylate), and self-assembled superlattice/self-assembled nanodielectric (SAS/SAND) materials (e.g., as described in Yoon, M-H. et al., PNAS, 102 (13): 4678-4682 (2005), the entire disclosure of which is incorporated by reference herein), as well as hybrid organic/inorganic dielectric materials (e.g., described in U.S. patent application Ser. No. 11/642,504, the entire disclosure of which is incorporated by reference herein). In some embodiments, the dielectric component can include the crosslinked polymer blends described in U.S. patent application Ser. Nos. 11/315,076, 60/816,952, and 60/861,308, the entire disclosure of each of which is incorporated by reference herein. The composite also can include one or more electrical contacts. Suitable materials for the source, drain, and gate electrodes include metals (e.g., Au, Al, Ni, Cu), transparent conducting oxides (e.g., ITO, IZO, ZITO, GZO, GIO, GITO), and conducting polymers (e.g., poly(3,4-ethylenedioxythiophene) poly(styrenesulfonate) (PEDOT:PSS), polyaniline (PANI), polypyrrole (PPy)). One or more of the composites described herein can be embodied within various organic electronic, optical, and optoelectronic devices such as organic thin film transistors (OTFTs), specifically, organic field effect transistors (OFETs), as well as sensors, capacitors, unipolar circuits, complementary circuits (e.g., inverter circuits), and the like.

Accordingly, an aspect of the present teachings relates to methods of fabricating an organic field effect transistor that incorporates a semiconductor material of the present teachings. The semiconductor materials of the present teachings can be used to fabricate various types of organic field effect transistors including top-gate top-contact capacitor structures, top-gate bottom-contact capacitor structures, bottom-gate top-contact capacitor structures, and bottom-gate bottom-contact capacitor structures.

FIG. 1 illustrates the four common types of OFET structures: (a) bottom-gate top-contact structure, (b) bottom-gate bottom-contact structure, (c) top-gate bottom-contact structure, and (d) top-gate top-contact structure. As shown in FIG. 1, an OFET can include a gate dielectric component (e.g., shown as 8, 8', 8", and 8'''), a semiconducting component or semiconductor layer (e.g., shown as 6, 6', 6", and 6'''), a gate electrode or contact (e.g., shown as 10, 10', 10", and 10'''), a substrate (e.g., shown as 12, 12', 12", and 12'''), and source and drain electrodes or contacts (e.g., shown as 2, 2', 2", 2''', 4, 4', 4", and 4'''). As shown, in each of the configurations, the semiconducting component is in contact with the source and drain electrodes and the gate dielectric component.

In certain embodiments, OTFT devices can be fabricated with the present compounds on doped silicon substrates, using $SiO_2$ as the dielectric, in top-contact geometries. In particular embodiments, the active semiconductor layer which incorporates at least a compound of the present teachings can be deposited at room temperature or at an elevated temperature. In other embodiments, the active semiconductor layer which incorporates at least one compound of the present teachings can be applied by spin-coating or printing as described herein. For top-contact devices, metallic contacts can be patterned on top of the films using shadow masks.

In certain embodiments, OTFT devices can be fabricated with the present compounds on plastic foils, using polymers as the dielectric, in top-gate bottom-contact geometries. In particular embodiments, the active semiconducting layer which incorporates at least a compound of the present teachings can be deposited at room temperature or at an elevated temperature. In other embodiments, the active semiconducting layer which incorporates at least a compound of the present teachings can be applied by spin-coating or printing as described herein. Gate and source/drain contacts can be made of Au, other metals, or conducting polymers and deposited by vapor-deposition and/or printing.

In various embodiments, a semiconducting component incorporating compounds of the present teachings can exhibit semiconducting activity, for example, a carrier mobility of $10^{-4}$ $cm^2$/V-sec or greater and/or a current on/off ratio ($I_{on}/I_{off}$) of $10^3$ or greater.

Other articles of manufacture in which compounds of the present teachings are useful are photovoltaics or solar cells. Compounds of the present teachings can exhibit broad optical absorption and/or a tuned redox properties and bulk carrier mobilities, making them desirable for such applications. Accordingly, the compounds described herein can be used as a donor (p-type) semiconductor material in a photovoltaic design, which includes an adjacent n-type semiconductor material that forms a p-n junction. The compounds can be in the form of a thin film semiconductor, which can be deposited on a substrate to form a composite. Exploitation of compounds of the present teachings in such devices is within the knowledge of a skilled artisan.

In various embodiments, a semiconducting component incorporating compounds of the present teachings can enable photovoltaic cells with power conversion efficiency of about 1% or greater.

Figure 2:
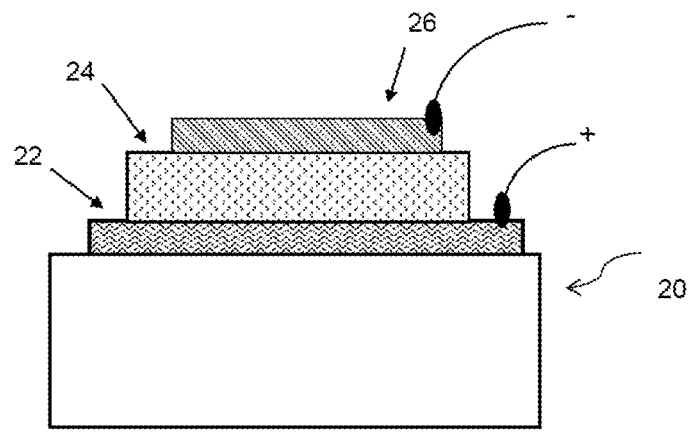
FIG. 2 illustrates a representative structure of a bulk-heterojunction organic photovoltaic device (also known as solar cell) which can incorporate one or more compounds of the present teachings as the donor and/or acceptor materials.
Figure 3:
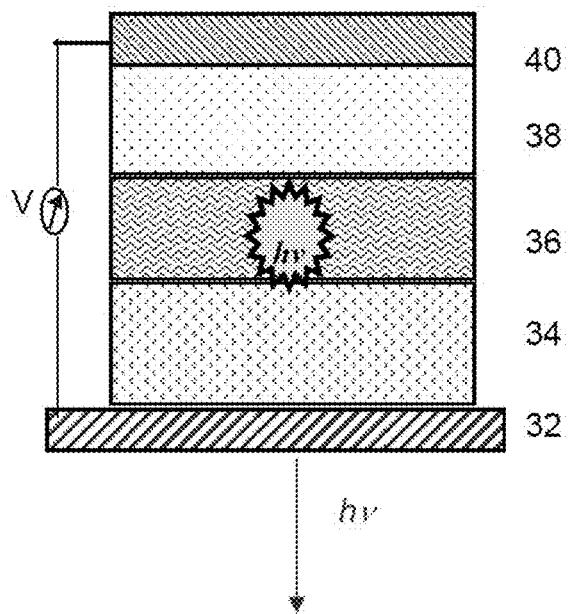
FIG. 3 illustrates a representative structure of an organic light-emitting device which can incorporate one or more compounds of the present teachings as electron-transporting and/or emissive and/or hole-transporting materials.

Accordingly, another aspect of the present teachings relates to methods of fabricating an organic light-emitting transistor, an organic light-emitting diode (OLED), or an organic photovoltaic device that incorporates one or more semiconductor materials of the present teachings. FIG. 2 illustrates a representative structure of a bulk-heterojunction organic photovoltaic device (also known as solar cell) which can incorporate one or more compounds of the present teachings as the donor and/or acceptor materials. As shown, a representative solar cell generally includes a substrate 20 (e.g., glass), an anode 22 (e.g., ITO), a cathode 26 (e.g., aluminium or calcium), and a photoactive layer 24 between the anode and the cathode which can incorporate one or more compounds of the present teachings as the electron donor (p-channel) and/or electron acceptor (n-channel) materials. FIG. 3 illustrates a representative structure of an OLED which can incorporate one or more compounds of the present teachings as electron-transporting and/or emissive and/or hole-transporting materials. As shown, an OLED generally includes a substrate 30 (not shown), a transparent anode 32 (e.g., ITO), a cathode 40 (e.g., metal), and one or more organic layers which can incorporate one or more compounds of the present teachings as hole-transporting (n-channel) (layer 34 as shown) and/or emissive (layer 36 as shown) and/or electron-transporting (p-channel) materials (layer 38 as shown). In embodiments where the present compounds only have one or two of the properties of hole transport, electron transport, and emission, the present compounds can be blended with one or more further organic compounds having the remaining required property or properties.

The following examples are provided to illustrate further and to facilitate the understanding of the present teachings and are not in any way intended to limit the invention.

Synthetic Procedures

The following examples describe the preparation of certain compounds of the present teachings and related intermediates.

All reagents were purchased from commercial sources and used without further purification unless otherwise noted. Specifically, dioxane, dichlorobenzene (DCB), chloroform ($CHCl_3$), and other chlorinated hydrocarbons (CHCs) used for dielectric and semiconductor formulations were purchased from Sigma Aldrich and distilled before use. Anhydrous tetrahydrofuran (THF) was distilled from Na/benzophenone. Conventional Schlenk techniques were used and reactions were carried out under nitrogen ($N_2$) unless otherwise noted.

Characterization data are provided in some cases by $^1$H-NMR, $^{13}$C-NMR, and/or elemental analysis. NMR spectra were recorded on an Inova 500 NMR spectrometer ($^1$H, 500 MHz). Elemental analyses were performed by Midwest Microlab, LLC. Polymer molecular weights were determined on a Waters GPC system (Waters Pump 510) in $CHCl_3$ at 30° C. versus polystyrene standards.

EXAMPLE 1

Synthesis of Intermediates

EXAMPLE 1A

Preparation of ethyl 2-thiopheneacetylaminoacetate

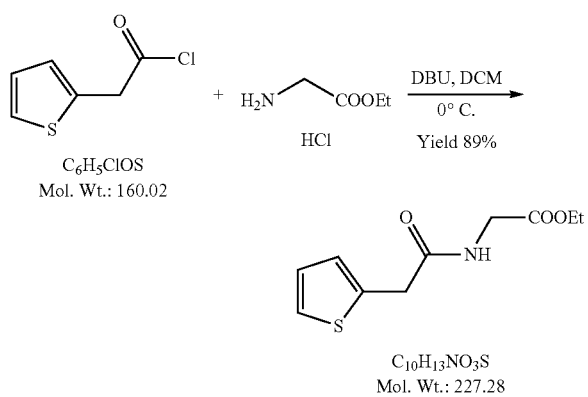

To a suspension of glycine ethyl ester hydrochloride (21.77 g, 156 mmol) in anhydrous dichloromethane (260 mL), 1,8-diazabicyclo[5.4.0]undec-7-ene (55 mL, 368 mmol) was added under nitrogen, which addition turned the suspension clear. Then 2-thiopheneacetyl chloride (19.2 mL, 156 mmol) was added dropwise. After completion of the addition, the flask was warmed to room temperature and the mixture was stirred for 1 hour. Then it was washed with water (260 mL×3), dried and concentrated. A dark brown oil was obtained (31.77 g, yield 89%), which turned into a dark brown solid upon standing. $^1$H NMR ($CDCl_3$, 500 MHz), δ=7.26 (dd, J=5.0, 1.0 Hz, 1H), 7.01-6.97 (m, 2H), 6.19 (s, 1H), 4.18 (q, J=7.0 Hz, 2H), 4.00 (d, J=5.0 Hz, 2H), 3.83 (s, 2H), 1.26 (t, J=7.0 Hz, 3H).

EXAMPLE 1B

Preparation of 3-thiophen-2-yl-pyrrolidine-2,4-dione

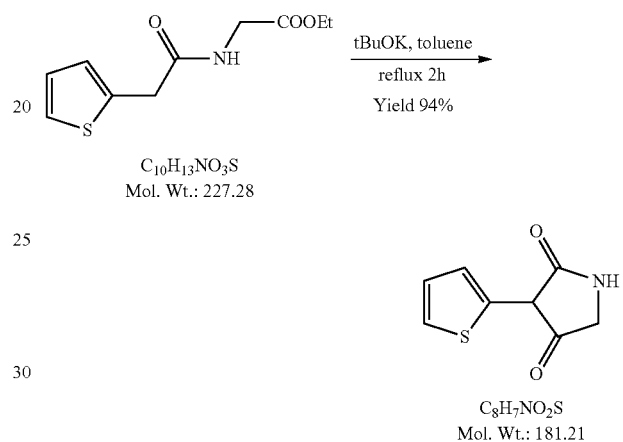

To a solution of ethyl 2-thiopheneacetylaminoacetate (31.77 g, 140 mmol) in anhydrous toluene (190 mL) was added potassium tert-butoxide (20.95 g, 187 mmol). The mixture was heated to reflux for 2 hours. After cooling, it was poured into water (190 mL) and the water phase was isolated and acidified with dilute HCl to about pH 1 (~70 mL 10% HCl). The pale brown precipitate was filtered, washed with water and dried. Finally, a pale brown solid with some dark brown chunks was obtained (23.8 g, yield 94%). $^1$H NMR ($d_6$-DMSO, 500 MHz), δ=7.55 (dd, J=3.5, 1.0 Hz, 1H), 7.48 (s, 1H), 7.30 (dd, J=5.0 1.0 Hz, 1H), 7.01 (dd, J=5.0, 4.0 Hz, 1H), 3.88 (s, 2H).

EXAMPLE 1C

Preparation of 4-amino-3-thiophen-2-yl-1,5-dihydropyrrol-2-one

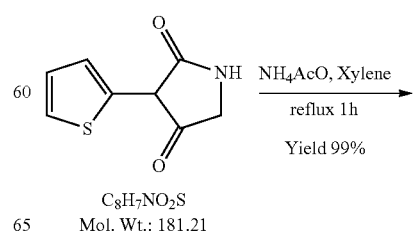

-continued

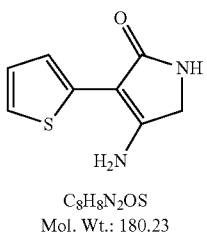

C₈H₈N₂OS
Mol. Wt.: 180.23

To a round bottom flask with a Dean-Stark distilling receiver, ammonium acetate (20.90 g, 271 mmol) and xylene (215 mL) were charged and kept at 60° C. Then 3-thiophen-2-yl-pyrrolidine-2,4-dione (19.0 g, 105 mmol) was added portionwise. The mixture was heated to reflux until there was no more water collected by the receiver (about 15 mL water) and a sticky gel was formed at the bottom. After cooling, toluene was decanted and the sticky gel was further washed by toluene and water and dried under vacuum at 80° C. Finally, a sticky gel was obtained (18.3 g, yield 99%), which can be used directly for the preparation of various compounds having one or more pyrrolo[3,2-b]pyrrole-2,5(1H,4H)-dione-3,6-diyl units. ¹H NMR (d₆-DMSO, 500 MHz), δ=7.23 (s, 1H), 7.22 (s, 1H), 7.10 (s, 1H), 7.00 (dd, J=5.0, 4.0 Hz, 1H), 6.77 (s, 2H), 3.82 (s, 2H).

EXAMPLE 1D

Preparation of ethyl thiophene-2-glyoxylate

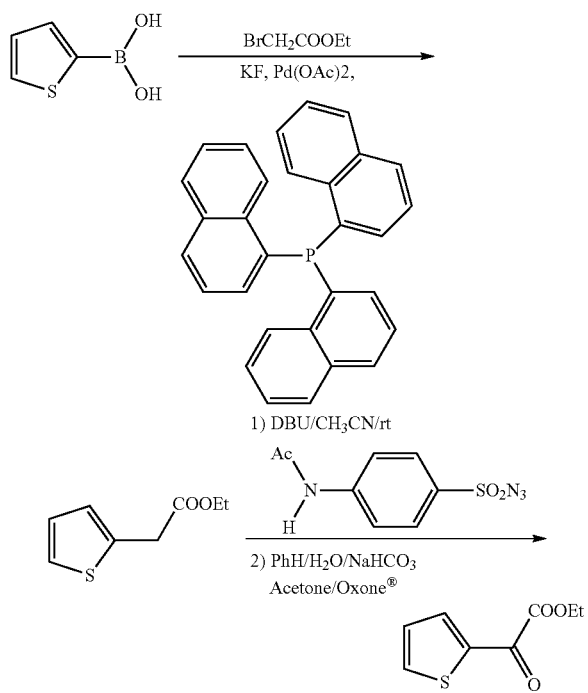

Various functionalized (hetero)arylacetic acid derivatives can be synthesized under mild conditions via a palladium(0)-catalyzed cross-coupling reaction between the corresponding (hetero)arylboronic acids or esters and α-bromoacetic acid derivatives as illustrated in the scheme above with thiophene as the (hetero)aryl group. See e.g., Gooβen, "Pd-catalyzed synthesis of arylacetic acid derivatives from boronic acids," *Chem. Commun.*, 7: 669 (2001). Many (hetero)aryl boronic acids or esters are commercially available or can be easily prepared from the corresponding (hetero)aryl halide or aromatic hydrocarbons. For example, (hetero)aryl boronic acids can be synthesized either directly from the parent aromatic cores or from the selectively mono-brominated cores by lithiation and then borylation. The (hetero)arylacetic acid derivatives subsequently can be efficiently oxidized to (hetero)aryl α-keto esters. See e.g., Wang et al., "An efficient synthesis of aryl α-keto esters," *Tetrahedron Lett.*, 46: 3927 (2005).

EXAMPLE 2

Monomer Synthesis

EXAMPLE 2A

Preparation of 3,6-di-thiophen-2-yl-1,4-dihydropyrrolo[3,2-b]pyrrole-2,5-dione

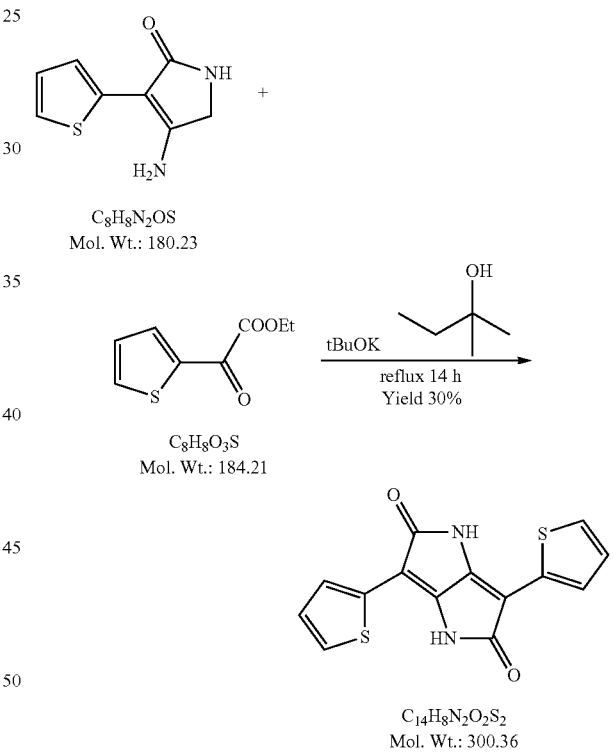

To a round bottom flask with the sticky gel product obtained from Example 1C, amyl alcohol (254 mL) and t-BuOK (11.4 g, 102 mmol) were added and the mixture was heated to reflux until the viscosity of the mixture lowered to allow stirring (~10 min). A solution of ethyl thiophene-2-glyoxylate (15 mL, 102 mmol, Example 1D) in amyl alcohol (15 mL) was added dropwise in 3 hours and the reaction mixture was heated to reflux for 14 more hours. After cooling, the reaction mixture was diluted with MeOH (305 mL), neutralized with HOAc (7 mL), filtered, and washed with MeOH (250 mL×2) and water (250 mL). The solid was dried under vacuum at 80° C. for 2 days. Finally, a mixture of 3,6-di-thiophen-2-yl-1,4-dihydropyrrolo[3,2-b]pyrrole-2,5-dione and 4-amino-3-thiophen-2-yl-1,5-dihydropyrrol-2-one with the molar ratio of about 1:1 was obtained (17.66 g). $^1$H NMR (d$_6$-DMSO, 500 MHz), δ=11.12 (s, 2H), 7.65 (d, J=5.0 Hz, 2H), 7.62 (d, J=4.0 Hz, 2H), 7.18 (dd, J=5.0, 4.0 Hz, 2H).

EXAMPLE 2B

Preparation of 1,4-bis-(2-butyloctyl)-3,6-di-thiophen-2-yl-1,4-dihydropyrrolo[3,2-b]pyrrole-2,5-dione

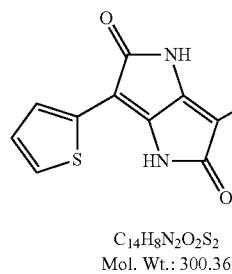

C$_{14}$H$_8$N$_2$O$_2$S$_2$
Mol. Wt.: 300.36

+

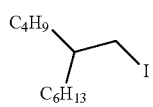

Cs$_2$CO$_3$, DMF
60° C., 24 h
Yield 60%

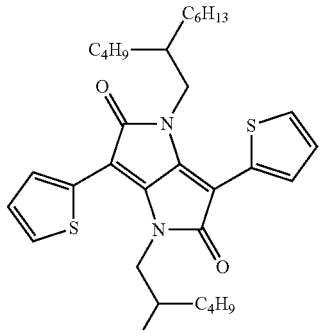

C$_{38}$H$_{56}$N$_2$O$_2$S$_2$
Mol. Wt.: 636.99

To a round bottom flask under nitrogen, 3,6-di-thiophen-2-yl-1,4-dihydropyrrolo[3,2-b]pyrrole-2,5-dione (Example 2A, 1.8 g, 6 mmol), Cs$_2$CO$_3$ (4.89 g, mmol) and anhydrous DMF (60 mL) were added and stirred at 60° C. 2-Butyloctyl iodide (3.0 mL, 12 mmol) was added in one portion and the reaction mixture was kept at 60° C. for 24 hours. After removing the solvent, chloroform (30 mL) was added and the mixture was stirred for 10 minutes before it was filtered through coarse Celite® diatomaceous earth particles. After concentration, the crude was purified by a short column with a 3:1 mixture of chloroform:hexane as the eluent to give an orange solid (500 mg, yield 13%). $^1$H NMR (CDCl$_3$, 500 MHz), δ=7.62 (d, J=5.0 Hz, 2H), 7.30 (d, J=3.5 Hz, 2H), 7.13 (dd, J=5.0, 3.5 Hz, 2H), 3.74 (d, J=7.5 Hz, 4H), 1.40-1.00 (m, 38H), 0.87 (t, J=7.5 Hz, 6H), 0.83 (t, J=7.0 Hz, 6H).

EXAMPLE 2C

Preparation of 3,6-bis-(5-bromo-thiophen-2-yl)-1,4-bis-(2-butyloctyl)-1,4-dihydropyrrolo[3,2-b]pyrrole-2,5-dione C$_{38}$H$_{56}$N$_2$O$_2$S$_2$
Mol. Wt.: 636.99

NBS, CHCl$_3$
rt, 24 h
Yield 88%

C$_{38}$H$_{54}$Br$_2$N$_2$O$_2$S$_2$
Mol. Wt.: 794.79

To a round bottom flask in the dark, 1,4-bis-(2-butyloctyl)-3,6-di-thiophen-2-yl-1,4-dihydropyrrolo[3,2-b]pyrrole-2,5-dione (520 mg, 0.82 mmol), CHCl$_3$ (15 mL) and NBS (526 mg, 2.96 mmol) were added. The mixture was stirred at room temperature for 24 hours and concentrated to be purified by column chromatograph with a 2:1 mixture of CHCl$_3$:hexane as the eluent to give an orange solid (473 mg, yield 73%). $^1$H NMR (CDCl$_3$, 500 MHz), δ=7.06 (d, J=4.0 Hz, 2H), 7.00 (d, J=4.0 Hz, 2H), 3.67 (d, J=7.5 Hz, 4H), 1.39-1.32 (m, 2H), 1.30-1.02 (m, 36H), 0.86 (t, J=7.5 Hz, 6H), 0.82 (t, J=7.0 Hz, 6H).

EXAMPLE 2D

Alternative preparation of 3,6-di-thiophen-2-yl-1,4-dihydropyrrolo[3,2-b]pyrrole-2,5-dione

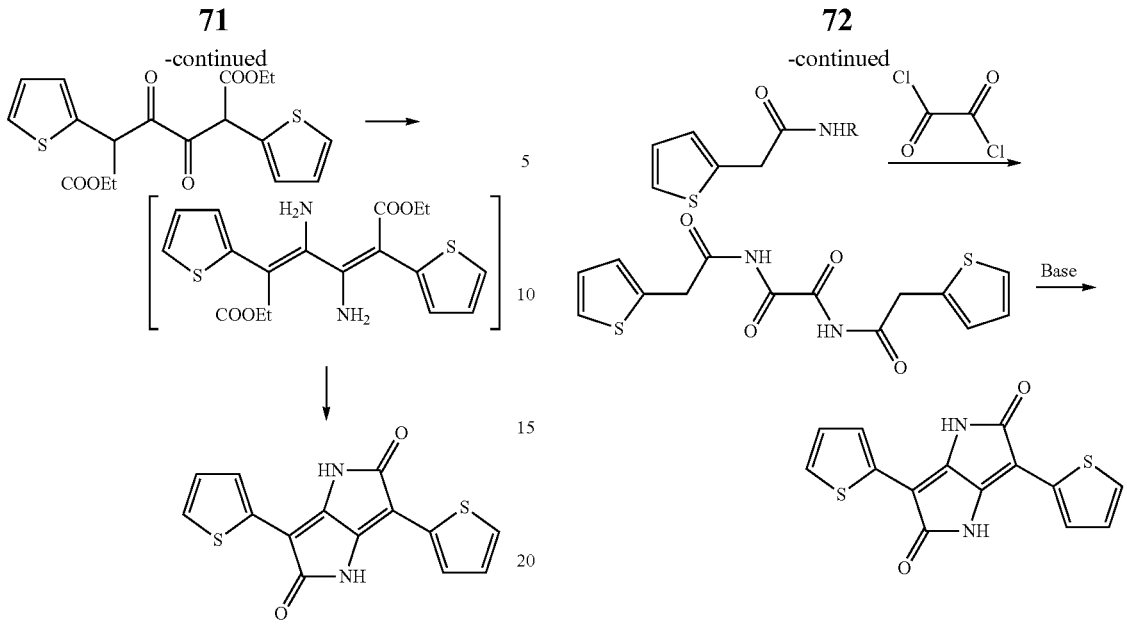

The scheme above illustrates an alternative synthesis of 3,6-di-thiophen-2-yl-1,4-dihydropyrrolo[3,2-b]pyrrole-2,5-dione starting from (hetero)arylacetic acid derivatives and diethyl oxalate according to procedures analogous to those described in International Publication No. WO 2010049321.

EXAMPLE 2E

Alternative preparation of 3,6-di-thiophen-2-yl-1,4-dihydropyrrolo[3,2-b]pyrrole-2,5-dione

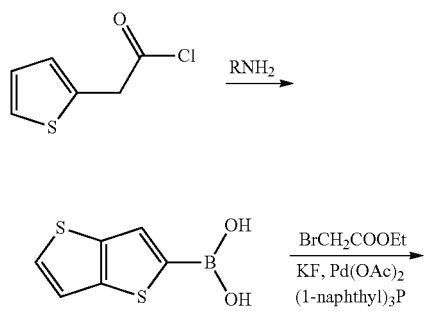

The scheme above illustrates yet an alternative synthesis of 3,6-di-thiophen-2-yl-1,4-dihydropyrrolo[3,2-b]pyrrole-2,5-dione via a base-catalyzed cyclization reaction of $N^1,N^2$-bis ((hetero)arylacetyl)oxalamide starting from an appropriate (hetero)arylacetyl chloride.

EXAMPLE 2F

Preparation of additional 3,6-di-(hetero)aryl-1,4-dihydropyrrolo[3,2-b]pyrrole-2,5-diones Starting from the suitable (hetero)arylacetic acid derivatives and (hetero)aryl α-keto esters, additional 3,6-di-(hetero)aryl-1,4-dihydropyrrolo[3,2-b]pyrrole-2,5-diones can be synthesized, which then can be used to prepare polymers according to the present teachings. For example, as illustrated in the scheme below, the (hetero)aryl group can be a bicyclic (hetero)aryl group (e.g., $Ar^1$=a thieno[3,2-b]thiophen-2-yl group as shown).

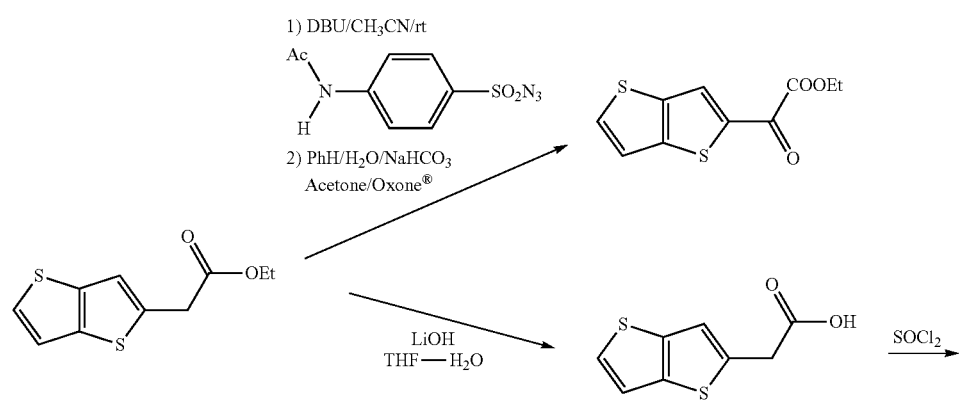

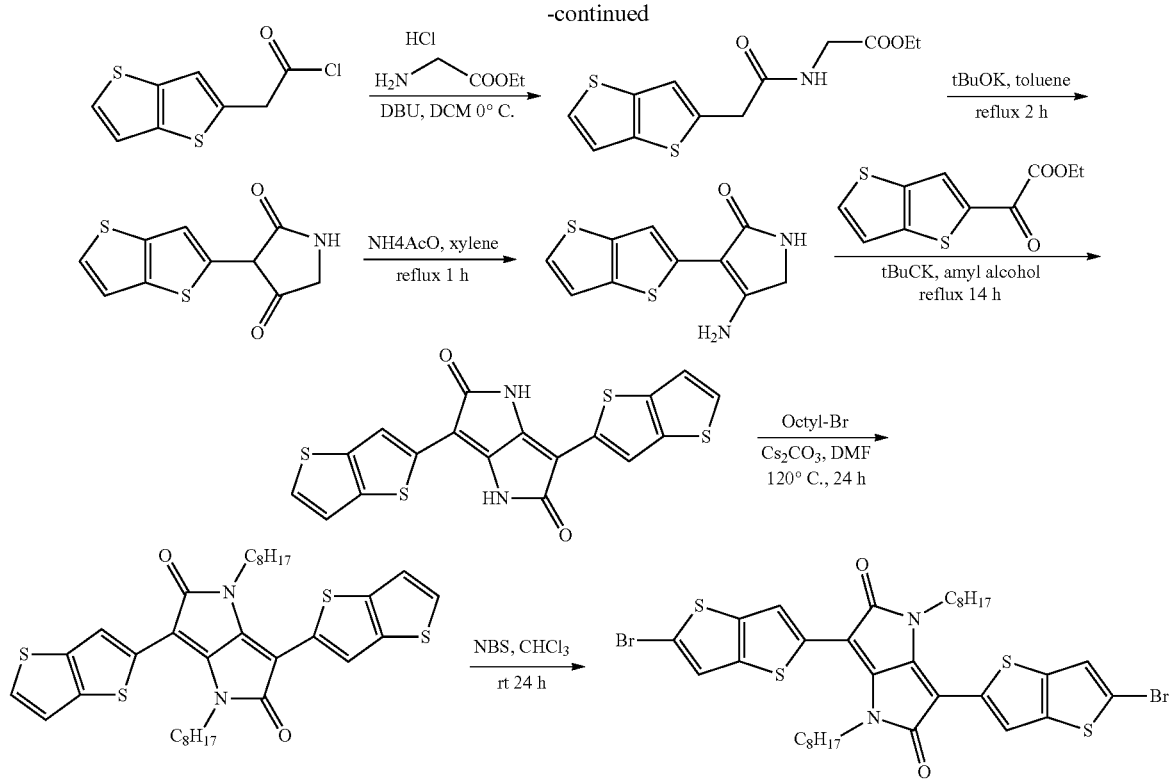

EXAMPLE 2G

Preparation of additional 3,6-di-(hetero)aryl-1,4-dihydropyrrolo[3,2-b]pyrrole-2,5-diones Starting from the suitable (hetero)arylacetic acid derivatives and (hetero)aryl α-keto esters, additional 3,6-di-(hetero)aryl-1,4-dihydropyrrolo[3,2-b]pyrrole-2,5-diones can be synthesized, which then can be used to prepare polymers according to the present teachings. For example, as illustrated in the scheme below, the (hetero)aryl group can be a tricyclic (hetero)aryl group (e.g., Ar$^1$=a benzodithiophene-2,6-yl group as shown).

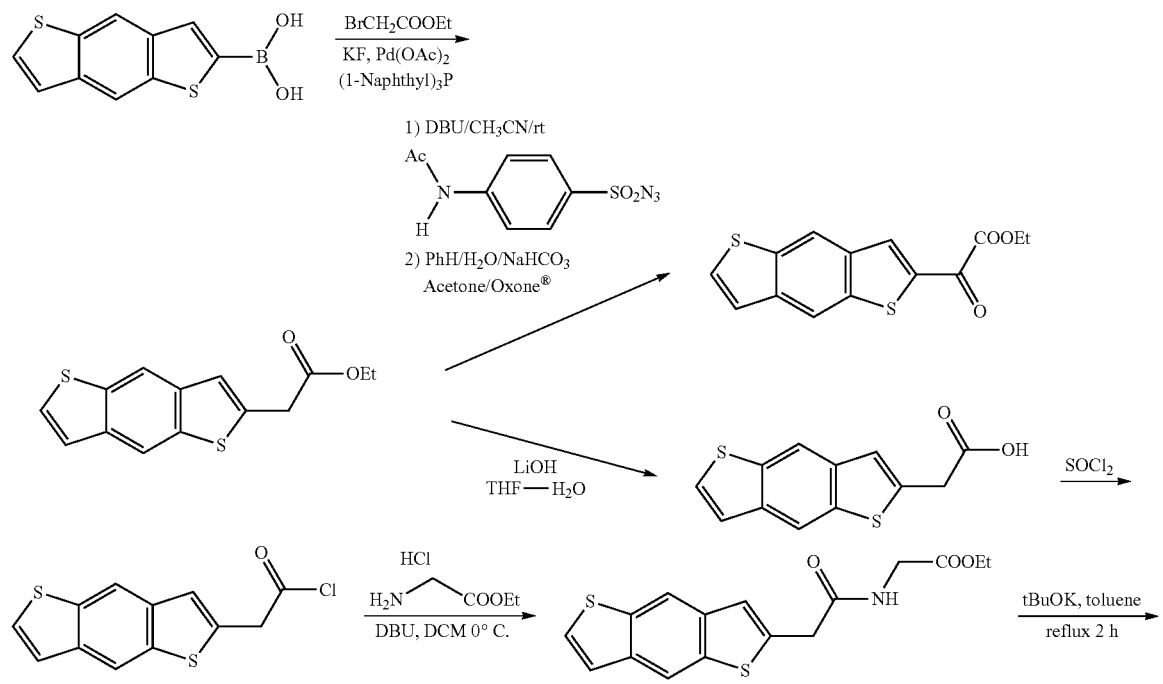

-continued
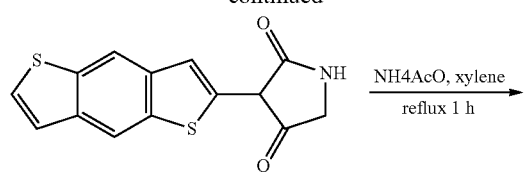
NH4AcO, xylene
reflux 1 h
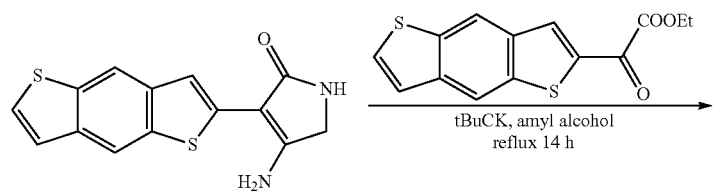
tBuCK, amyl alcohol
reflux 14 h
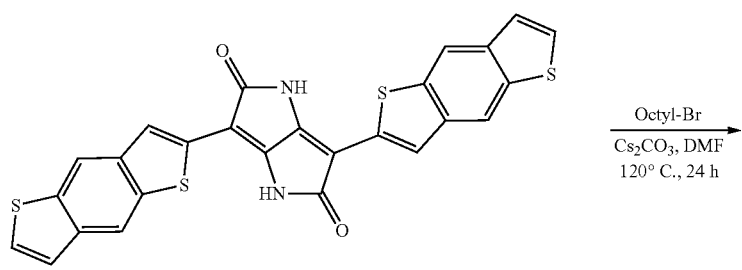
Octyl-Br
Cs₂CO₃, DMF
120° C., 24 h
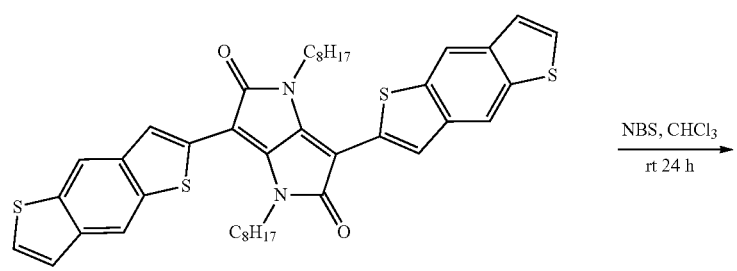
NBS, CHCl₃
rt 24 h
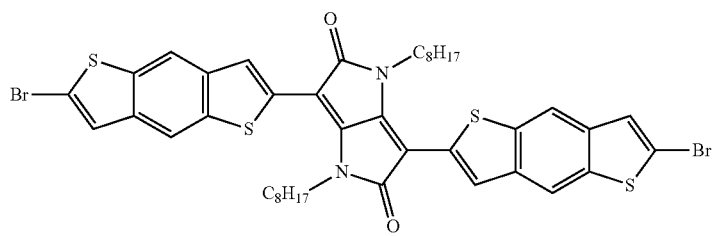

EXAMPLE 3

Polymer Synthesis

EXAMPLE 3A

Preparation of poly[{2,6-(4,8-didodecylbenzo[1,2-b:4,5-b']dithiophene)}-alt-{5,5-(1,4-bis(2-butyloctyl)-3,6-dithiophen-2-yl-1,4-dihydropyrrolo[3,2-b]pyrrole-2,5-dione)}] (SL35)

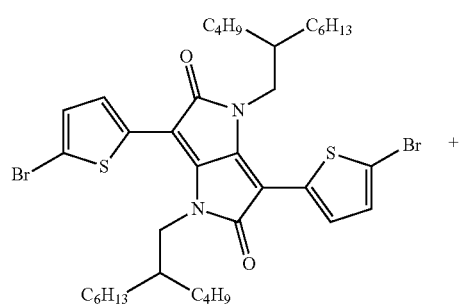

To a 10 mL microwave tube, 2,6-bis(trimethylstannyl)-4,8-didodecylbenzo[1,2-b:4,5-b']dithiophene (51.2 mg, 60 μmol), 3,6-bis-(5-bromo-thiophen-2-yl)-1,4-bis-(2-butyloctyl)-1,4-dihydropyrrolo[3,2-b]pyrrole-2,5-dione (47.7 mg, 60 μmol), $Pd_2(dba)_3$ (2.7 mg, 5 mol %) and tri(o-tolyl)phosphine (3.7 mg, 20 mol %) were mixed in anhydrous toluene (5 mL) under argon. Then the tube was heated to 180° C. in 30 minutes and kept at this temperature for 270 minutes by a CEM Discover Microwave reactor. After cooling, it was poured into MeOH (50 mL), filtered and dried in a vacuum oven to give a dark brown solid (68.4 mg). Using a Soxhlet setup, the crude product was extracted successively, with MeOH, hexane, ethyl acetate, THF and chloroform. The chloroform extract was poured into MeOH (100 mL) and the solid was collected. Finally, a dark brown solid (62.1 mg, yield 89%, Mn=792 kDa, d=2.7) was obtained. Elemental Analysis: Calcd. C, 74.56; H, 9.21; N, 2.42. Found: C, 74.42; H, 9.18; N, 2.55.

EXAMPLE 3B

Preparation of poly[{2,6-(4-octyl-4H-dithieno[3,2-b;2',3'-d]pyrrole)}-alt-{2,6-(1,4-bis(2-butyloctyl)-3,6-dithiophen-2-yl-1,4-dihydropyrrolo[3,2-b]pyrrole-2,5-dione)}] (SL36)

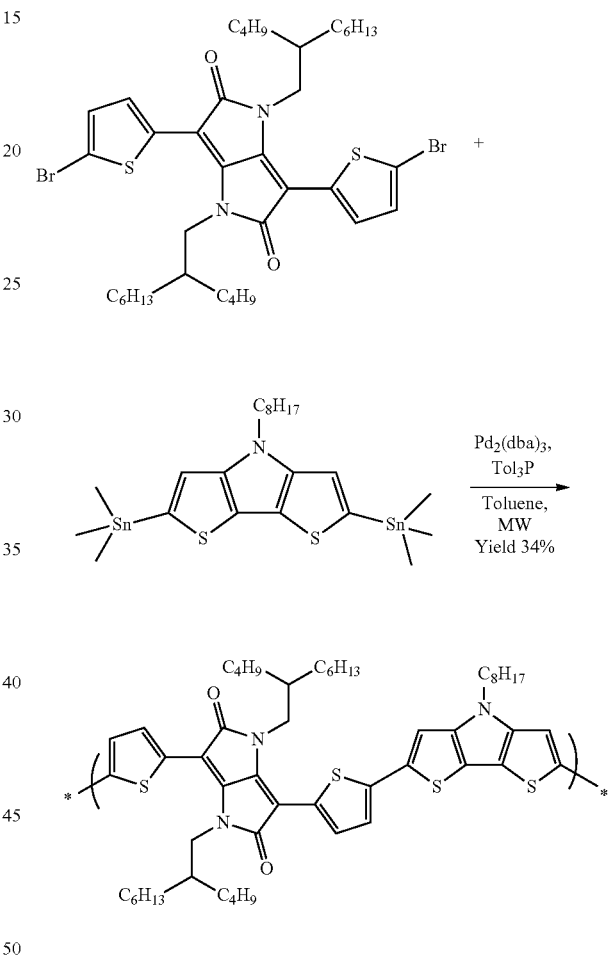

To a 10 mL microwave tube, 4-octyl-2,6-bis(trimethylstannyl)-4H-dithieno[3,2-b;2',3'-d]pyrrole (37.0 mg, 60 μmol), 3,6-bis-(5-bromo-thiophen-2-yl)-1,4-bis-(2-butyloctyl)-1,4-dihydropyrrolo[3,2-b]pyrrole-2,5-dione (47.7 mg, 60 μmol), $Pd_2(dba)_3$ (2.7 mg, 5 mol %) and tri(o-tolyl)phosphine (3.7 mg, 20 mol %) were mixed in anhydrous toluene (5 mL) under argon. Then the tube was heated to 180° C. in 30 minutes and kept at this temperature for 270 minutes by a CEM Discover Microwave reactor. After cooling, it was poured into MeOH (50 mL), filtered and dried in a vacuum oven to give a dark brown solid. Using a Soxhlet setup, the crude product was extracted successively with MeOH, hexane, ethyl acetate and THF. The THF extract was poured into MeOH (100 mL) and the solid was collected. Finally, a dark brown solid (31.2 mg, yield 34%, Mn=22 kDa, d=7.0) was obtained. Elemental Analysis: Calcd. C, 70.16; H, 7.96; N, 4.55. Found: C, 70.36; H, 7.95; N, 4.50.

EXAMPLE 3C

Preparation of poly[{2,6-(4,8-bis(2-ethylhexyl)benzo[1,2-b:4,5-b']dithiophene)}-alt-{5,5-(1,4-bis(2-butyloctyl)-3,6-dithiophen-2-yl-1,4-dihydropyrrolo[3,2-b]pyrrole-2,5-dione)}] (SL37)

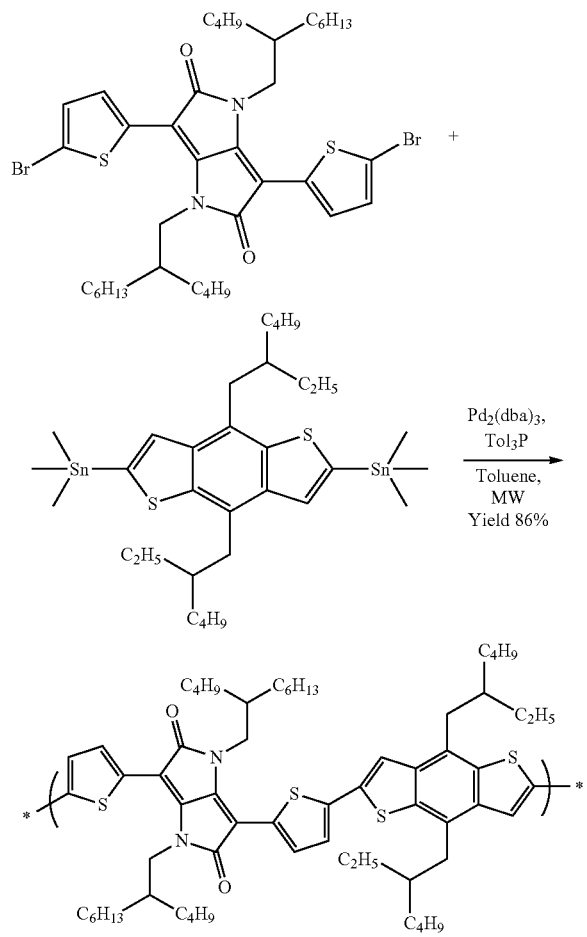

To a 10 mL microwave tube, 2,6-bis(trimethylstannyl)-4,8-bis(2-ethylhexyl)[1,2-b:4,5-b']dithiophene (44.4 mg, 60 μmol), 3,6-bis-(5-bromo-thiophen-2-yl)-1,4-bis-(2-butyloctyl)-1,4-dihydropyrrolo[3,2-b]pyrrole-2,5-dione (47.7 mg, 60 μmol), Pd$_2$(dba)$_3$ (2.7 mg, 5 mol %) and tri(o-tolyl)phosphine (3.7 mg, 20 mol %) were mixed in anhydrous toluene (5 mL) under argon. Then the tube was heated to 180° C. in 30 minutes and kept at this temperature for 270 minutes by a CEM Discover Microwave reactor. After cooling, it was poured into MeOH (50 mL), filtered and dried in a vacuum oven to give a dark brown solid (61.0 mg). Using a Soxhlet setup, the crude product was extracted successively with MeOH, hexane, ethyl acetate, THF and chloroform. The chloroform extract was poured into MeOH (100 mL) and the solid was collected. Finally, a dark brown solid (54.0 mg, yield 86%, Mn=26 kDa, d=27) was obtained. Elemental Analysis: Calcd. C, 73.37; H, 8.66; N, 2.67. Found: C, 73.06; H, 8.50; N, 2.80.

EXAMPLE 3D

Preparation of poly[{5,5'-(3,3'-didodecyloxy-2,2'-bithiophene)}-alt-{5,5-(1,4-bis(2-butyloctyl)-3,6-dithiophen-2-yl-1,4-dihydropyrrolo[3,2-b]pyrrole-2,5-dione)}] (SL38)

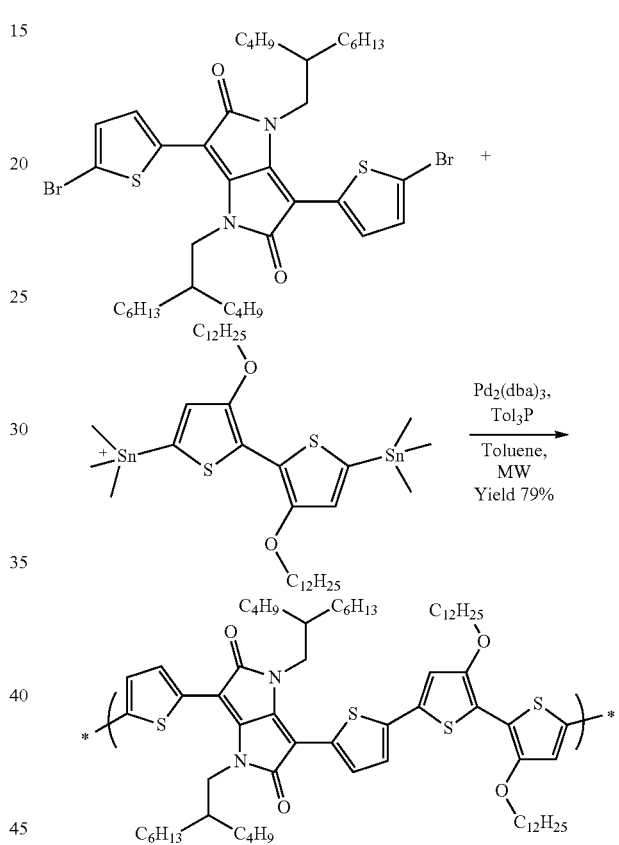

To a 10 mL microwave tube, 5,5'-bis(trimethylstannyl)-3,3'-didodecyloxy-2,2'-bithiophene (51.6 mg, 60 μmol), 3,6-Bis-(5-bromo-thiophen-2-yl)-1,4-bis-(2-butyloctyl)-1,4-dihydropyrrolo[3,2-b]pyrrole-2,5-dione (47.7 mg, 60 μmol), Pd$_2$(dba)$_3$ (2.7 mg, 5 mol %) and tri(o-tolyl)phosphine (3.7 mg, 20 mol %) were mixed in anhydrous toluene (5 mL) under argon. Then the tube was heated to 180° C. in 30 minutes and kept at this temperature for 270 minutes by a CEM Discover Microwave reactor. After cooling, it was poured into MeOH (50 mL), filtered and dried in a vacuum oven to give a dark blue solid (66.1 mg). Using a Soxhlet setup, the crude product was extracted successively with MeOH, hexane, ethyl acetate, and THF. The THF extract was poured into MeOH (100 mL) and the solid was collected. Finally, a dark blue solid (55.5 mg, yield 79%, Mn=153 kDa, d=2.8) was obtained. Elemental Analysis: Calcd. C, 71.99; H, 9.15; N, 2.40.

Found: C, 71.74; H, 9.10; N, 2.54.

EXAMPLE 3E

Preparation of poly[{5,5'-2,2'-bithiophene}]-alt-{5,5-(1,4-bis(2-butyloctyl)-3,6-dithiophen-2-yl-1,4-dihydropyrrolo[3,2-b]pyrrole-2,5-dione)}] (SL39)

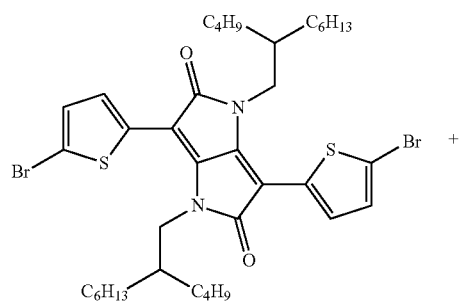

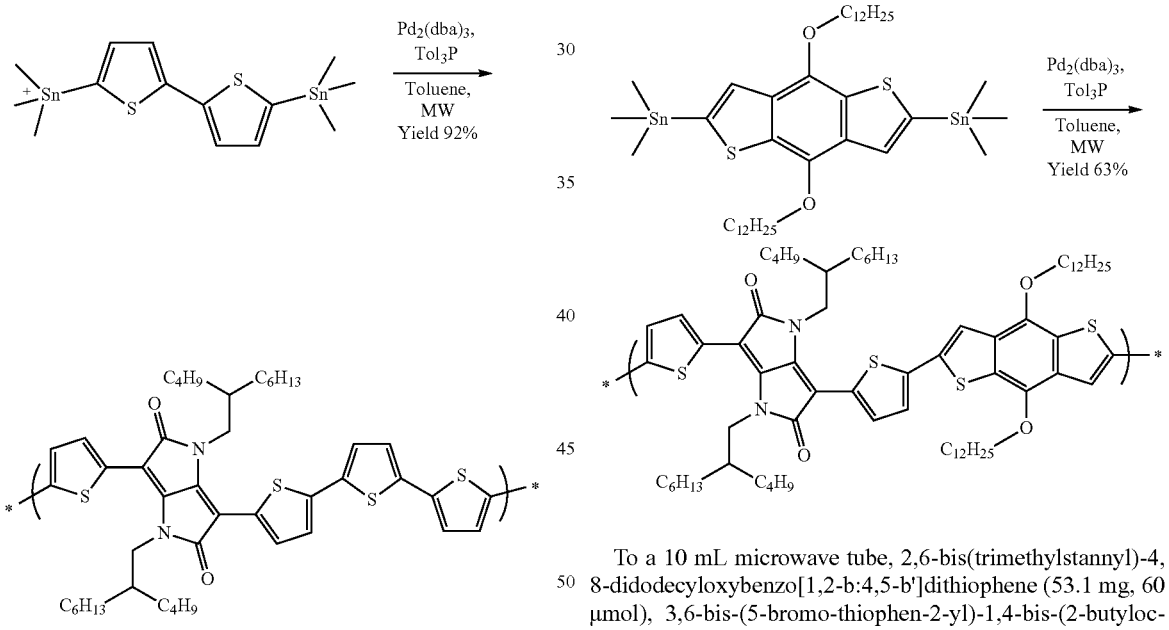

To a 10 mL microwave tube, 5,5'-bis(trimethylstannyl)-2,2'-bithiophene (29.5 mg, 60 μmol), 3,6-bis-(5-bromo-thiophen-2-yl)-1,4-bis-(2-butyloctyl)-1,4-dihydropyrrolo[3,2-b]pyrrole-2,5-dione (47.7 mg, 60 μmol), Pd$_2$(dba)$_3$ (2.7 mg, 5 mol %) and tri(o-tolyl)phosphine (3.7 mg, 20 mol %) were mixed in anhydrous toluene (5 mL) under argon. Then the tube was heated to 180° C. in 30 minutes and kept at this temperature for 270 minutes by a CEM Discover Microwave reactor. After cooling, it was poured into MeOH (50 mL), filtered and dried in a vacuum oven to give a black solid (44.0 mg, yield 92%). The crude has too little solubility for further purification. Elemental Analysis Calcd. C, 69.13; H, 7.31; N, 3.51. Found: C, 69.17; H, 7.22; N, 3.64.

EXAMPLE 3F

Preparation of poly[{2,6-(4,8-didodecylbenzo[1,2-b:4,5-b']dithiophene)}-alt-{5,5-(1,4-bis(2-butyloctyl)-3,6-dithiophen-2-yl-1,4-dihydropyrrolo[3,2-b]pyrrole-2,5-dione)}] (SL40)

To a 10 mL microwave tube, 2,6-bis(trimethylstannyl)-4,8-didodecyloxybenzo[1,2-b:4,5-b']dithiophene (53.1 mg, 60 μmol), 3,6-bis-(5-bromo-thiophen-2-yl)-1,4-bis-(2-butyloctyl)-1,4-dihydropyrrolo[3,2-b]pyrrole-2,5-dione (47.7 mg, 60 μmol), Pd$_2$(dba)$_3$ (2.7 mg, 5 mol %) and tri(o-tolyl)phosphine (3.7 mg, 20 mol %) were mixed in anhydrous toluene (5 mL) under argon. Then the tube was heated to 180° C. in 30 minutes and kept at this temperature for 270 minutes by a CEM Discover Microwave reactor. After cooling, it was poured into MeOH (50 mL), filtered and dried in a vacuum oven to give a dark brown solid. Using a Soxhlet setup, the crude product was extracted successively with MeOH, hexane, ethyl acetate, ether and dichloromethane. The dichloromethane extract was poured into MeOH (100 mL) and the solid was collected. Finally, a dark brown solid (45.0 mg, yield 63%, Mn=49 kDa, d=30) was obtained. Elemental Analysis: Calcd. C, 72.55; H, 8.96; N, 2.35. Found: C, 72.28; H, 8.85; N, 2.48.

EXAMPLE 3G

Preparation of poly[{2,8-(2,5-bis-(3-dodecyl-thiophen-2-yl)-thieno[3,2-b]thiophene)}-alt-{5,5-(1,4-bis(2-butyloctyl)-3,6-dithiophen-2-yl-1,4-dihydropyrrolo[3,2-b]pyrrole-2,5-dione)}] (SL41)

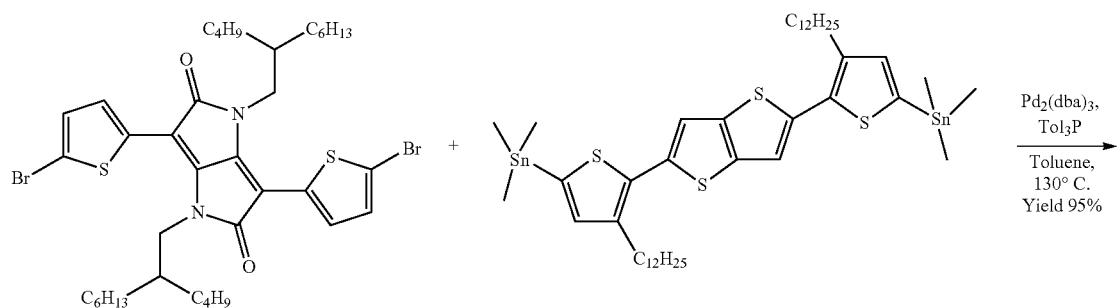

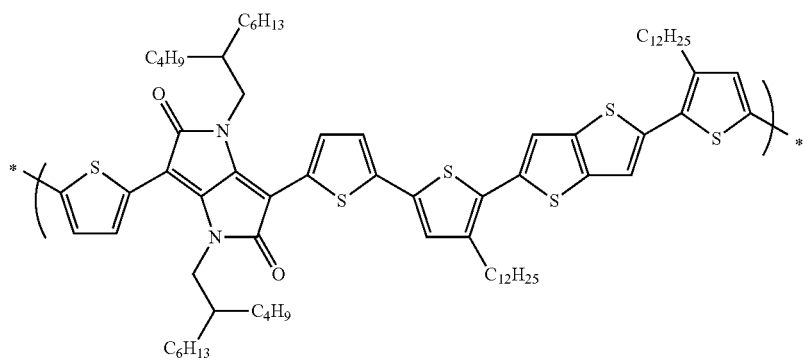

To a 100 mL storage vessel, 2,5-bis-(3-dodecyl-5-trimethylstannanyl-thiophen-2-yl)-thieno[3,2-b]thiophene (58.0 mg, 60 μmol), 3,6-bis-(5-bromo-thiophen-2-yl)-1,4-bis-(2-butyloctyl)-1,4-dihydropyrrolo[3,2-b]pyrrole-2,5-dione (47.7 mg, 60 μmol), $Pd_2(dba)_3$ (2.7 mg, 5 mol %) and tri(o-tolyl)phosphine (3.7 mg, 20 mol %) were mixed in anhydrous toluene (8 mL) under argon. Then the vessel was kept at 130° C. for 44 hours. After cooling, it was poured into MeOH (50 mL), filtered and dried in a vacuum oven to give a black solid (72.7 mg, yield 95%). The crude product has too little solubility for further purification. Elemental Analysis: Calcd. C, 71.65; H, 8.54; N, 2.20. Found: C, 71.81; H, 8.31; N, 2.30.

EXAMPLE 3H

Preparation of poly[{5,5'''-(3,3'''-dihexylquaterthiophene)}-alt-{5,5-(1,4-bis(2-butyloctyl)-3,6-dithiophen-2-yl-1,4-dihydropyrrolo[3,2-b]pyrrole-2,5-dione)}] (SL42)

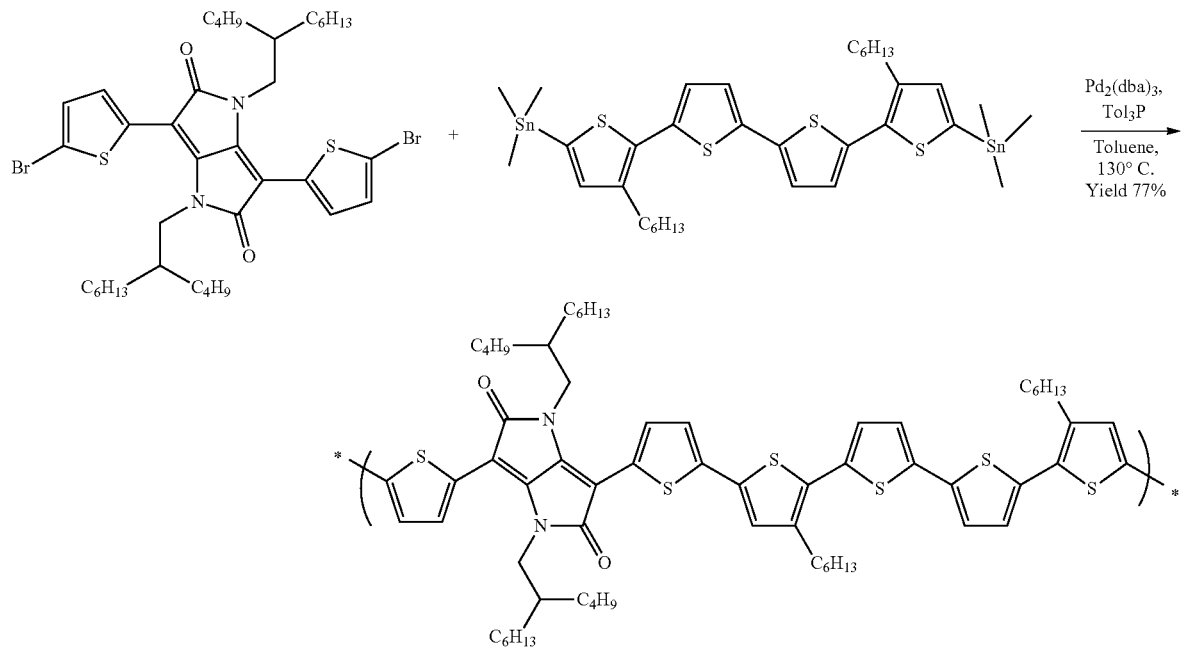

To a 100 mL storage vessel, 5,5'''-bis(trimethylstannyl)-3,3'''-dihexylquaterthiophene (59.6 mg, 60 μmol), 3,6-bis-(5-bromo-thiophen-2-yl)-1,4-bis-(2-butyloctyl)-1,4-dihydropyrrolo[3,2-b]pyrrole-2,5-dione (47.7 mg, 60 μmol), Pd$_2$(dba)$_3$ (2.7 mg, 5 mol %) and tri(o-tolyl)phosphine (3.7 mg, 20 mol %) were mixed in anhydrous toluene (8 mL) under argon. Then the vessel was kept at 130° C. for 44 hours. After cooling, it was poured into MeOH (50 mL), filtered and dried in a vacuum oven to give a black solid. Using a Soxhlet setup, the crude product was extracted successively with MeOH, hexane, AcOEt, THF and CHCl$_3$. The CHCl$_3$ extract was poured into MeOH (100 mL) and the solid was collected. Finally, a black solid was obtained (60.2 mg, yield 77%, Mn=28 kDa, d=34). Elemental Analysis: Calcd. C, 72.06; H, 8.53; N, 2.15. Found: C, 71.52; H, 8.21; N, 2.39.

EXAMPLE 4

Polymer Characterization

EXAMPLE 4A

Optical Properties

Optical absorption measurements of polymers SL35, SL36, SL37, SL38, SL40, and SL42 were carried out using a Cary model spectrophotometer in chloroform solutions. The optical data were used to estimate the bandgaps of the polymers, which are summarized in Table 1 below.

TABLE 1

UV-Vis and CV characterization of polymers

| Polymer | $E_{ox}$ (V)[a] | $E_{red}$ (V)[a] | HOMO (eV) | LUMO (eV) | $\lambda_{max}$ (nm)[b] | $E_g$ (eV)[c] |
|---|---|---|---|---|---|---|
| SL35 | 1.18 | −0.96 | 5.62 | 3.48 | 566 | 1.78 |
| SL36 | 1.20 | −0.99 | 5.64 | 3.45 | 562 | 1.76 |
| SL37 | 1.14 | −1.03 | 5.58 | 3.41 | 553 | 1.77 |
| SL38 | 0.72 | −1.04 | 5.16 | 3.40 | 596 | 1.63 |
| SL39[d] | N/A | N/A | N/A | N/A | N/A | N/A |
| SL40 | 1.15 | −0.96 | 5.59 | 3.48 | 548 | 1.79 |
| SL41[d] | N/A | N/A | N/A | N/A | N/A | N/A |
| SL42 | 1.18 | −0.95 | 5.62 | 3.49 | 502 | 1.96 |

[a]The experiments were performed by casting the polymer films on a glassy-carbon working electrode with a Ag/AgCl wire as the reference electrode, at a scan rate of 50 mVs$^{-1}$. The solvent in all measurements was deoxygenated MeCN, and the supporting electrolyte was 0.1M [nBu$_4$N]BF$_4$.
[b]Chloroform solutions.
[c]Optical bandgaps determined from the onset of absorption.
[d]Insoluble in organic solvents.

Figure 4:
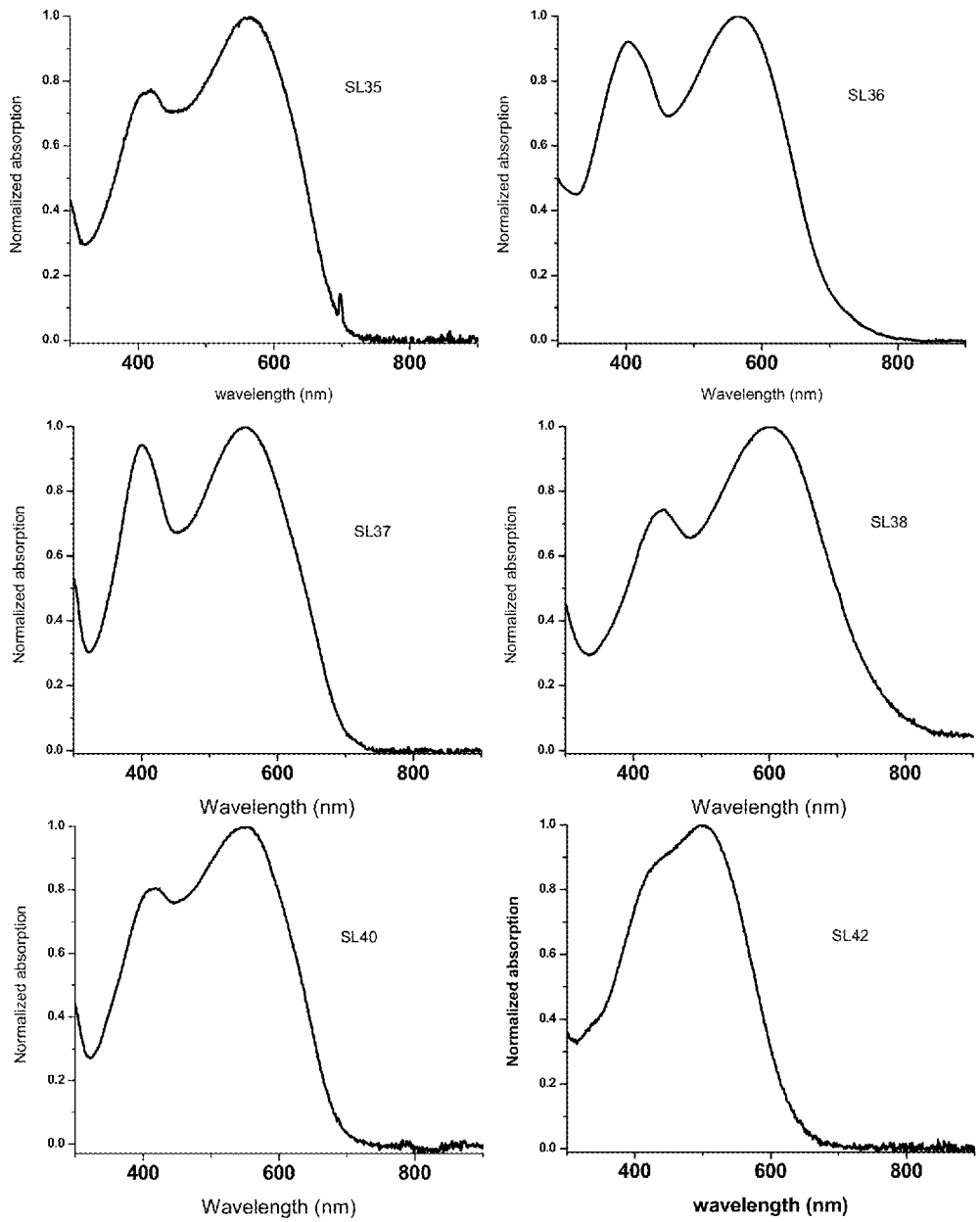
FIG. 4 shows representative optical absorption spectra of six exemplary compounds of the present teachings dissolved in $CHCl_3$.

FIG. 4 shows optical absorption spectra of polymers SL35, SL36, SL37, SL38, SL40, and SL42.

EXAMPLE 4B

Electronic Properties

Cyclic voltammetry measurements of polymers SL35, SL36, SL37, SL38, SL40, and SL42 were carried out under nitrogen using a BAS-CV-50W voltammetric analyzer with 0.1M tetra-n-butylammonium hexafluorophosphate in actonitrile as the supporting electrolyte. A platinum disk working electrode, a platinum wire counter electrode and a silver wire reference electrode were employed and Fc/Fc$^+$ was used as reference for all measurements. The scan rate was 50 mV/S. Polymer films were produced by drop casting from 0.2% (w/w) toluene solutions. The supporting electrolyte solution was thoroughly purged with N$_2$ before all CV measurements.

Figure 5:
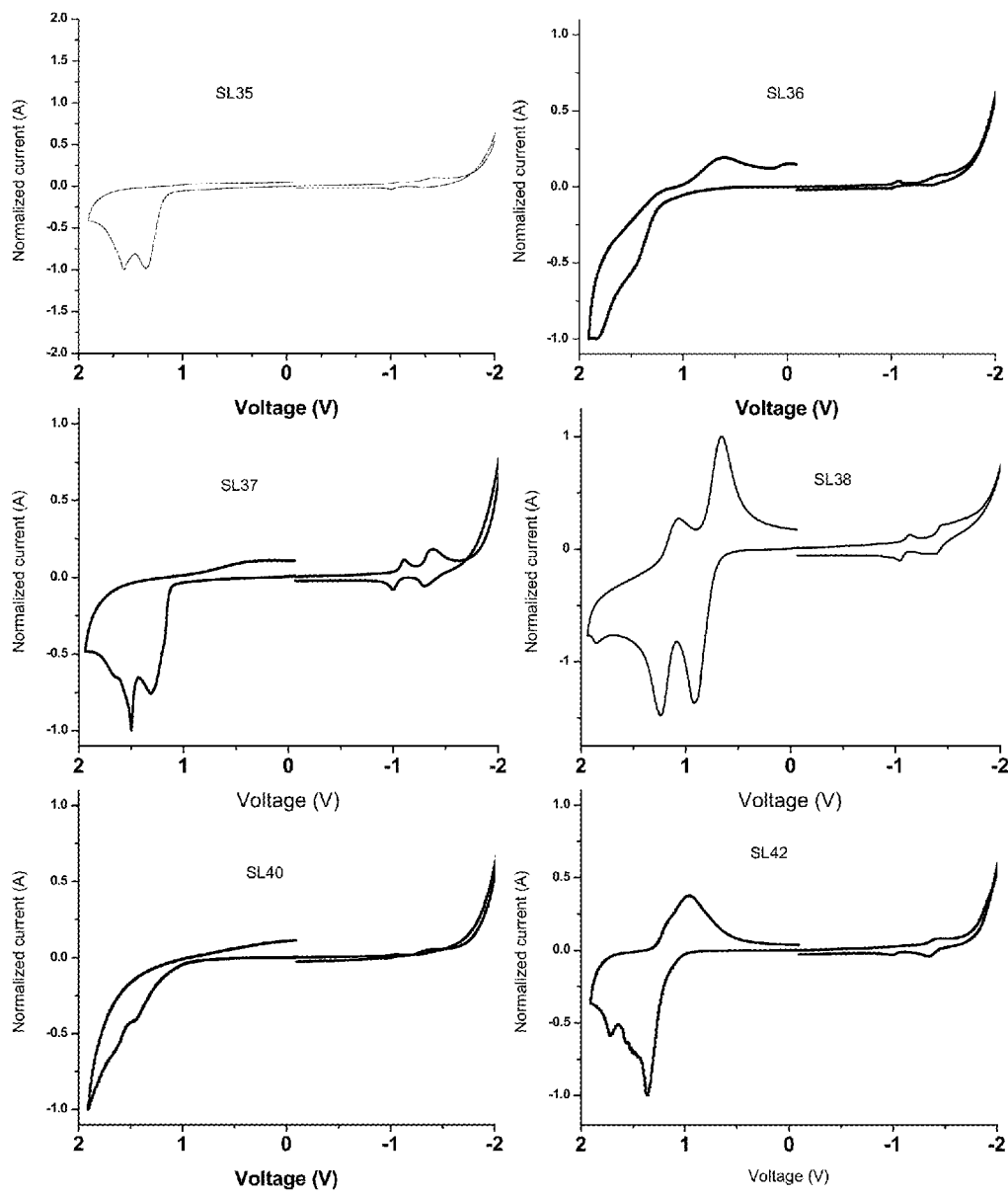
FIG. 5 shows representative cyclic voltammograms of six exemplary compounds of the present teachings. Conditions: 0.1M $(n-Bu)_4N.PF_6$ in acetonitrile; working electrode, Pt; counter electrode, Pt wire; reference electrode, Ag/AgCl; Scanning rate, 50 mV/s. Each voltammogram is overlaid with that of $Fc/Fc^+$.

FIG. 5 shows cyclic voltammograms of polymers SL35, SL36, SL37, SL38, SL40, and SL42.

EXAMPLE 5

Device Fabrication

EXAMPLE 5A

Thin Film Transistor Fabrication and Measurements

Bottom-gate TFTs were fabricated with certain polymers of the present teachings as the semiconductor layer. Si/SiO$_2$ substrates was surface-modified with a monolayer of OTS before semiconductor deposition. Pristine polymer solutions (~8 mg/ml in a solvent mixture of 97.5% chloroform and 2.5% dichlorobenzene by volume) were prepared, and semiconductors were spun from solution onto the Si/SiO$_2$ substrates. The semiconductor films were allowed to dry in a vacuum oven overnight. Silver (Au) top-contacts (30 nm) were thermally evaporated through metal stencils onto the semiconductor films at a vacuum of ~1×10$^{-6}$ torr to complete the device. Devices were characterized in air and in an electrically shielded environment (Signatone dark box). Three Signatone probes were used to access the electrodes, and the signals were triaxially-shielded from very near the probe tip to a Keithley 4200 semiconductor characterization (3 independent SMUs each equipped with a remote preamplifier). FET metrics (mobility, threshold voltage, and on/off ratio) were extracted from transfer and output characteristics according to standard transistor equations.

Figure 6:
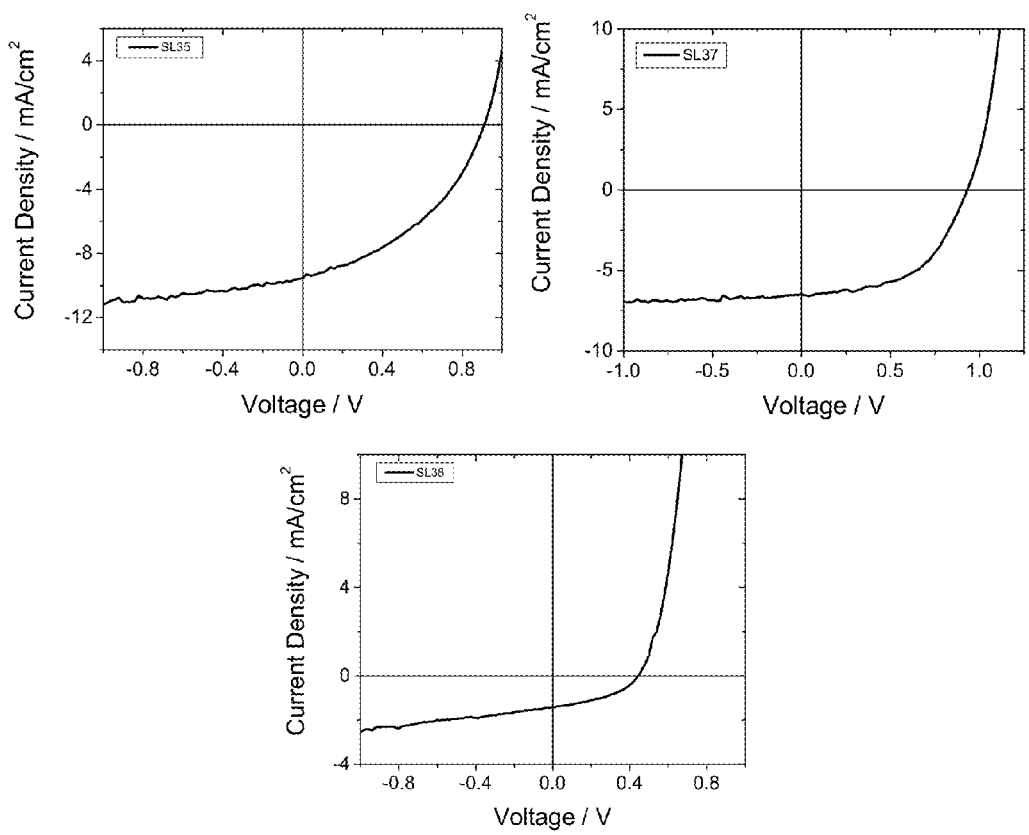
FIG. 6 shows the current density-voltage (J-V) plots of exemplary polymer:$C_{70}$-PCBM blend devices (each of which employs at least one compound of the present teachings in the photoactive component) using measurements obtained under simulated solar illumination (AM1.5G, 100 $mW/cm^2$).

FIG. 6 shows representative transfer plots of exemplary devices. Carrier mobility values measured in air are reported in Table 2 below.

TABLE 2

OPV and TFT Device Performance

| | Polymer | | | | |
|---|---|---|---|---|---|
| | SL35 | SL37 | SL38 | SL40 | SL42 |
| PCE [%] | 3.7 | 3.3 | 0.3 | 2.3 | 2.1 |
| Voc [V] | 0.88 | 0.94 | 0.44 | 0.84 | 0.68 |
| Jsc [mA/cm$^2$] | 9.91 | 6.45 | 1.60 | 6.03 | 7.17 |
| FF | 42.1 | 53.7 | 43.0 | 46.0 | 42.1 |
| Field-effect mobility [cm$^2$/Vs] | 4.3E−04 | 4.4E−03 | 2.5E−04 | 1.6E−04 | 1.8E−04 |

EXAMPLE 5B

Photovoltaic Cell Fabrication and Measurements

Photovoltaic devices incorporating certain polymers of the present teachings were fabricated and characterized. Before device fabrication, the patterned ITO-coated glass substrates were cleaned by ultrasonic treatment sequentially in detergent, de-ionized water, acetone, and isopropyl alcohol, followed by UV-ozone treatment for 40 minutes. A PEDOT:PSS layer of about 40 nm thickness was spin-coated from an aqueous solution (HC Stark, Baytron AI 4083) onto ITO-coated glass substrates, followed by baking at 150° C. for 30 minutes in air. The polymer/C$_{70}$-PCBM (purchased from Nano-C) mixture solution in chloroform was prepared at 5:10 mg/ml with different solvent additives such as trichlorobenzene or diiodooctance. The mixture solution was then stirred for ~2 hours at 55° C. in a glove box and was spin-coated on top of the PEDOT:PSS layer. To complete the device fabrication, a 0.6 nm-thick layer of lithium fluoride (LiF) and a 100 nm-thick layer of aluminum were successively deposited thermally under vacuum of ~10$^{-6}$ Torr. The active area of the devices was about 0.093 cm$^2$. The devices were then encapsulated with a cover glass using EPO-TEK OG112-6 UV curable epoxy (Epoxy Technology) in the glove box.

The photovoltaic characteristics of the encapsulated devices were tested in air. The current density-voltage (J-V) curves were obtained using a Keithley 2400 source-measure unit. The photocurrent was measured under simulated AM1.5G irradiation (100 mW cm$^{-2}$) using a xenon-lamp-based solar simulator (Newport 91160A 300 W Class-A Solar Simulator, 2 inch by 2 inch uniform beam) with air mass 1.5 global filter. The light intensity was set using a NREL calibrated silicon photodiode with a color filter. External quantum efficiency was measured using a Newport's QE setup. Incident light from a xenon lamp (300 W) passing through a monochromator (Newport, Cornerstone 260) was focused on the active area of the cell. The output current was measured using a current pre-amplifier (Newport, 70710QE) and a lock-in amplifier (Newport, 70105 dual channel Merlin). A calibrated silicon diode (Newport 70356) was used as the reference.

Figure 7:
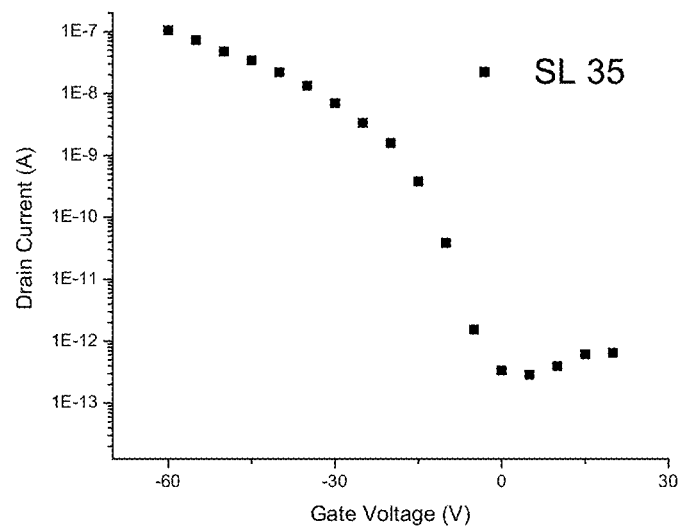
FIG. 7 shows typical transfer plots of exemplary bottom-gate top-contact (BGTC) organic thin film transistors, each of which incorporates a spin-coated thin film semiconductor layer prepared from at least one compound of the present teachings.
Figure 7:
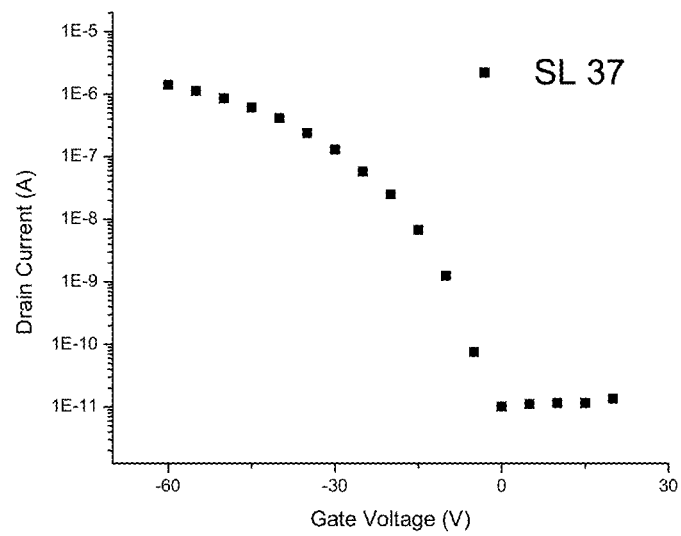

FIG. 7 show representative current density-voltage (J-V) plots of some of the OPV devices. Key device parameters (power conversion efficient (PCE), open circuit voltage (V$_{OC}$), short circuit current (J$_{SC}$), and fill factor (FF)) are provided in Table 2 above.

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

The invention claimed is:

1. An oligomeric or polymeric compound comprising a repeating unit M$^1$ and a repeating unit M$^2$ having the formula:

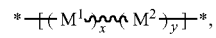

wherein:

x is a real number representing the mole fraction of M$^1$ in the compound;

y is a real number representing the mole fraction of M$^2$ in the compound, wherein 0<x≤1, 0≤y<1, and the sum of x and y is about 1;

M$^1$ comprises an optionally substituted pyrrolo[3,2-b]pyrrole-2,5(1H,4H)-dione-3,6-diyl moiety represented by the formula:

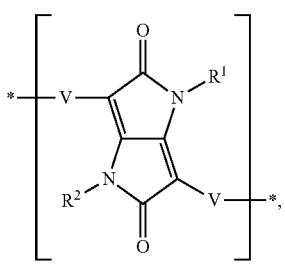

wherein:
   $R^1$ and $R^2$ independently are selected from H a $C_{1-40}$ alkyl group, a $C_{2-40}$ alkenyl group, $C_{1-40}$ haloalkyl group, and an organic group comprising 1-4-cyclic moieties,
   wherein:
      each of the $C_{1-40}$ alkyl group, the $C_{2-40}$ alkenyl group, and the $C_{1-40}$ haloalkyl group can be optionally substituted with 1-10 substituents independently selected from a halogen, —CN, $NO_2$, OH, —$NH_2$, —NH($C_{1-20}$ alkyl), —N($C_{1-20}$ alkyl), —S(O)$_2$OH, —CHO, —C(O)—$C_{1-20}$ alkyl, —C(O)OH, —C(O)—O$C_{1-20}$ alkyl, —C(O)$NH_2$, —C(O)NH—$C_{1-20}$ alkyl, —C(O)N($C_{1-20}$ alkyl)$_2$, —O$C_{1-20}$ alkyl, —$SiH_3$, —SiH($C_{1-20}$ alkyl)$_2$, —$SiH_2$($C_{1-20}$ alkyl), and —Si($C_{1-20}$ alkyl)$_3$;
      each of the $C_{1-40}$ alkyl group, the $C_{2-40}$ alkenyl group, and the $C_{1-40}$ haloalkyl group can be covalently bonded to the imide nitrogen atom via an optional linker; and
      each of the 1-4 cyclic moieties can be the same or different, can be covalently bonded to each other or the imide nitrogen via an optional linker, and can be optionally substituted with 1-5 substituents independently selected from a halo en oxo —CN, $NO_2$, OH, =C(CN)$_2$, —$NH_2$, —NH($C_{1-20}$ alkyl), —N($C_{1-20}$ alkyl)$_2$, —S(O)$_2$OH, —CHO, —C(O) OH, —C(O)—$C_{1-20}$ alkyl, —C(O)—O$C_{1-20}$ alkyl, —C(O)$NH_2$, —C(O)NH—$C_{1-20}$ alkyl, —C(O)N ($C_{1-20}$ alkyl)$_2$, —SiH($C_{1-20}$ alkyl)$_2$, —$SiH_2$($C_{1-20}$ alkyl), —Si($C_{1-20}$ alkyl)$_3$, —O—$C_{1-20}$ alkyl, —O—$C_{1-20}$ alkenyl, —O—$C_{1-20}$haloalkyl, a $C_{1-20}$ alkyl group, a $C_{1-20}$ alkenyl group, and a $C_{1-20}$ haloalkyl group; and
V, at each occurrence, independently is selected from a covalent bond, —Z—, $\dashv$Ar$^1$$\dashv_t$, $\dashv$(Ar$^1$)$_{m''}$Z$\dashv_t$, and $\dashv$(Ar$^1$)$_{m''}$Z—(Ar$^1$)$_{m''}\dashv_t$ , wherein:
   Ar$^1$, at each occurrence, independently, is a $C_{6-14}$ aryl group or a 5-14 membered heteroaryl group, each of which optionally is substituted with 1-2 groups independently selected from a halogen, CN, oxo, =C(CN)$_2$, a $C_{1-40}$ alkyl group, a $C_{1-40}$ haloalkyl group, a $C_{1-40}$ alkoxy group, and a $C_{1-40}$ alkylthio group;
   Z is a linear conjugated linker;
   m'', at each occurrence, is 1, 2, 3, or 4; and
   t is an integer in the range of 1 to 20; and $M^2$ comprises an optionally substituted conjugated moiety not including an optionally substituted pyrrolo[3,2-b]pyrrole-2,5(1H,4H)-dione-3,6-diyl moiety.

2. The compound of claim 1, wherein $M^1$ has the formula:

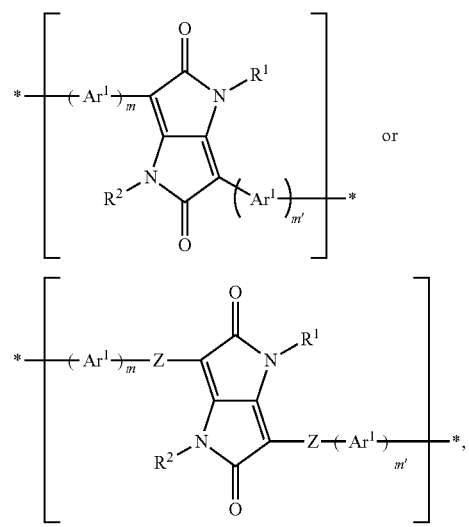

wherein:
   Ar$^1$, at each occurrence, independently is a $C_{6-14}$ aryl group or a 5-14 membered heteroaryl group, each of which optionally is substituted with 1-2 groups independently selected from a halogen, a $C_{1-40}$ alkyl group, a $C_{1-40}$ haloalkyl group, a $C_{1-40}$ alkoxy group, and a $C_{1-40}$ alkylthio group;
   $R^1$ and $R^2$ independently are selected from a $C_{1-40}$ alkyl group, a $C_{2-40}$ alkenyl group, and a $C_{1-40}$ haloalkyl group; and
   m and m' independently are 0, 1, 2, 3, or 4.

3. The compound of claim 2, wherein the compound has the formula:

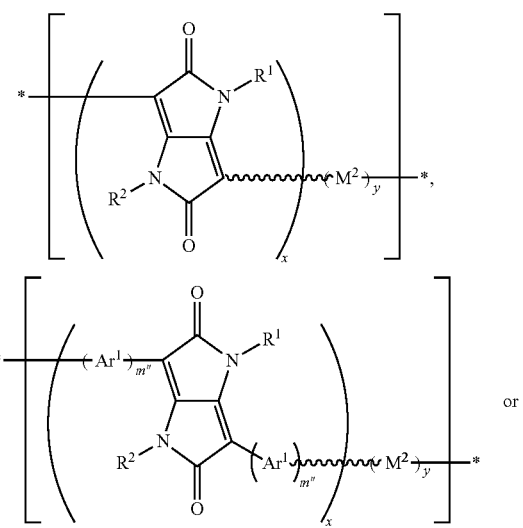

-continued

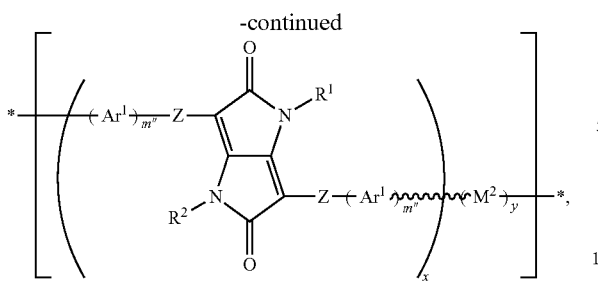

wherein:
$M^2$, at each occurrence, independently is selected from:

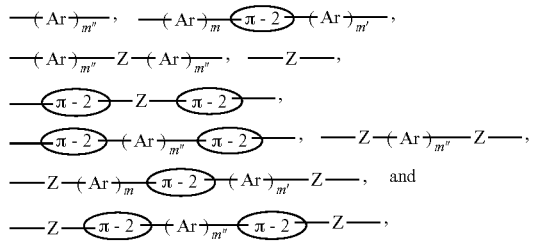

wherein:
- Z, at each occurrence, independently is a linear conjugated linker;
- π-2, at each occurrence, independently is a conjugated polycyclic moiety optionally substituted with 1-6 $R^d$ groups and is not an optionally substituted pyrrolo[3,2-b]pyrrole-2,5(1H,4H)-dione-3,6-diyl unit;
- Ar, at each occurrence, independently is a conjugated monocyclic moiety optionally substituted with 1-6 $R^d$ groups; wherein:
  - $R^d$, at each occurrence, independently is selected from a) halogen, b) —CN, c) —NO$_2$, d) —N($R^e$)$_2$, e) oxo, f) —OH, g) =C($R^f$)$_2$, h) —C(O)$R^e$, i) —C(O)O$R^e$, j) —C(O)N($R^e$)$_2$, k) —SH, l) —S(O)$_2$—$R^e$, m) —S(O)$_2$O$R^e$, n) —(OCH$_2$CH$_2$)$_t$O$R^e$, o) a $C_{1-40}$ alkyl group, p) a $C_{2-40}$ alkenyl group, q) a $C_{2-40}$ alkynyl group, r) a $C_{1-40}$ alkoxy group, s) a $C_{1-40}$ alkylthio group, t) a $C_{1-40}$ haloalkyl group, u) a —Y—$C_{3-10}$ cycloalkyl group, v) a —Y—$C_{6-14}$ aryl group, w) a —Y—$C_{6-14}$ haloaryl group, x) a —Y-3-12 membered cycloheteroalkyl group, and y) a —Y-5-14 membered heteroaryl group, wherein each of the $C_{1-40}$ alkyl group, the $C_{2-40}$ alkenyl group, the $C_{2-40}$ alkynyl group, the $C_{1-40}$ alkoxy group, the $C_{1-40}$ alkylthio group, the $C_{1-40}$ haloalkyl group, the $C_{3-10}$ cycloalkyl group, the $C_{6-14}$ aryl group, the $C_{6-14}$ haloaryl group, the 3-12 membered cycloheteroalkyl group, and the 5-14 membered heteroaryl group is optionally substituted with 1-4 $R^f$ groups;
  - $R^e$, at each occurrence, independently is selected from H, a $C_{1-40}$ alkyl group, and a —Y—$C_{6-14}$ aryl group;
  - $R^f$, at each occurrence, independently is selected from a) halogen, b) —CN, c) —NO$_2$, d) oxo, e) —OH, f) —NH$_2$, g) —NH($C_{1-20}$ alkyl), h) —N($C_{1-20}$ alkyl)$_2$, i) —N($C_{1-20}$ alkyl)-$C_{6-14}$ aryl, j) —N($C_{6-14}$ aryl)$_2$, k) —S(O)$_w$H, l) —S(O)$_w$—$C_{1-20}$ alkyl, m) —S(O)$_2$OH, n) —S(O)$_2$—O$C_{1-20}$ alkyl, o) —S(O)$_2$—O$C_{6-14}$ aryl, p) —CHO, q) —C(O)—$C_{1-20}$ alkyl, r) —C(O)—$C_{6-14}$ aryl, s) —C(O)OH, t) —C(O)—O$C_{1-20}$ alkyl, u) —C(O)—O$C_{6-14}$ aryl, v) —C(O)NH$_2$, w) —C(O)NH—$C_{1-20}$ alkyl, x) —C(O)N($C_{1-20}$ alkyl)$_2$, y) —C(O)NH—$C_{6-14}$ aryl, z) —C(O)N($C_{1-20}$ alkyl)-$C_{6-14}$ aryl, aa) —C(O)N($C_{6-14}$ aryl)$_2$, ab) —C(S)NH$_2$, ac) —C(S)NH—$C_{1-20}$ alkyl, ad) —C(S)N($C_{1-20}$ alkyl)$_2$, ae) —C(S)N($C_{6-14}$ aryl)$_2$, af) —C(S)N($C_{1-20}$ alkyl)-$C_{6-14}$ aryl, ag) —C(S)NH—$C_{6-14}$ aryl, ah) —S(O)$_w$NH$_2$, ai) —S(O)$_w$NH($C_{1-20}$ alkyl), aj) —S(O)$_w$N($C_{1-20}$ alkyl)$_2$, ak) —S(O)$_w$NH($C_{6-14}$ aryl), al) —S(O)$_w$N($C_{1-20}$ alkyl)-$C_{6-14}$ aryl, am) —S(O)$_w$N($C_{6-14}$ aryl)$_2$, an) —SiH$_3$, ao) —SiH($C_{1-20}$ alkyl)$_2$, op) —SiH$_2$($C_{1-20}$ alkyl), aq) —Si($C_{1-20}$ alkyl)$_3$, ar) a $C_{1-20}$ alkyl group, as) a $C_{2-20}$ alkenyl group, at) a $C_{2-20}$ alkynyl group, au) a $C_{1-20}$ alkoxy group, av) a $C_{1-20}$ alkylthio group, ow) a $C_{1-20}$ haloalkyl group, ax) a $C_{3-10}$ cycloalkyl group, ay) a $C_{6-14}$ aryl group, az) a $C_{6-14}$ haloaryl group, ba) a 3-12 membered cycloheteroalkyl group, or bb) a 5-14 membered heteroaryl group;
  - Y, at each occurrence, independently is selected from a divalent $C_{1-10}$ alkyl group, a divalent $C_{1-10}$ haloalkyl group, and a covalent bond; and
  - t is 1, 2, 3, 4, 5, 6, 7, 8, 9 or 10;
  - w, at each occurrence, independently is 0, 1, or 2;
  - m and m' independently are 0, 1, 2, 3, or 4; and
  - m" is 1, 2, 3, or 4.

4. The compound of claim 3, wherein the compound is a random copolymer, a regiorandom copolymer, a regioregular copolymer, or an alternating copolymer.

5. The compound of claim 3, wherein the compound is an alternating copolymer and has the formula:

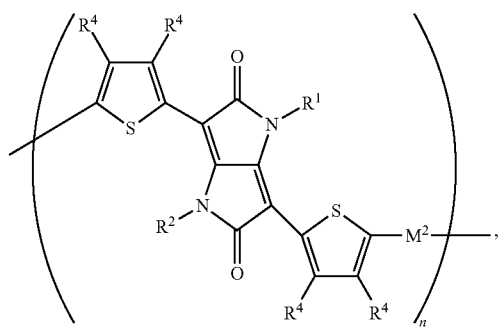

wherein $R^4$, at each occurrence, independently is H, halogen, a $C_{1-20}$ alkyl group, a $C_{1-20}$ alkoxy group, a $C_{1-20}$ alkylthio group, or a $C_{1-20}$ haloalkyl group; and n is an integer in the range of 3 to 10,000.

6. The compound of claim 3, wherein $M^2$, at each occurrence, independently comprises one to four 5- or 6-membered aryl or heteroaryl groups each optionally substituted with 1-4 $R^d$ groups.

7. The compound of claim 3, wherein $M^2$, at each occurrence, has the formula:

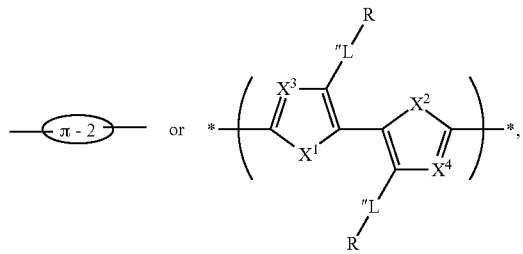

wherein:

L″, at each occurrence, independently is selected from —$CH_2$—, —O—, —S—, and —Se—;

R, at each occurrence, independently is selected from a $C_{1-40}$ alkyl group, a $C_{2-40}$ alkenyl group, a $C_{2-40}$ alkynyl group, and a $C_{1-40}$ haloalkyl group, wherein one or more non-adjacent $CH_2$ groups independently are optionally replaced by —O—, —S—, and —Se—, provided that O, S, and/or Se atoms are not linked directly to one another;

$X^1$ and $X^2$, at each occurrence, independently are selected from S, O, and Se;

$X^3$ and $X^4$, at each occurrence, independently are selected from N, CH, and CF; and π-2 is a polycyclic $C_{8-24}$ aryl group or 8-24 membered heteroaryl group optionally substituted with 1-6 $R^d$ groups.

8. The compound of claim 3, wherein $M^2$, at each occurrence, has the formula:

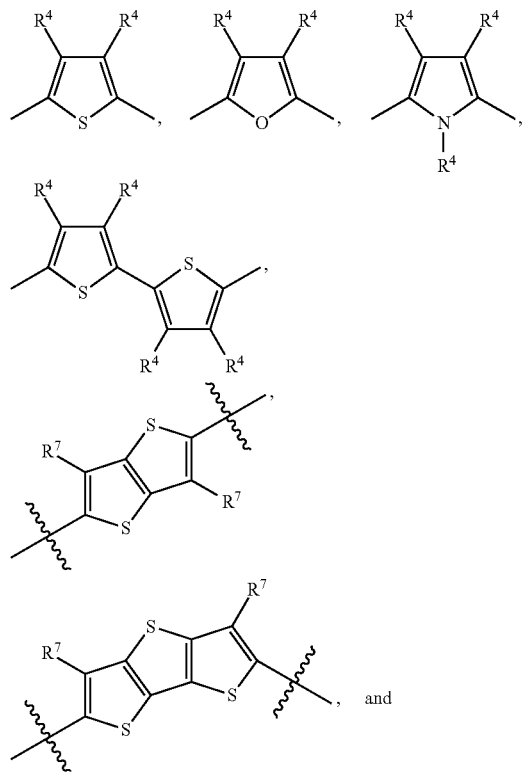

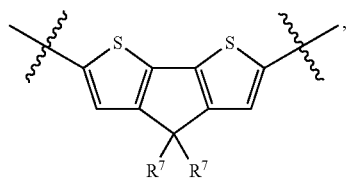

wherein $R^4$, at each occurrence, independently is H, halogen, CN, a $C_{1-20}$ alkyl group, a $C_{1-20}$ alkoxy group, a $C_{1-20}$ alkylthio group, or a $C_{1-20}$ haloalkyl group; and $R^7$, at each occurrence, independently is H, halogen, CN, a $C_{1-40}$ alkyl group, a $C_{1-40}$ alkoxy group, a $C_{1-40}$ alkylthio group, or a $C_{1-40}$ haloalkyl group.

9. The compound of claim 3, wherein $M^2$, at each occurrence, is selected from:

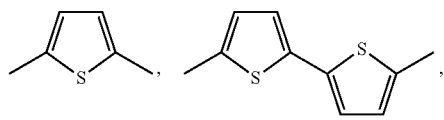

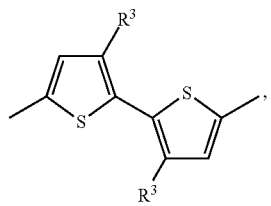

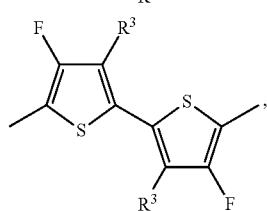

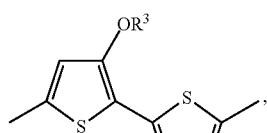

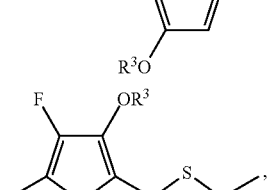

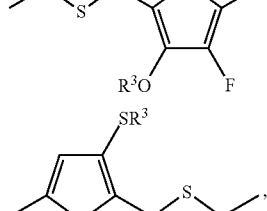

-continued
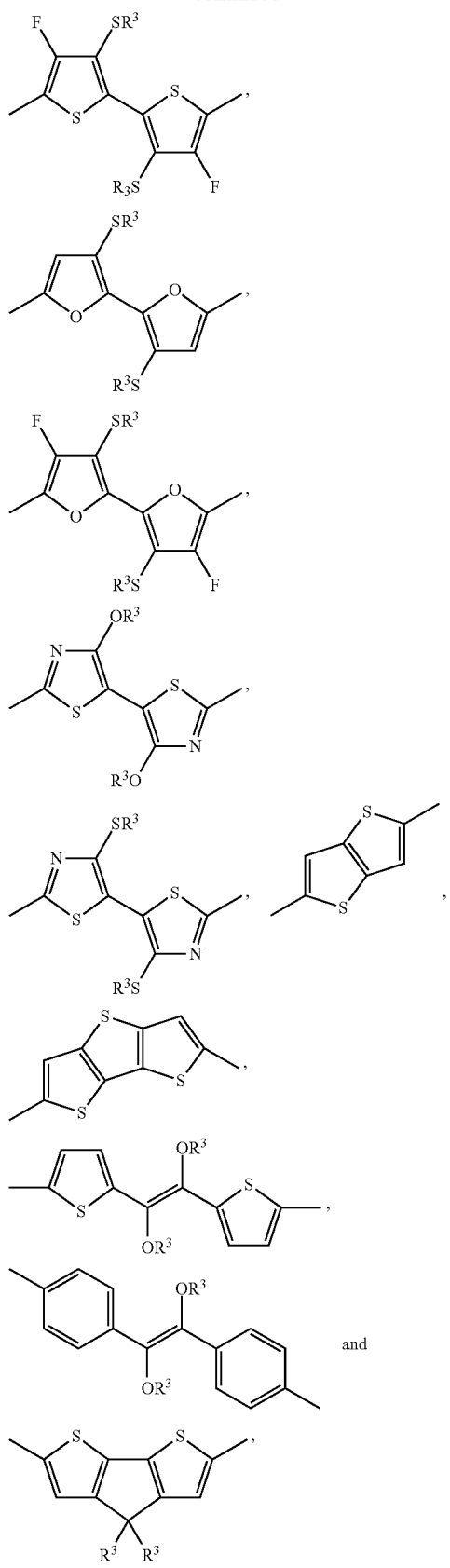
wherein R³, at each occurrence, is a C₁₋₂₀ alkyl group.
10. The compound of claim 3, wherein M² is selected from:
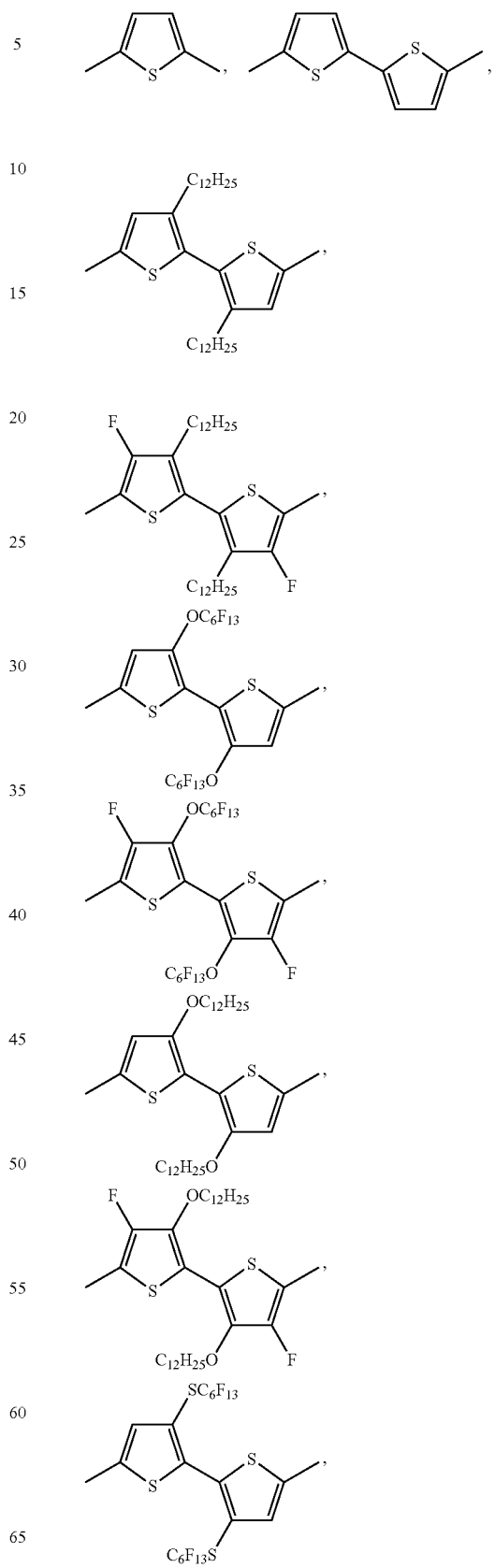

-continued

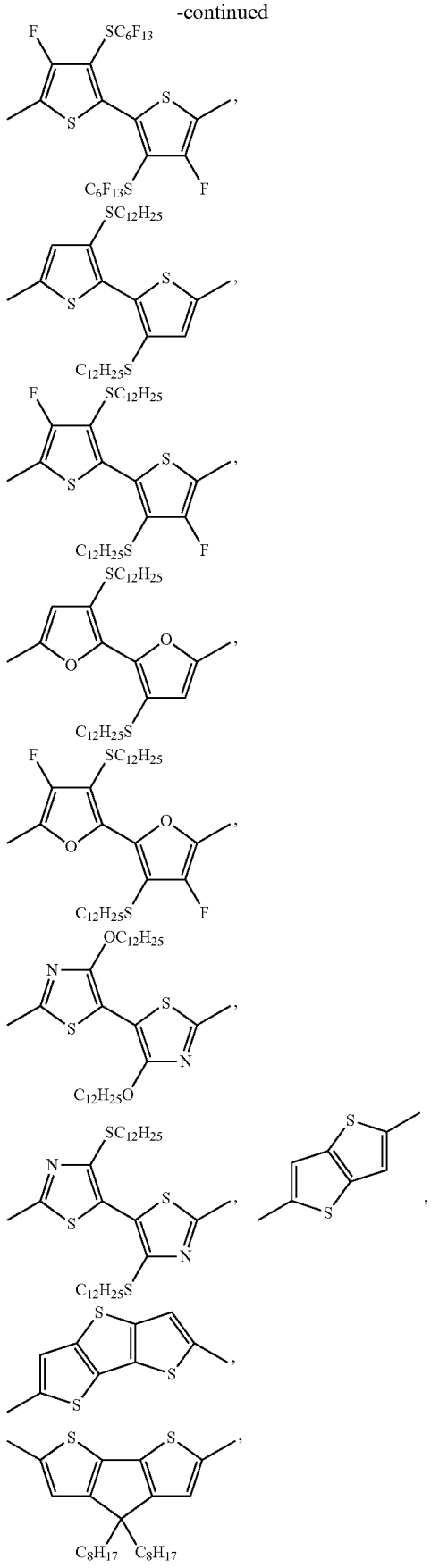

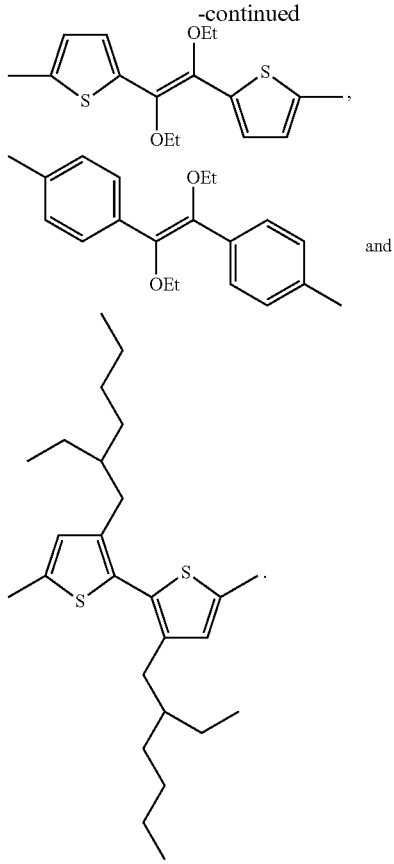

11. The compound of claim 1, wherein $R^1$ and $R^2$, at each occurrence, independently are selected from a branched $C_{5-40}$ alkyl group, a branched $C_{5-40}$ alkenyl group, and a branched $C_{5-40}$ haloalkyl group.

12. A thin film semiconductor comprising one or more oligomeric or polymeric compounds of claim 1.

13. An electronic or optoelectronic device comprising:
a first electrode;
a second electrode; and
a semiconducting component comprising a single layer or a laminate comprising multiple layers, wherein the semiconducting component is in contact with the first electrode and the second electrode, and the semiconducting component comprises the thin film semiconductor of claim 12.

14. The device of claim 13 configured as a thin film transistor comprising:
a substrate;
a gate electrode;
a gate dielectric component;
a source electrode;
a drain electrode; and
the semiconducting component comprising the thin film semiconductor of claim 12, wherein the semiconducting component is in contact with the source electrode, the drain electrode, and the gate dielectric component.

15. An optical or optoelectronic device comprising:
a first electrode,
a second electrode, and
a photoactive component comprising a single layer or a laminate comprising multiple layers, wherein the photoactive component is disposed between the first electrode and the second electrode, and the photoactive component comprises the thin film semiconductor of claim 12.

16. The device of claim 15 configured as a photovoltaic cell comprising:
- a substrate;
- an anode;
- a cathode; and
- the photoactive component comprising the thin film semiconductor of claim 12, wherein the photoactive component is disposed between the anode and the cathode.

17. The device of claim 15 configured as a light emitting transistor comprising:
- a substrate;
- a gate electrode;
- a gate dielectric component;
- a source electrode;
- a drain electrode; and
- the photoactive component comprising the thin film semiconductor of claim 12, wherein the photoactive component is in contact with the source electrode, the drain electrode, and the gate dielectric component.

* * * * *